US012641772B2

(12) United States Patent
Lee et al.

(10) Patent No.: US 12,641,772 B2
(45) Date of Patent: May 26, 2026

(54) SEMICONDUCTOR DEVICE INCLUDING ACTIVE REGION AND SEMICONDUCTOR LAYER ON SIDE SURFACE OF ACTIVE REGION

(71) Applicant: SAMSUNG ELECTRONICS CO., LTD., Suwon-si (KR)

(72) Inventors: Jaepil Lee, Seoul (KR); Hijung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 631 days.

(21) Appl. No.: 18/095,041

(22) Filed: Jan. 10, 2023

(65) Prior Publication Data

US 2023/0232614 A1     Jul. 20, 2023

(30) Foreign Application Priority Data

Jan. 20, 2022     (KR) ........................ 10-2022-0008488

(51) Int. Cl.
H10B 12/00         (2023.01)
(52) U.S. Cl.
CPC .......... H10B 12/34 (2023.02); H10B 12/053 (2023.02); H10B 12/485 (2023.02)
(58) Field of Classification Search
CPC .... H10B 12/053; H10B 12/315; H10B 12/34; H10B 12/485; H10B 12/488; H10D 64/513
See application file for complete search history.

(56) References Cited

U.S. PATENT DOCUMENTS

| 8,865,545 B2 | 10/2014 | Kwon |
| 10,043,811 B1 | 8/2018 | Tsai et al. |
| 10,319,726 B2 | 6/2019 | Nam et al. |

(Continued)

FOREIGN PATENT DOCUMENTS

| KR | 1020110059007 A | 6/2011 |
| KR | 1020150111722 A | 10/2015 |

(Continued)

OTHER PUBLICATIONS

Office Action issued Dec. 12, 2023 by the Taiwan Intellectual Property Office for corresponding patent application TW 112102261.

*Primary Examiner* — Nelson Garces
(74) *Attorney, Agent, or Firm* — Muir Patent Law, PLLC

(57)         ABSTRACT

A semiconductor device includes a semiconductor substrate, an active region on the semiconductor substrate and including a first semiconductor material, an isolation layer on the semiconductor substrate and a side surface of the active region, a first gate structure in a first gate trench crossing the active region, a second gate structure in a second gate trench in the isolation layer, the second gate structure being parallel to the first gate structure and adjacent to the active region, a semiconductor layer covering at least a part of the side surface of the active region, the semiconductor layer including a second semiconductor material different from the first semiconductor material, and at least a part of the semiconductor layer being between the active region and the second gate structure, and source/drain regions in the active region on opposite sides of the first gate trench.

19 Claims, 52 Drawing Sheets

(56) References Cited

U.S. PATENT DOCUMENTS

| | | | |
|---|---|---|---|
| 10,396,082 B2 | 8/2019 | Sandhu et al. | |
| 10,505,039 B2 | 12/2019 | Chang et al. | |
| 2011/0127587 A1 | 6/2011 | Yang | |
| 2014/0077294 A1 | 3/2014 | Hwang et al. | |
| 2014/0138745 A1 | 5/2014 | Shin et al. | |
| 2015/0279950 A1 | 10/2015 | Lee et al. | |
| 2018/0158826 A1* | 6/2018 | Cho | H10B 12/34 |
| 2019/0393320 A1 | 12/2019 | Yoo et al. | |
| 2020/0098753 A1 | 3/2020 | Dewey et al. | |
| 2021/0013214 A1 | 1/2021 | Terada | |
| 2021/0057417 A1 | 2/2021 | Cho et al. | |
| 2021/0313442 A1 | 10/2021 | Suh et al. | |
| 2021/0335795 A1* | 10/2021 | Wan | H10B 12/315 |

FOREIGN PATENT DOCUMENTS

| | | |
|---|---|---|
| KR | 1020200131191 A | 11/2020 |
| TW | 202139458 A | 10/2021 |

\* cited by examiner

1

SEMICONDUCTOR DEVICE INCLUDING ACTIVE REGION AND SEMICONDUCTOR LAYER ON SIDE SURFACE OF ACTIVE REGION

CROSS-REFERENCE TO RELATED APPLICATION

This application claims benefit of priority to Korean Patent Application No. 10-2022-0008488, filed on Jan. 20, 2022, in the Korean Intellectual Property Office, the disclosure of which is incorporated herein by reference in its entirety.

BACKGROUND

1. Field

Embodiments relate to a semiconductor device and a method for manufacturing the same, and more particularly, to a semiconductor device including an active region and a semiconductor layer on a side surface of the active region, and a method for manufacturing the same.

2. Description of the Related Art

Research has been conducted to reduce the size of elements constituting semiconductor devices and to improve performance thereof. For example, in a dynamic random-access memory (DRAM), research has been conducted to reliably and stably form elements with reduced sizes.

SUMMARY

According to an aspect of embodiments, a semiconductor device includes a semiconductor substrate; an active region on the semiconductor substrate; an isolation layer disposed on the semiconductor substrate and disposed on a side surface of the active region; a first gate structure disposed in a first gate trench crossing the active region; a second gate structure disposed to be parallel to the first gate structure and disposed in a second gate trench in the isolation layer adjacent to the active region; a semiconductor layer covering at least a portion of the side surface of the active region; and a first source/drain region and a second source/drain region disposed in the active region on both sides of the first gate trench. The active region includes a first semiconductor material, the semiconductor layer includes a second semiconductor material different from the first semiconductor material, and at least a portion of the semiconductor layer is disposed between the active region and the second gate structure.

According to an aspect of embodiments, a semiconductor device includes an active region including a first semiconductor material; an isolation layer on a side surface of the active region; a first gate structure disposed in a first gate trench crossing the active region; a first source/drain region and a second source/drain region disposed in the active region on both sides of the first gate trench; a second gate structure disposed in a second gate trench in the isolation layer and parallel to the first gate structure; and a semiconductor layer covering at least a portion of a side surface of the active region. The first source/drain region is adjacent to the second gate structure, the semiconductor layer includes a second semiconductor material different from the first semiconductor material, and at least a portion of the semiconductor layer is disposed between a channel region of the active region below the first source/drain region and the second gate structure.

According to an aspect of embodiments, a semiconductor device includes a semiconductor substrate; an active region extending in an oblique direction on the semiconductor substrate; an isolation layer disposed on a side surface of the active region and on the semiconductor substrate; a first source/drain region, a second source/drain region, and a third source/drain region sequentially disposed in the oblique direction and spaced apart from each other in the active region; a first inner gate structure disposed in a first inner gate trench crossing the active region between the first and second source/drain regions and extending into the isolation layer; a second inner gate structure disposed in a second inner gate trench crossing the active region between the first and second source/drain regions and extending into the isolation layer, and disposed to be parallel to the first inner gate structure; a first outer gate structure disposed in a first outer gate trench in the isolation layer adjacent to the first source/drain region and disposed to be parallel to the first inner gate structure; a second outer gate structure disposed in a second outer gate trench in the isolation layer adjacent to the third source/drain region and disposed to be parallel to the second inner gate structure; a first contact plug electrically connected to the first source/drain region and on the first source/drain region; a second contact plug electrically connected to the third source/drain region and on the third source/drain region; a bit line structure including a plug portion electrically connected to the second source/drain region and on the second source/drain region; and a semiconductor layer covering at least a portion of the side surface of the active region. The active region includes a first semiconductor material, the semiconductor layer includes a second semiconductor material, different from the first semiconductor material, and the semiconductor layer includes a first portion disposed between at least the first outer gate structure and the side surface of the active region and a second portion disposed between the second outer gate structure and the side surface of the active region.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, terms referring to elements may be replaced by other terms to be used. For example, terms such as "upper", "middle", "lower", "inner", etc. may be replaced by other terms, such as "first", "second" and "third", etc., used to describe the elements of the disclosure. Terms such as "first", "second" and "third" may be used to describe various elements, but the elements are not limited by the terms, and "first element" may be referred to as "second element".

Figure 1:
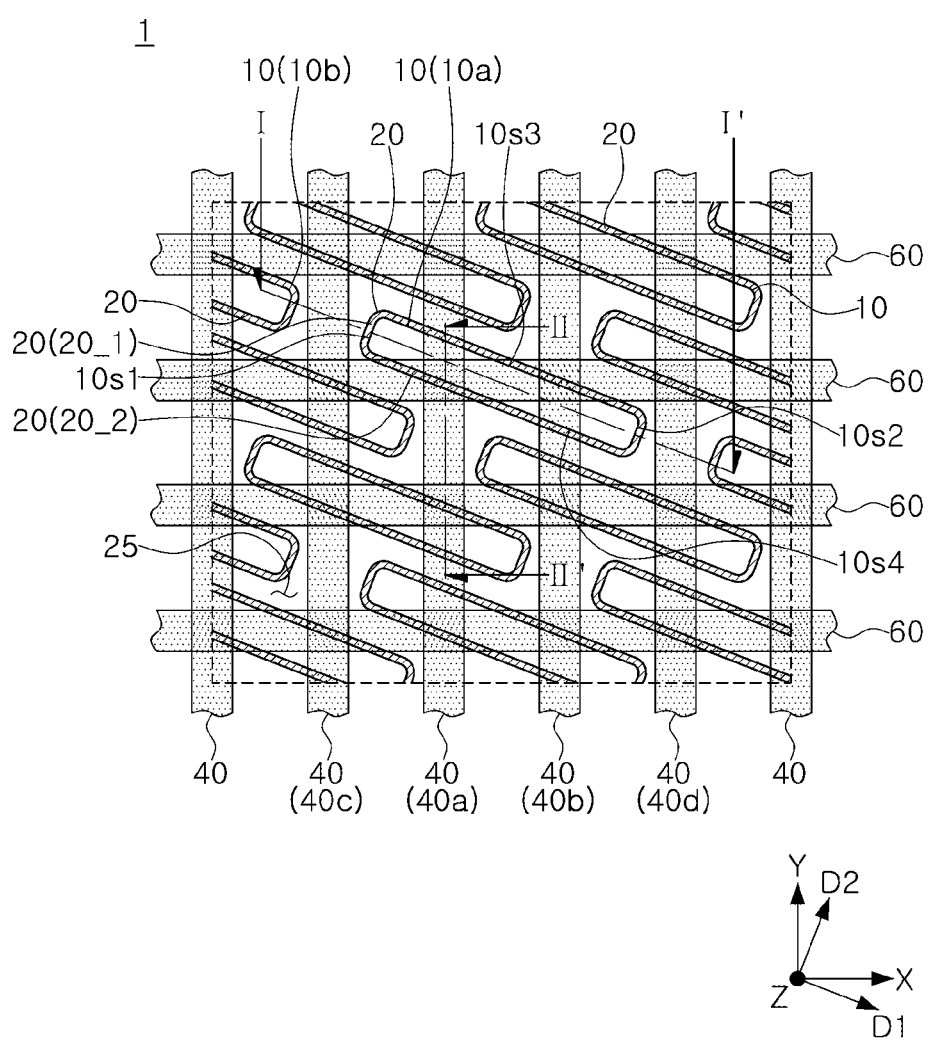
FIG. 1 is a plan view conceptually illustrating a semiconductor device according to an embodiment.
Figure 2:
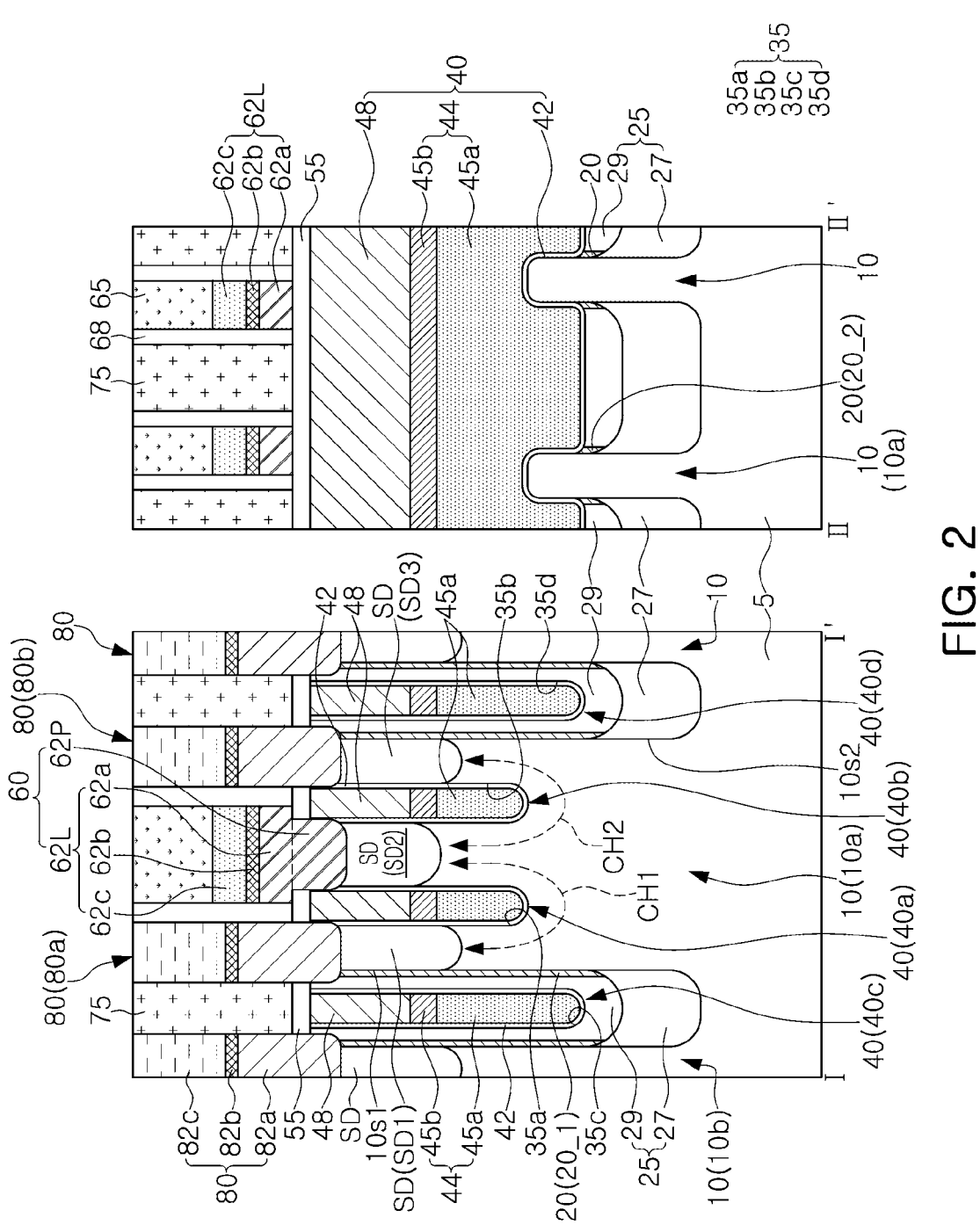
FIGS. 2 to 17B are conceptual cross-sectional views of a portion of FIG. 1 illustrating various examples of a semiconductor device according to an embodiment.

FIG. 1 is a plan view of a semiconductor device according to an embodiment. FIG. 2 illustrates cross-sectional views along lines I-I' and II-II' of FIG. 1.

Referring to FIGS. 1 and 2, a semiconductor device 1 according to an embodiment may include a semiconductor substrate 5, active regions 10 disposed on the semiconductor substrate 5, isolation layer 25 disposed on side surfaces of the active regions 10 and on the semiconductor substrate 5, gate structures 40 crossing the active regions 10 and disposed in gate trenches 35 extending into the isolation layer 25, source/drain regions SD disposed in the active regions 10, and a semiconductor layer 20 covering at least a portion (e.g., a part) of a side surface of each of the active regions 10.

The semiconductor substrate 5 may include a first semiconductor material. The first semiconductor material may include, e.g., a group IV semiconductor, a group III-V compound semiconductor, or a group II-VI compound semiconductor. For example, the group IV semiconductor may include silicon, germanium, or silicon-germanium. For example, the semiconductor substrate 5 may include a silicon material, e.g., a single crystal silicon material. The semiconductor substrate 5 may be, e.g., a silicon substrate, a silicon-on-insulator (SOI) substrate, a germanium substrate, a germanium-on-insulator (GOI) substrate, a silicon-germanium substrate, or an epitaxial layer.

In an example, each of the active regions 10 may protrude from the semiconductor substrate 5 in a vertical direction Z to pass through the isolation layer 25. The active regions 10 may include the same material as the semiconductor substrate 5, e.g., the first semiconductor material. The active regions 10 may be formed of a first semiconductor material layer, e.g., a single crystal silicon layer.

The semiconductor layer 20 may include a second semiconductor material different from the first semiconductor material. For example, the second semiconductor material may be an oxide semiconductor. Accordingly, the semiconductor layer 20 may be formed of an oxide semiconductor layer.

For example, the oxide semiconductor may include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($ZrxIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO), or a similar material. For example, the semiconductor layer 20 may be formed of at least one of the oxide semiconductor materials, e.g., a material layer of indium gallium zinc oxide (IGZO).

In a top view, the gate structures 40 may be parallel to each other and spaced apart from each other in a first direction X, e.g., a first horizontal direction parallel to the top surface of the semiconductor substrate 5, and each of the gate structures 40 may extend in a second direction Y, e.g., a second horizontal direction parallel to the top surface of the semiconductor substrate 5. Each of the active regions 10 may extend in a first oblique direction D1 with respect to the first and second direction X and Y, e.g., the first oblique direction D1 may be parallel to the top surface of the semiconductor substrate 5 and at an oblique angle with respect to an edge of the semiconductor substrate 5. The first oblique direction D1 may be a direction crossing the first direction X, while forming an obtuse or acute angle. Each of the active regions 10 may have a bar shape extending in the first oblique direction D1, e.g., as viewed in a top view.

The active regions 10 may be spaced apart from each other, e.g., in the first and second oblique directions D1 and D2 that are perpendicular to each other. The active regions 10 may include a first active region 10a and a second active region 10b adjacent to each other in the oblique direction D1.

The gate trenches 35 may cross the active regions 10 and extend into the isolation layer 25, and the gate structures 40 may fill the gate trenches 35. Each of the gate structures 40 may include a gate dielectric layer 42 covering an inner wall of the gate trench 35, a gate electrode 44 partially filling the gate trench 35 on the gate dielectric layer 42, and a gate capping layer 48 filling the remaining portion of the gate trench 35 on the gate electrode 44.

The gate dielectric layer 42 may be formed of, e.g., at least one of silicon oxide and a high-k dielectric. The gate electrode 44 may include, e.g., doped polysilicon, metal, conductive metal nitride, metal-semiconductor compound, conductive metal oxide, graphene, carbon nanotube, or a combination thereof. For example, the gate electrode 44 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or a combination thereof. The gate electrode 44 may include a single layer or multiple layers of the aforementioned materials. For example, the gate electrode 44 may include a first electrode layer 45a that may be formed of a metal material and a second electrode layer 45b that may be formed of doped polysilicon on the first electrode layer 45a. The gate capping layer 48 may include an insulating material, e.g., silicon nitride.

In an example, at least one of the gate trenches 35 may extend into the isolation layer 25, while crossing the first active region 10a. In an example, the gate trenches 35 may include a first inner gate trench 35a, a second inner gate trench 35b, a first outer gate trench 35c, and a second outer gate trench 35d.

The first and second inner gate trenches 35a and 35b may be adjacent to each other and may extend into the isolation layer 25, while crossing the first active region 10a. The first outer gate trench 35c may be adjacent to the first inner gate trench 35a, and the second outer gate trench 35d may be adjacent to the second inner gate trench 35b. The first and second inner gate trenches 35a and 35b and the first active region 10a may be disposed between the first and second outer gate trenches 35c and 35d.

The gate structures 40 may include a first inner gate structure 40a in the first inner gate trench 35a, a second inner gate structure 40b in the second inner gate trench 35b, a first outer gate structure 40c in the first outer gate trench 35c, and a second outer gate structure 40d in the second outer gate trench 35d. The first and second inner gate structures 40a and 40b may be adjacent to each other, and may extend into the isolation layer 25, while crossing the first active region 10a. The first outer gate structure 40c may be adjacent to the first inner gate structure 40a, and the second outer gate structure 40d may be adjacent to the second inner gate structure 40b. The first and second inner gate structures 40a and 40b and the first active region 10a may be disposed between the first and second outer gate structures 40c and 40d.

The first and second outer gate structures 40c and 40d may be spaced apart from the first active region 10a, e.g., portions of the first and second outer gate structures 40c and 40d may be spaced apart from the first active region 10a in the cross-section of FIG. 2. The first outer gate structure 40c may be disposed in the isolation layer 25 positioned between the first active region 10a and the second active region 10b, e.g., a portion of the first outer gate structure 40c may be disposed between the first active region 10a and the second active region 10b in the cross-section of FIG. 2.

The semiconductor device 1 according to an embodiment may include source/drain regions SD disposed in the active regions 10. The active regions 10 may have a first conductivity type, and the source/drain regions SD may have a second conductivity type different from the first conductivity type. For example, the first conductivity type may be a P-type conductivity type, and the second conductivity type may be an N-type conductivity type.

The source/drain regions SD may include a first source/drain region SD1, a second first source/drain region SD2, and a third first source/drain region SD3 sequentially disposed in the first oblique direction D1 in the first active region 10a and are spaced apart from each other in the first active region 10a.

The first source/drain region SD1 may be disposed between the first outer gate structure 40c and the first inner gate structure 40a, and the second source/drain region SD2 may be disposed between the first and second inner gate structures 40a and 40b, and the third source/drain region SD3 may be disposed between the second inner gate structure 40b and the second outer gate structure 40d. The first and second source/drain regions SD1 and SD2 may be disposed in the first active region 10a on both sides of the first inner gate structure 40a, and the second and third source/drain regions SD2 and SD3 may be disposed in the first active region 10a on both sides of the second inner gate structure 40b.

The first and second source/drain regions SD1 and SD2, a first channel region CH1 in the first active region 10a adjacent to the first inner gate structure 40a, the gate dielectric layer 42, and the gate electrode 44 of the first inner gate structure 40a may constitute a first transistor. The second and third source/drain regions SD2 and SD3, a second channel region CH2 in the first active region 10a adjacent to the second inner gate structure 40b, the gate dielectric layer 42, and the gate electrode 44 of the second inner gate structure 40b may constitute a second transistor. The first and second channel regions CH1 and CH2 may be formed of a material of the first active region 10a, e.g., the first semiconductor material, and the semiconductor layer 20 may be formed of a second semiconductor material.

An energy band gap of the second semiconductor material may be greater than an energy band gap of the first semiconductor material. For example, the first semiconductor material may be a semiconductor material having an energy band gap of about 1.12 eV, and the second semiconductor material may have an energy band gap of about 3.2 eV.

The second semiconductor material may have OFF current characteristics superior to those of the first semiconductor material. For example, an OFF current of the second semiconductor material may be lower than an OFF current of the first semiconductor material. For example, the OFF current of the second semiconductor material may be about $10^{-20}$ A/$\mu$m, and the OFF current of the first semiconductor material may be about $10^{-16}$ A/$\mu$m.

Accordingly, the second semiconductor material may have a lower leakage current than the first semiconductor material. The second semiconductor material may be the oxide semiconductor described above.

As illustrated in FIG. 1, the first active region 10a may have a first side surface 10s1 and a second side surface 10s2 opposing each other in the first oblique direction D1, and a third side surface 10s3 and a fourth side surface 10s4 opposing each other in the second oblique direction D2, perpendicular to the first oblique direction D1. The first oblique direction D1 may be a length direction of the first active region 10a, and the second oblique direction D2 may be a width direction of the first active region 10a.

The semiconductor layer 20 may cover the first to fourth side surfaces 10s1, 10s2, 10s3, and 10s4 of the first active region 10a. For example, as illustrated in FIG. 1, the semiconductor layer 20 may extend, e.g., continuously, on the first to fourth side surfaces 10s1, 10s2, 10s3, and 10s4 of the first active region 10a to completely surround a perimeter of the first active region 10a, as viewed in a top view.

The semiconductor layer 20 may cover from an upper region of a side surface of the first active region 10a to the side surface of the first active region 10a positioned on a level lower than lower ends of the gate structures 40 and positioned on a level higher than a lower surface of the isolation layer 25. For example, as illustrated in FIG. 2, the semiconductor layer 20 may extend, e.g., continuously, from a top surface of the source/drain region SD along an entire height, e.g., thickness along the vertical direction Z, of the source/drain region SD, along an entire height of the gate electrode 44, and along an entire height of a second isolation portion 29 of the isolation layer 25. For example, a bottommost end of the semiconductor layer 20 may be at a height level between a lower end of an adjacent gate structure 40 and a lower surface of the isolation layer 25. For example, at least a portion of the semiconductor layer 20 may include, e.g., contact, the first channel region CH1 of the first active region 10a below the first source/drain region SD1 and the first outer gate structure 40c.

The semiconductor layer 20 may include a first semiconductor portion 20_1 covering the first and second side surfaces 10s1 and 10s2 of the first active region 10a, and a second semiconductor portion 20_2 covering the third and fourth side surfaces 10s3 and 10s4 of the first active region 10a. A portion of the second semiconductor portion 20_2 of the semiconductor layer 20 may be positioned below the first and second inner gate structures 40a and 40b (e.g., FIG. 2).

In an example, the semiconductor layer 20 may have a ring shape (e.g., a circular, an oval, or a rectangular ring shape) surrounding a side surface of each of the active regions 10, as viewed in a top view (FIG. 1). For example, the semiconductor layer 20 may have a ring shape surrounding a side surface of the first active region 10a at any one height level. For example, at a height level lower than that of the first and second inner gate structures 40a and 40b, the semiconductor layer 20 may have a ring shape surrounding the side surface of the first active region 10a.

The isolation layer 25 may include a first isolation portion 27 and a second isolation portion 29 on the first isolation portion 27. The first isolation portion 27 may include a first silicon oxide, and the second isolation portion 29 may include a second silicon oxide.

The semiconductor layer 20 may be disposed on the first isolation portion 27, e.g., the semiconductor layer 20 may extend above and directly contact an upper surface of the first isolation portion 27. The semiconductor layer 20 may be disposed between a side surface of each of the active regions 10 and the second isolation portion 29 of the isolation layer 25. The first semiconductor portion 20_1 of the semiconductor layer 20 may be disposed between the first source/drain region SD1 and the first outer gate structure 40c and between the first channel region CH1 and the first outer gate structure 40c, and may be disposed between the third source/drain region SD3 and the second outer gate structure 40d and between the second channel region CH2 and the second outer gate structure 40d.

The semiconductor device 1 according to an embodiment may further include a buffer insulating layer 55 on the gate structures 40 and the isolation layer 25. The buffer insulating layer 55 may include at least one of, e.g., a silicon oxide layer and a silicon nitride layer.

The semiconductor device 1 according to an embodiment may further include bit line structures 60, bit line capping layers 65 on the bit line structures 60, and insulating spacers 68 on side surfaces of the bit line capping layers 65 and the bit line structures 60.

The bit line capping layers 65 may be formed of an insulating material, e.g., silicon nitride.

The insulating spacers 68 may include an insulating structure including an air gap. For example, each of the insulating spacers 68 may include a silicon nitride layer, and the silicon nitride layer of each of the insulating spacers 68 may define an air gap.

Each of the bit line structures 60 may include a line portion 62L and plug portions 62P disposed below the line portion 62L. For example, a bit line structure 60 intersecting the first active region 10a, among the bit line structures 60, may include the line portion 62L and the plug portion 62P disposed below the line portion 62L, and may be electrically connected to the second source/drain region SD2. The plug portion 62P may be formed of doped polysilicon, e.g., polysilicon having an N-type conductivity. The line portion 62L may include first to third conductive layers 62a, 62b, and 62c which are sequentially stacked. The first conductive layer 62a may be formed of doped polysilicon, e.g., polysilicon having an N-type conductivity. The second conductive layer 62b may include at least one of a metal-semiconductor compound layer and a conductive barrier layer. For example, the metal-semiconductor compound layer may include at least one of WSi, TiSi, TaSi, NiSi and CoSi, and the conductive barrier layer may include at least one of TiN, TaN, WN, TiSiN, TaSiN, or RuTiN. The third conductive layer 62c may include a metal material, e.g., W. The line portion 62L may be disposed on the buffer insulation layer 55, and the plug portion 62P may pass through the buffer insulation layer 55 to be electrically connected to the second source/drain region SD2.

The semiconductor device 1 according to an embodiment may further include insulating fences 75 overlapping the gate structures 40, e.g., the insulating fences 75 may vertically overlap upper surfaces of respective gate structures 40, and disposed on the buffer insulating layer 55. The insulating fences 75 may include an insulating material, e.g., silicon nitride.

The semiconductor device 1 according to an embodiment may further include contact plugs 80. The contact plugs 80 may include a first contact plug 80a electrically connected to the first source/drain region SD1 on the first source/drain region SD1, and a second contact plug 80b electrically connected to the third source/drain region SD3 on the third source/drain region SD3.

Each of the contact plugs 80 may include first to third conductive layers 82a, 82b, and 82c which are sequentially stacked. The first conductive layer 82a may be formed of doped polysilicon, e.g., polysilicon having an N-type conductivity. The second conductive layer 82b may include a metal-semiconductor compound layer. For example, the metal-semiconductor compound layer may include at least one of WSi, TiSi, TaSi, NiSi, and CoSi. The third conductive layer 82c may include a plug pattern and a conductive barrier layer covering side surfaces and a bottom surface of the plug pattern. The conductive barrier layer may include at least one of TiN, TaN, WN, TiSiN, TaSiN, and RuTiN, and the plug pattern may include a metal material, e.g., W.

In an embodiment, when viewed from the center of the first active region 10a, the first and second outer gate structures 40c and 40d may be passing gate structures. By providing the semiconductor layer 20 between the first active region 10a and the first passing gate structure 40c, leakage current in the first active region 10a occurring due to a repeated operation of ON/OFF of the first passing gate structure adjacent to the first active region 10a may be prevented or minimized. For example, when the first passing gate structure 40c is turned on, the semiconductor layer 20 may serve to prevent or minimize charges, e.g., electrons, from being trapped on a side surface of the first active region 10a adjacent to the first passing gate structure 40c, e.g., on a side surface of the first channel region CH1. Accordingly, when the semiconductor device 1 is a DRAM, the semiconductor layer 20 may prevent defects caused by electrons trapped on the side surface of the first channel region CH1 formed in the first active region 10a due to repeated ON/OFF operation of the first passing gate structure 40c. Accordingly, the semiconductor layer 20 may improve the performance of the semiconductor device 1.

Hereinafter, various modified examples of the elements of the aforementioned semiconductor device 1 will be described. Various modifications of the elements of the aforementioned semiconductor device 1 to be described below will be mainly described with respect to the elements to be modified or the elements to be replaced. In addition, although the elements that may be modified or replaced below are described with reference to each drawing, the elements that may be modified are combined with each other to configure the semiconductor device 1 according to an embodiment.

Various modified examples of the elements of the aforementioned semiconductor device 1 will be described with reference to FIGS. 3 to 17B. FIGS. 3 to 13, 14A, 14B, 15A, 15B, 16A, 16B, 17A, and 17B are cross-sectional views conceptually illustrating regions taken along lines I-I' and II-II' of FIG. 1 to describe various modified examples of the elements of the semiconductor device 1 described above.

Figure 3:
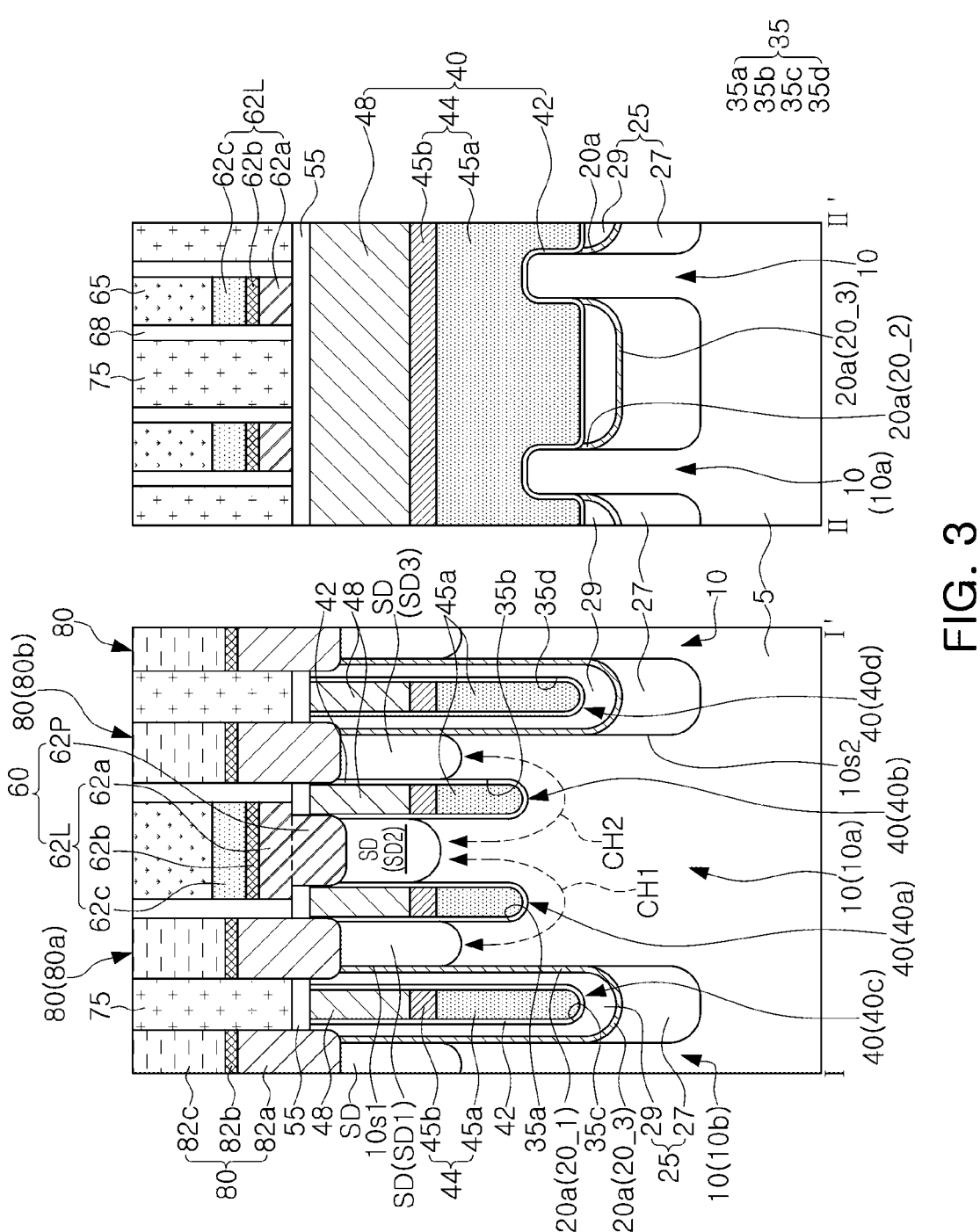

In a modified example, referring to FIGS. 1 and 3, the semiconductor layer 20 described above with reference to FIG. 2 may be replaced with a semiconductor layer 20a further including a third semiconductor portion 20_3 extending between the first isolation portion 27 and the second isolation portion 29. Accordingly, the semiconductor layer 20a may include the third semiconductor portion 20_3 together with the first and second semiconductor portions 20_1 and 20_2 described above with reference to FIGS. 1 and 2, e.g., the third semiconductor portion 20_3 may be between and in direct contact with the first and second semiconductor portions 20_1 and 20_2 to completely cover the bottom of the second isolation portion 29. In the isolation layer 25, the first isolation portion 27 and the second isolation portion 29 may be, e.g., completely, separated by the third semiconductor portion 20_3.

Figure 4:
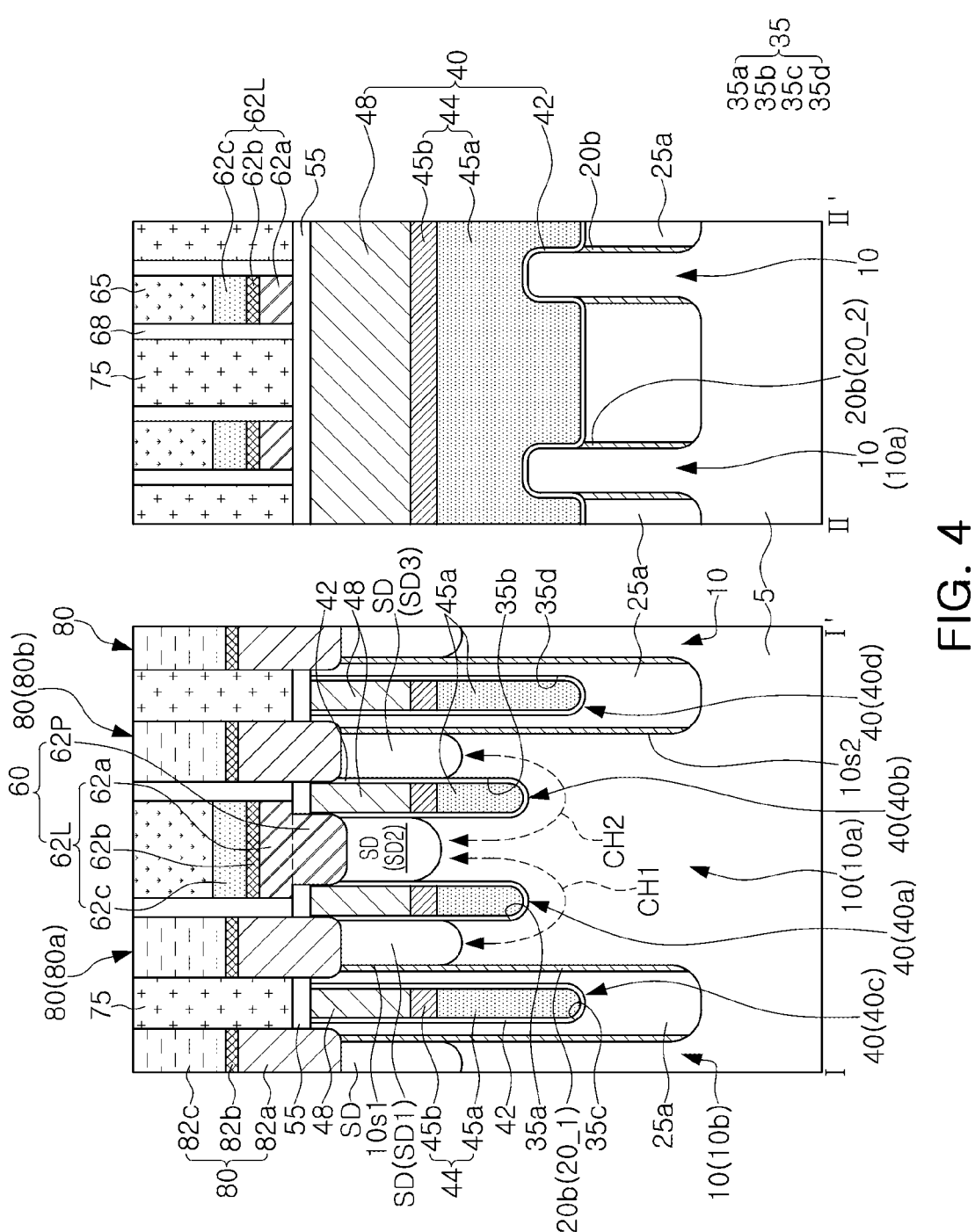

In a modified example, referring to FIGS. 1 and 4, the isolation layer 25 including the first isolation portion 27 and the second isolation portion 29 described above with reference to FIG. 2 may be modified to a single isolation layer 25a. The semiconductor layer 20 described above with reference to FIG. 2 may be replaced with a semiconductor layer 20b extending from an upper portion of a side surface of each of the active regions 10 to a lower portion of a side surface of each of the active regions 10.

Figure 5:
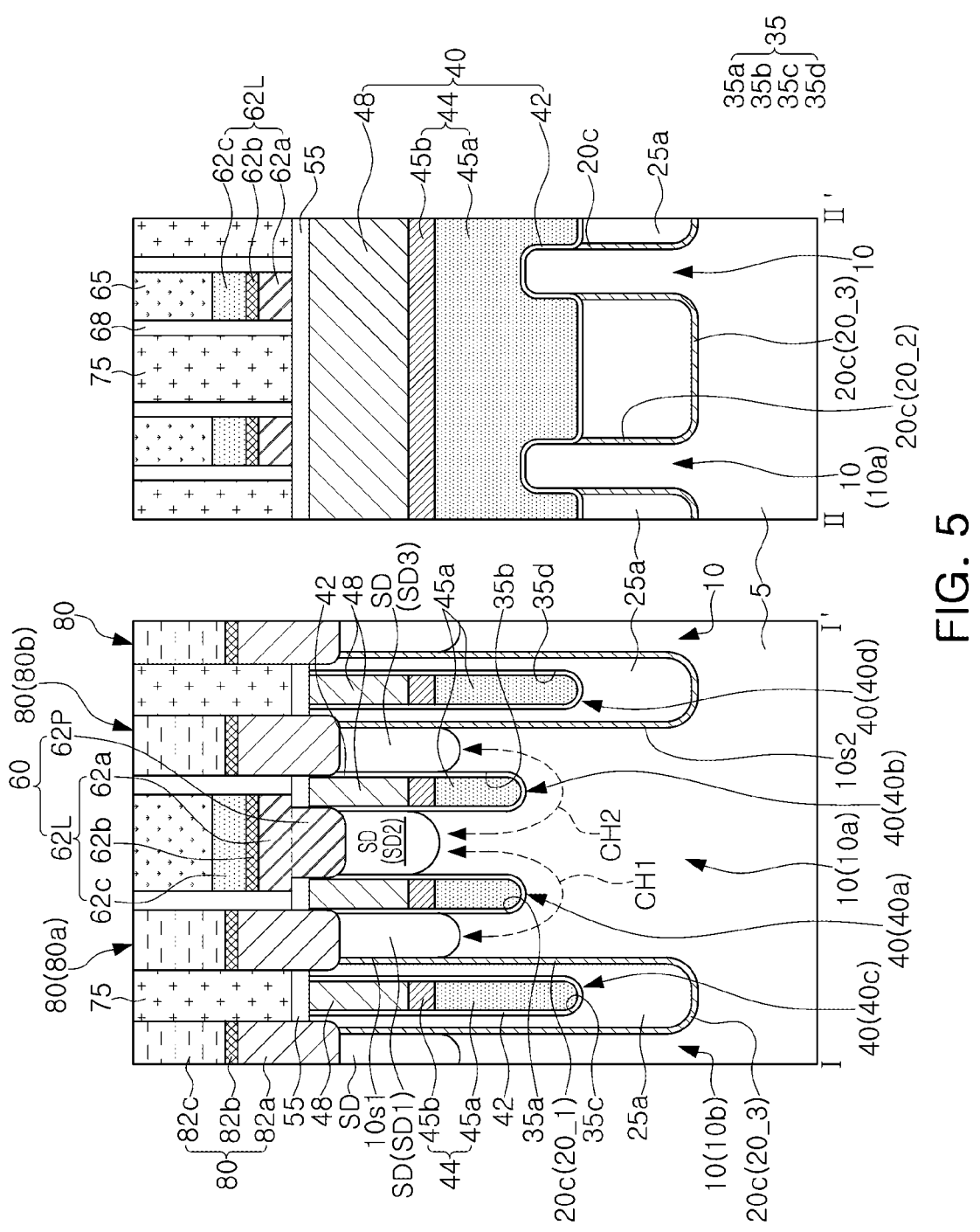

In a modified example, referring to FIGS. 1 and 5, the semiconductor layer described above with reference to FIG. 4 (20b in FIG. 4) may be replaced with a semiconductor layer 20c further including the third semiconductor portion 20_3 covering a lower surface of the isolation layer 25a described above with reference to FIG. 4. Accordingly, the semiconductor layer 20c may include a first semiconductor portion 20_1 covering first and second side surfaces 10s1 and 10s2 of the first active region 10a, a second semiconductor portion 20_2 covering third and fourth side surfaces 10s3 and 10s4 of the first active region 10a, and a third semiconductor portion 20_3 extending from the first and second semiconductor portions 20_1 and 20_2 and covering a lower surface of the isolation layer 25a.

Figure 6:
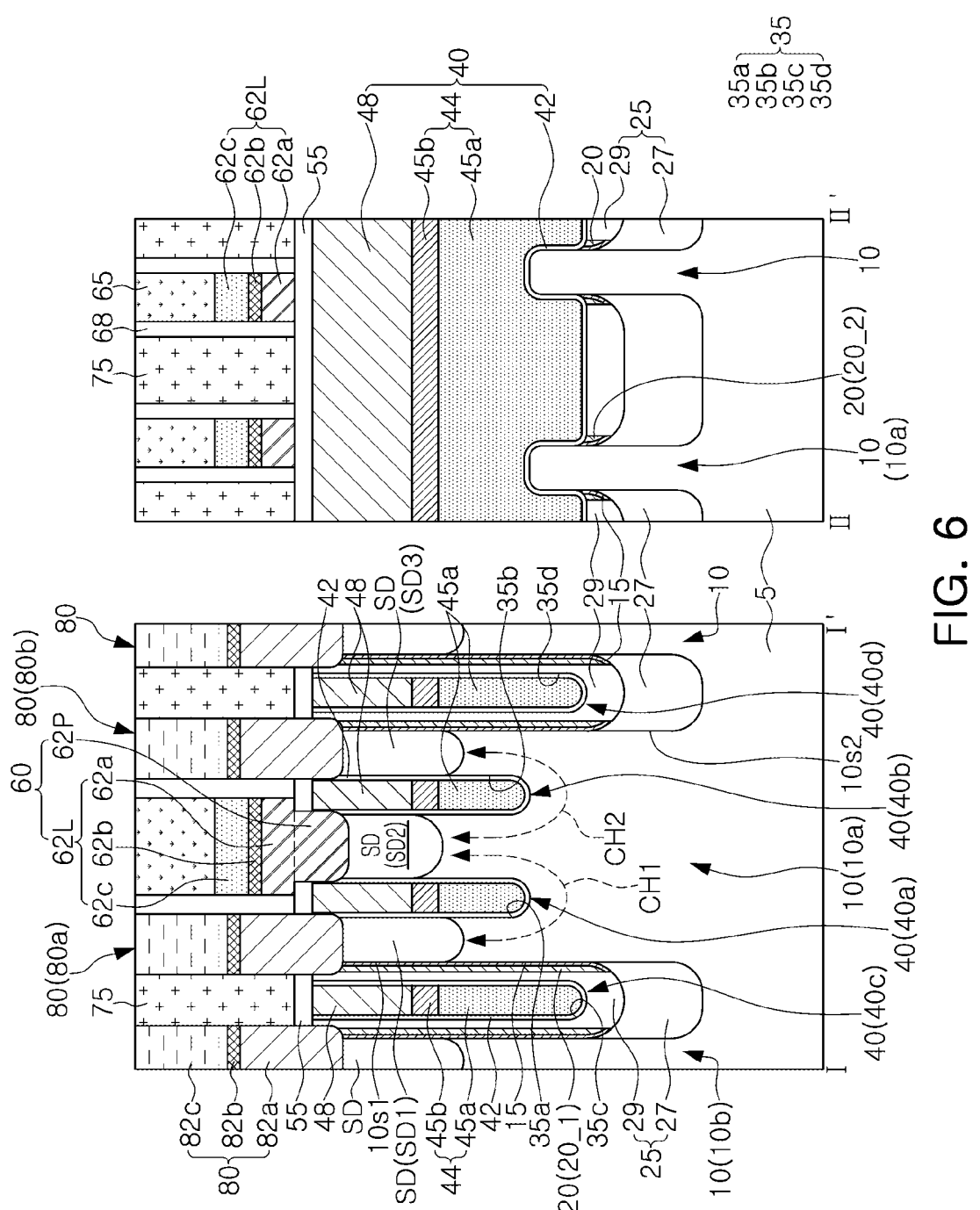

In a modified example, referring to FIGS. 1 and 6, a semiconductor device according to an embodiment may further include a buffer layer 15 disposed between the semiconductor layer 20 described above with reference to FIG. 2 and side surfaces of the active regions 10. In an example, the buffer layer 15 may be formed to have a thickness of about 1 angstroms to about 60 angstroms.

The buffer layer 15 may improve interfacial properties between the semiconductor layer 20 and side surfaces of the active regions 10. For example, the buffer layer 15 may serve to prevent an interfacial reaction between the semiconductor layer 20 and the active regions 10. Accordingly, since the buffer layer 15 prevents an interfacial reaction between the semiconductor layer 20 and the active regions 10, deterioration of a leakage current characteristics of the semiconductor layer 20 and a decrease in the volume of each of the active regions 10 may be prevented. For example, a reduction in the volume of the first and third source/drain regions SD1 and SD3 disposed in the first active region 10a may be prevented, and accordingly, a reduction in contact resistance between the first and second contact plugs 80a and 80b and the first and third source/drain regions SD1 and SD2 may be prevented.

In an example, the buffer layer 15 may be formed of silicon oxide or a similar material. In an example, the buffer layer 15 may be formed by an atomic layer deposition (ALD) process. For example, the buffer layer 15 may be formed by thermally oxidizing side surfaces of the active regions 10 using a thermal oxidation process.

In the embodiments described below, an element using the term 'buffer layer', i.e., the buffer layer, may be formed of silicon oxide or a similar material by an atomic layer deposition (ALD) process, but embodiments are limited thereto and the buffer layer may be formed of thermal oxide by a thermal oxidation process.

Figure 7:
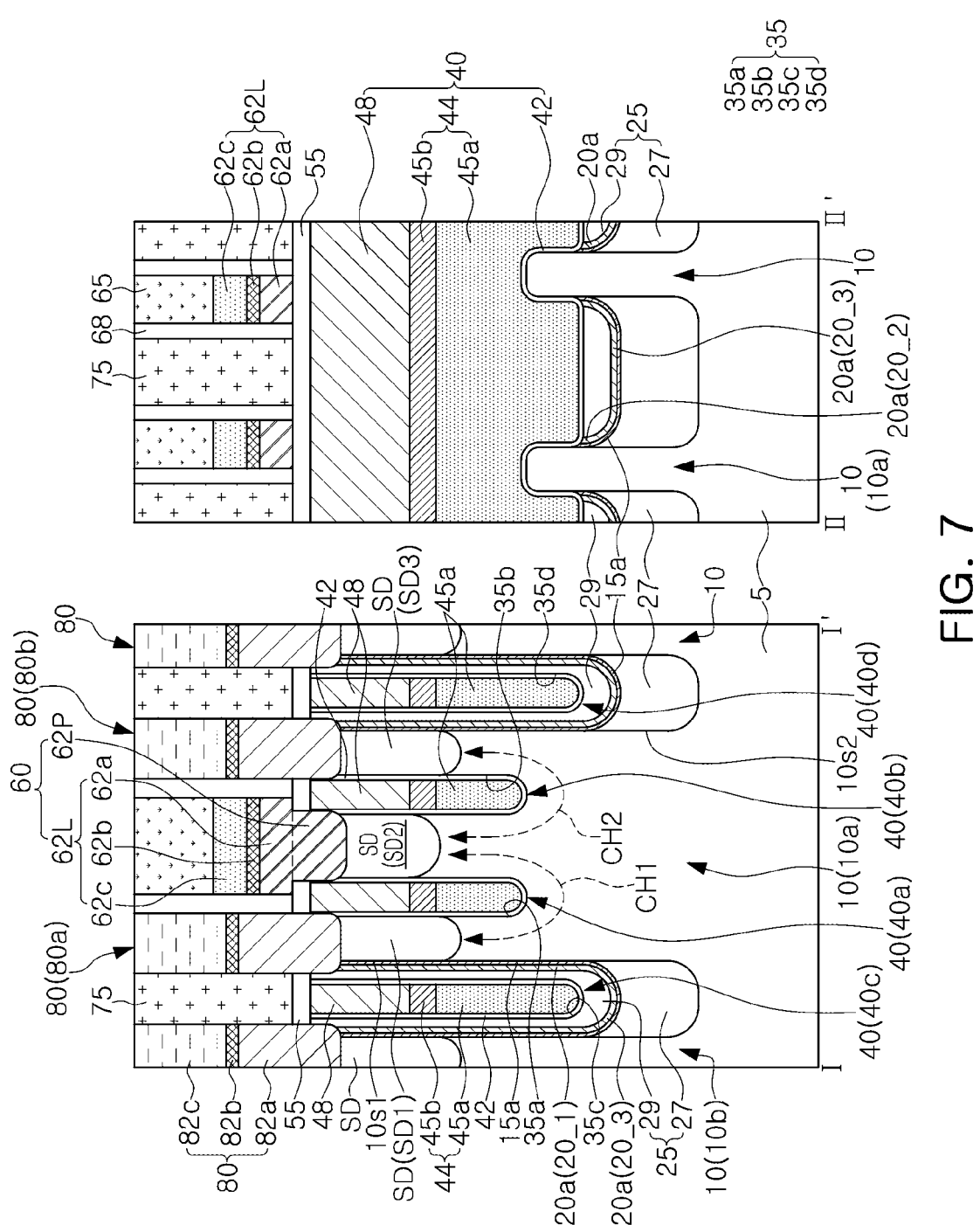

In a modified example, referring to FIGS. 1 and 7, a semiconductor device according to an embodiment may further include a buffer layer 15a disposed between the semiconductor layer 20a described above with reference to FIG. 3 and side surfaces of the active regions 10. In an example, when the buffer layer 15a is formed by an ALD process, the buffer layer 15a may include a portion disposed between the side surfaces of the active regions 10 and the semiconductor layer 20a and a portion disposed between the first isolation portion 27 and the semiconductor layer 20a.

Figure 8:
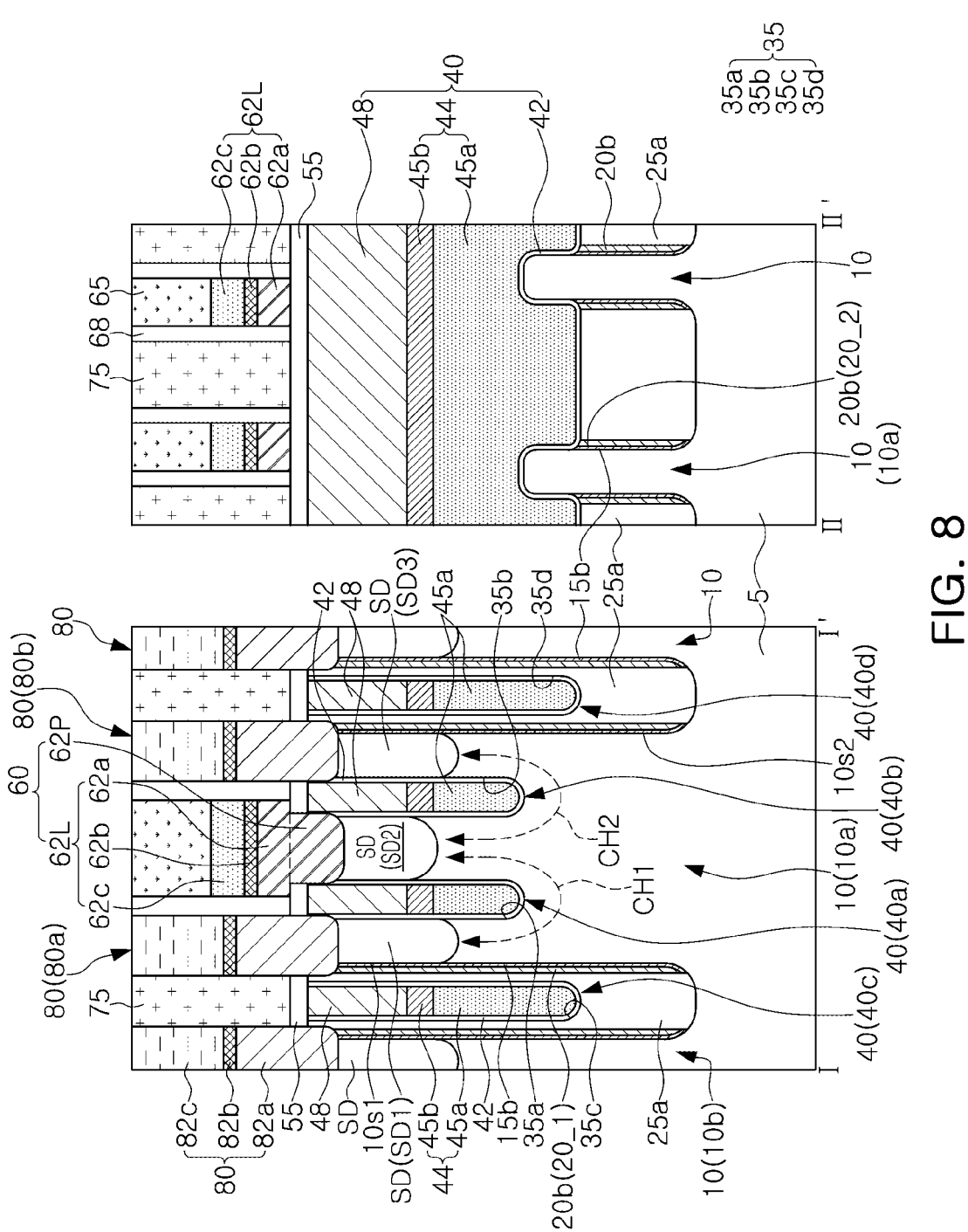

In a modified example, referring to FIGS. 1 and 8, a semiconductor device according to an embodiment may further include a buffer layer 15b disposed between the semiconductor layer 20b described above with reference to FIG. 4 and side surfaces of the active regions 10.

Figure 9:
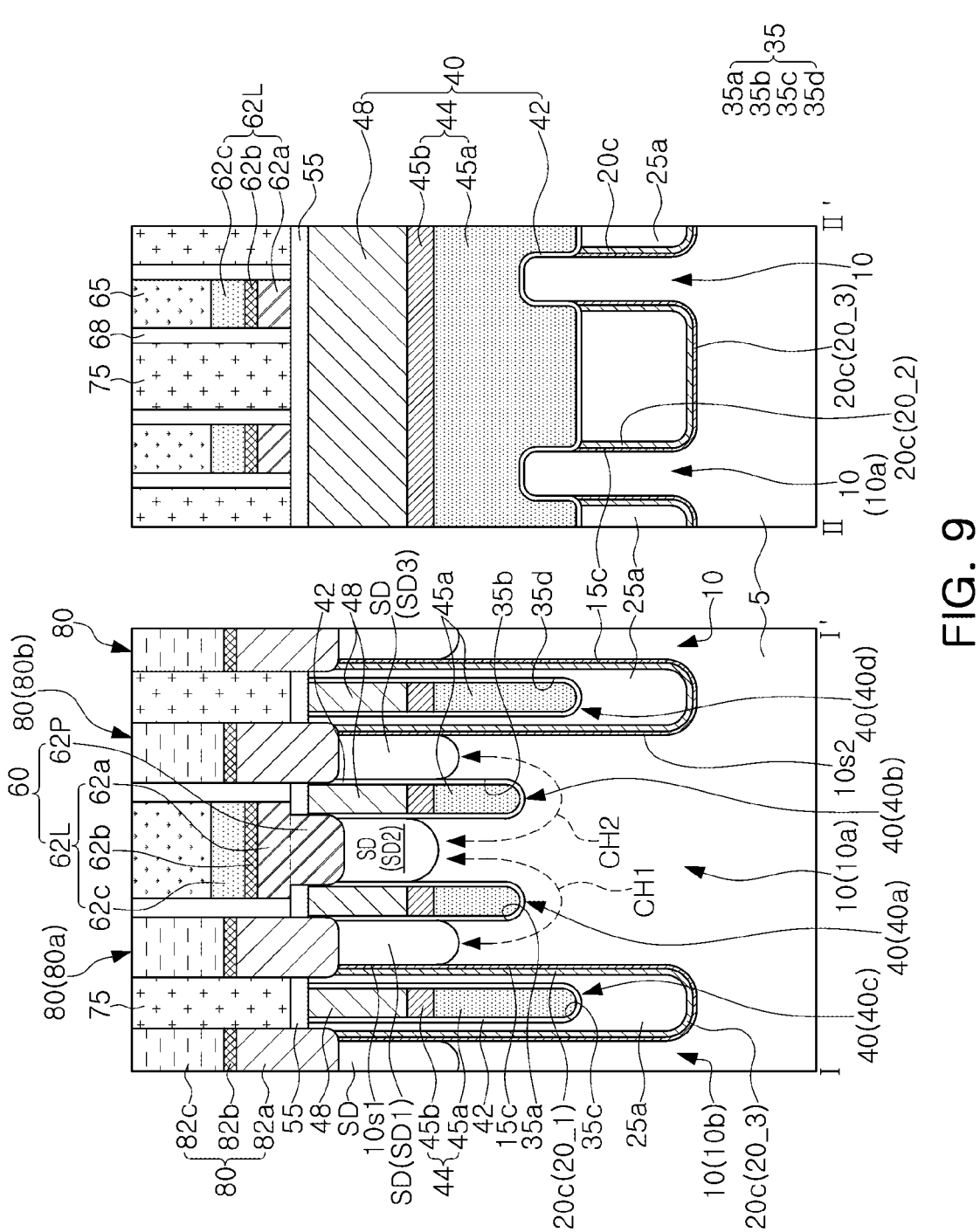

In a modified example, referring to FIGS. 1 and 9, a semiconductor device according to an embodiment may include a buffer layer 15c disposed between the semiconductor layer 20c described above with reference to FIG. 5 and side surfaces of the active regions 10, and between a surface of the semiconductor substrate 5 and the isolation layer 25a.

Figure 10:
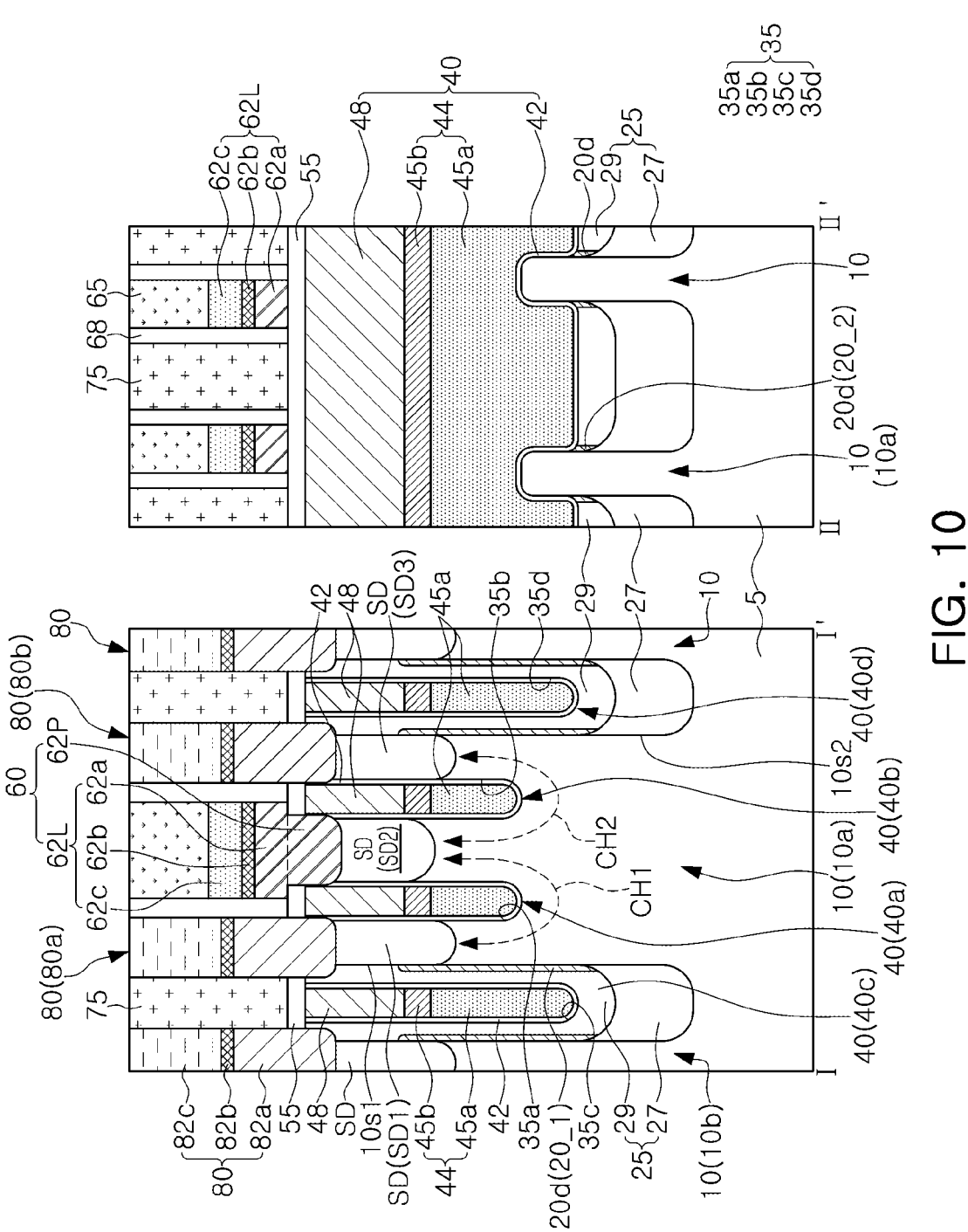

In a modified example, referring to FIGS. 1 and 10, the semiconductor layer 20 described above with reference to FIG. 2 may be modified into a semiconductor layer 20d having an upper end lowered in height. For example, the semiconductor layer 20d may have an upper end disposed on a level lower than an upper surface of each of the source/drain regions SD. Accordingly, the semiconductor layer 20d may expose at least a portion of a side surface of each of the source/drain regions SD, and the side surfaces of the source/drain regions SD exposed by the semiconductor layer 20d may be covered by the isolation layer 25. For example, the semiconductor layer 20d may expose at least a portion of a side surface of the first source/drain region SD1, and the exposed side surface of the first source/drain region SD1 may be in contact with the isolation layer 25. The semiconductor layer 20d may cover a portion of the side surface of the first active region 10a positioned below the first source/drain region SD1, while covering a portion of the side surface of the first source/drain region SD1.

Figure 11:
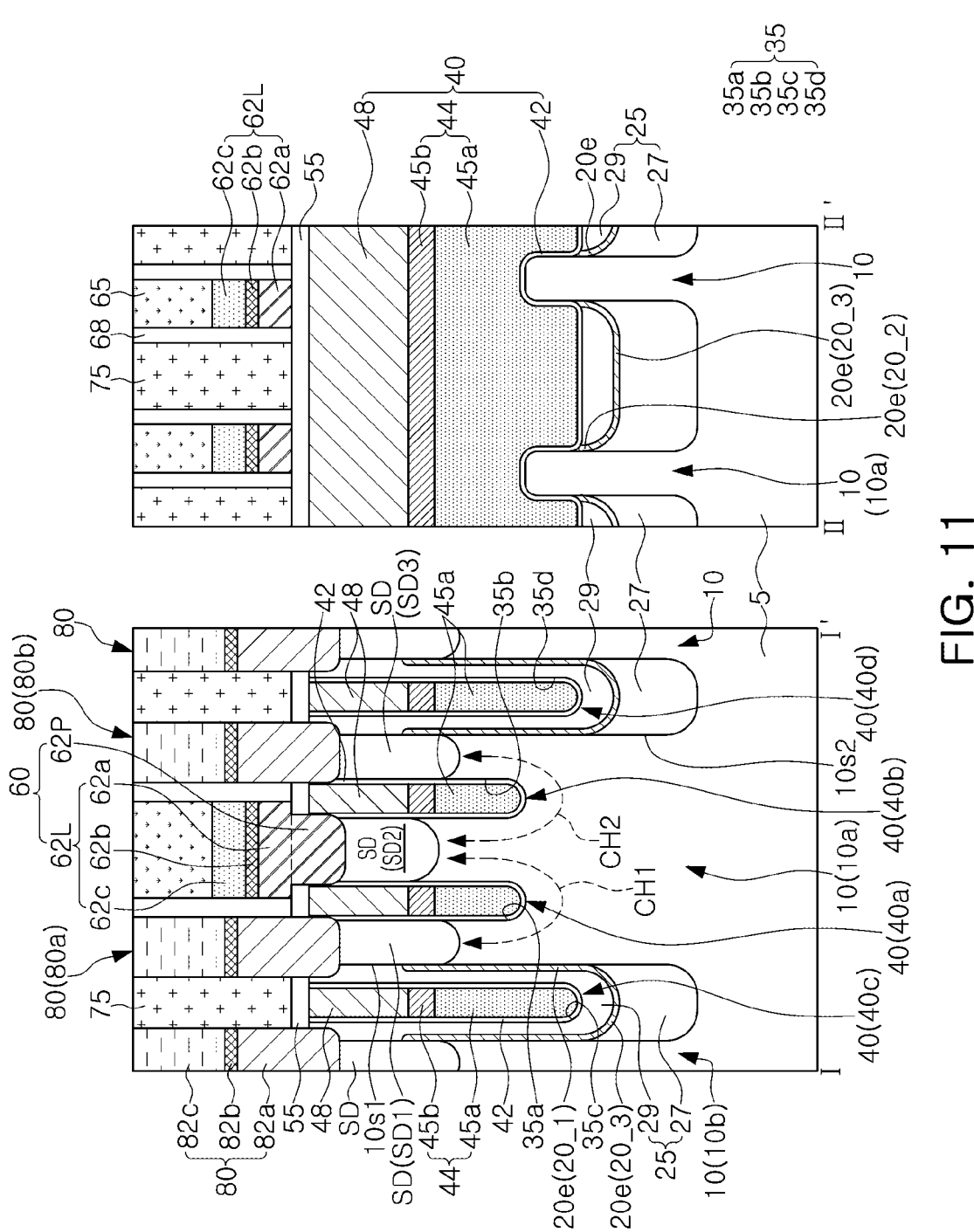

In a modified example, referring to FIGS. 1 and 11, the semiconductor layer 20a described above with reference to FIG. 3 may be modified into a semiconductor layer 20e having a upper end lowered in height, like the semiconductor layer in FIG. 10 (20d of FIG. 10).

Figure 12:
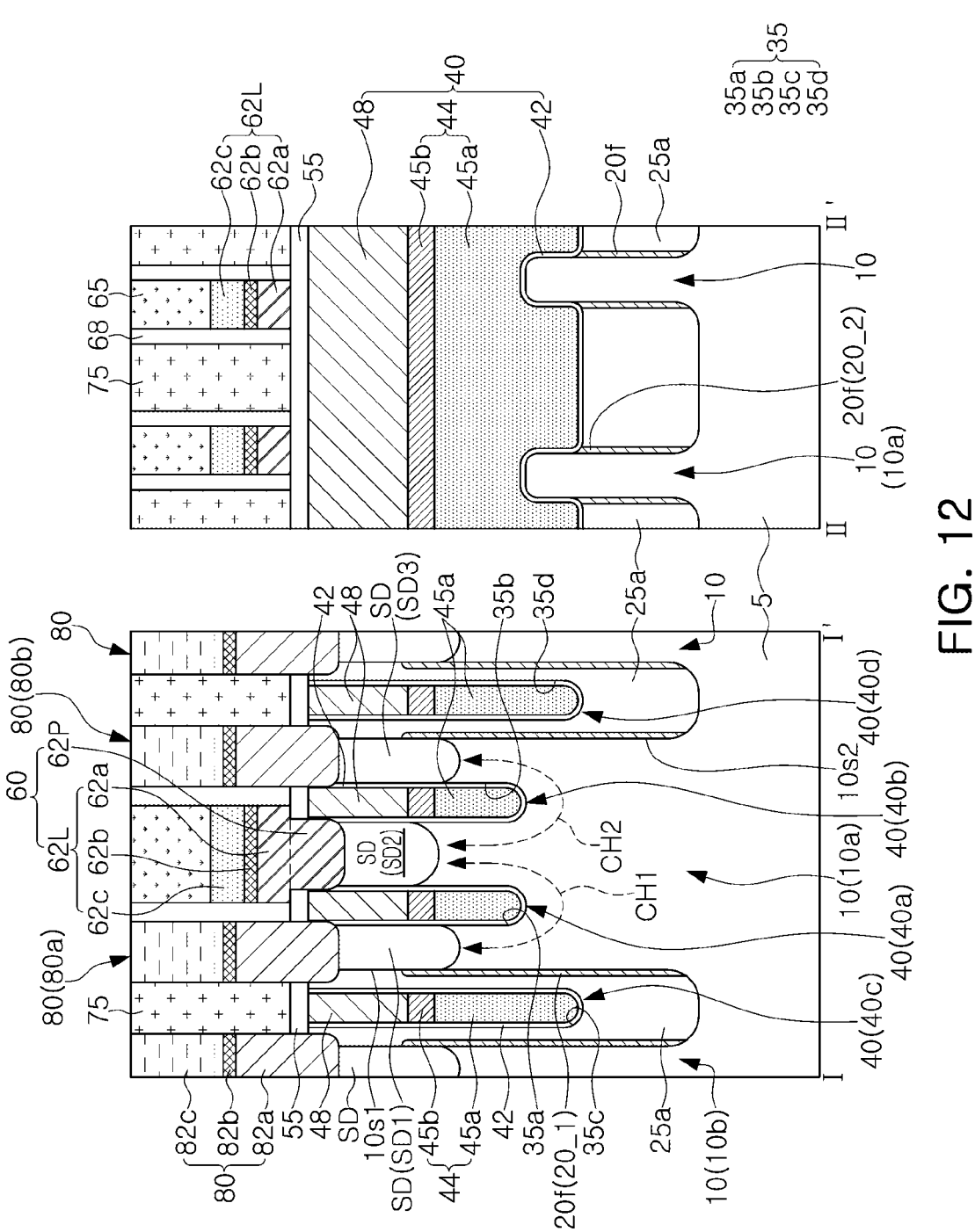

In a modified example, referring to FIGS. 1 and 12, the semiconductor layer 20*b* described above with reference to FIG. 4 may be modified into a semiconductor layer 20*f* having an upper end lowered in height, like the semiconductor layer in FIG. 10 (20*d* of FIG. 10).

Figure 13:
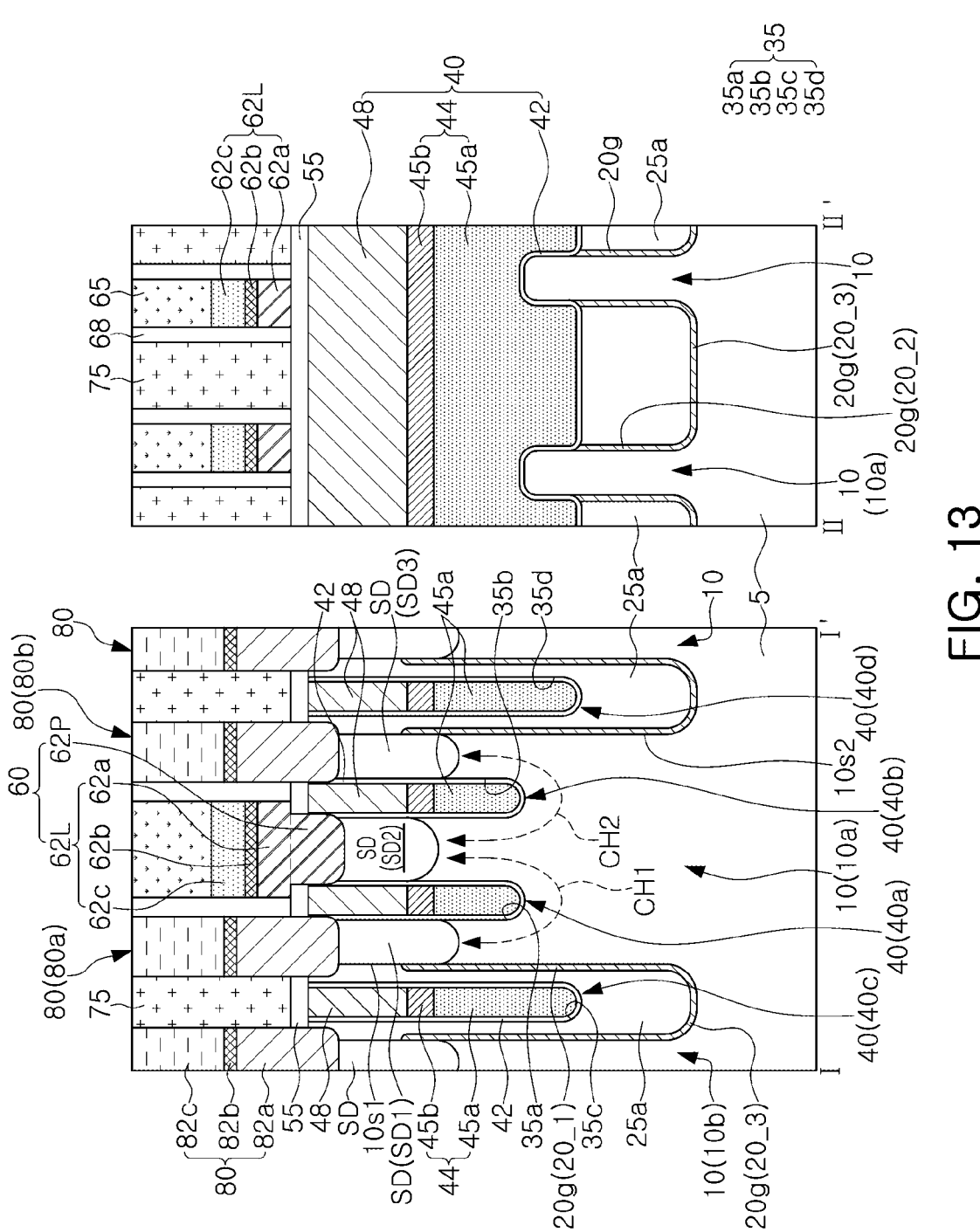

In a modified example, referring to FIGS. 1 and 13, the semiconductor layer 20*c* described above with reference to FIG. 5 may be modified into a semiconductor layer 20*g* having a upper end lowered in height, like the semiconductor layer in FIG. 10 (20*d* of FIG. 10).

Figure 14A:
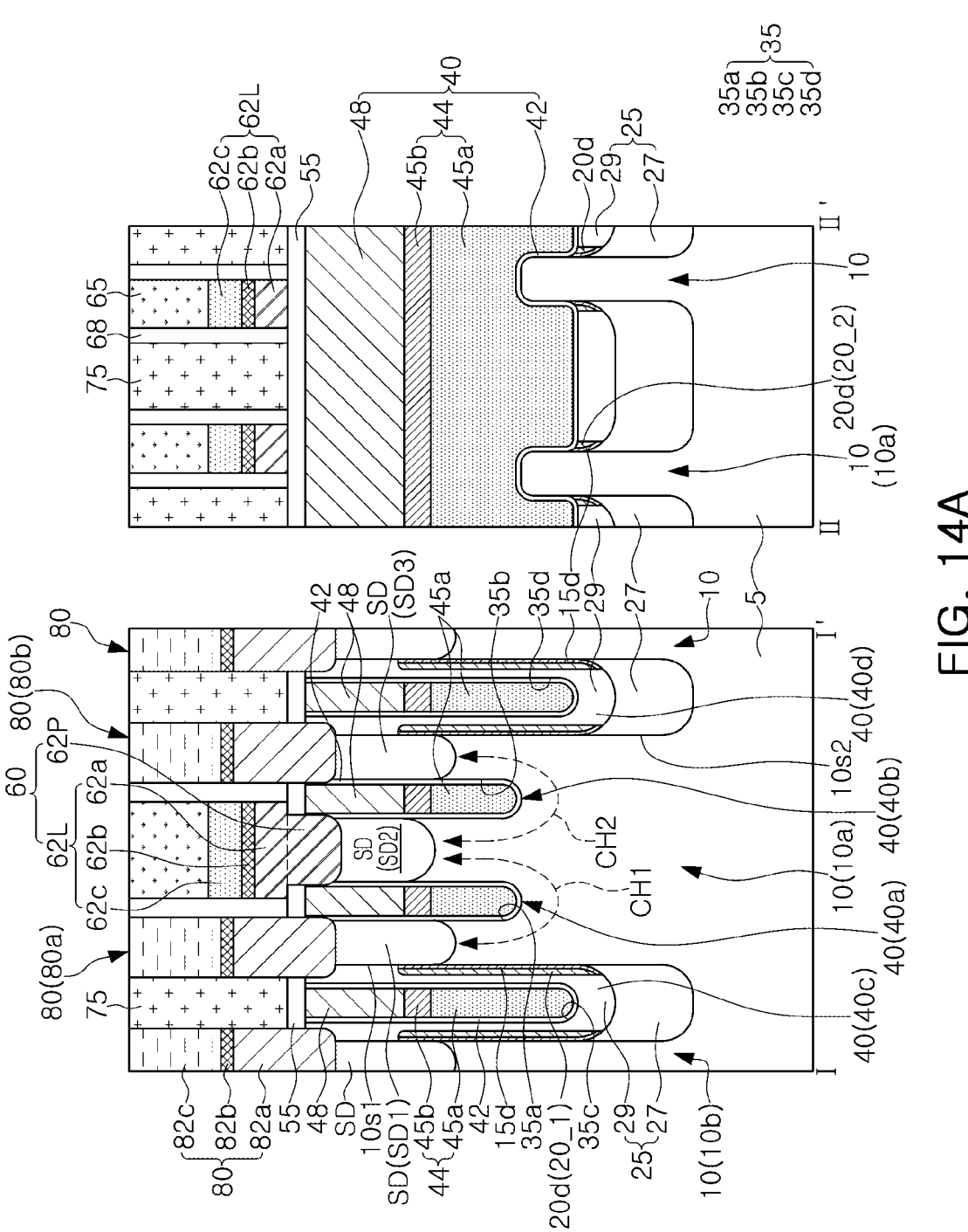

In a modified example, referring to FIGS. 1 and 14A, a semiconductor device according to an embodiment may further include a buffer layer 15*d* disposed between the semiconductor layer 20*d* described above with reference to FIG. 10 and the side surfaces of the active regions 10.

Figure 14B:
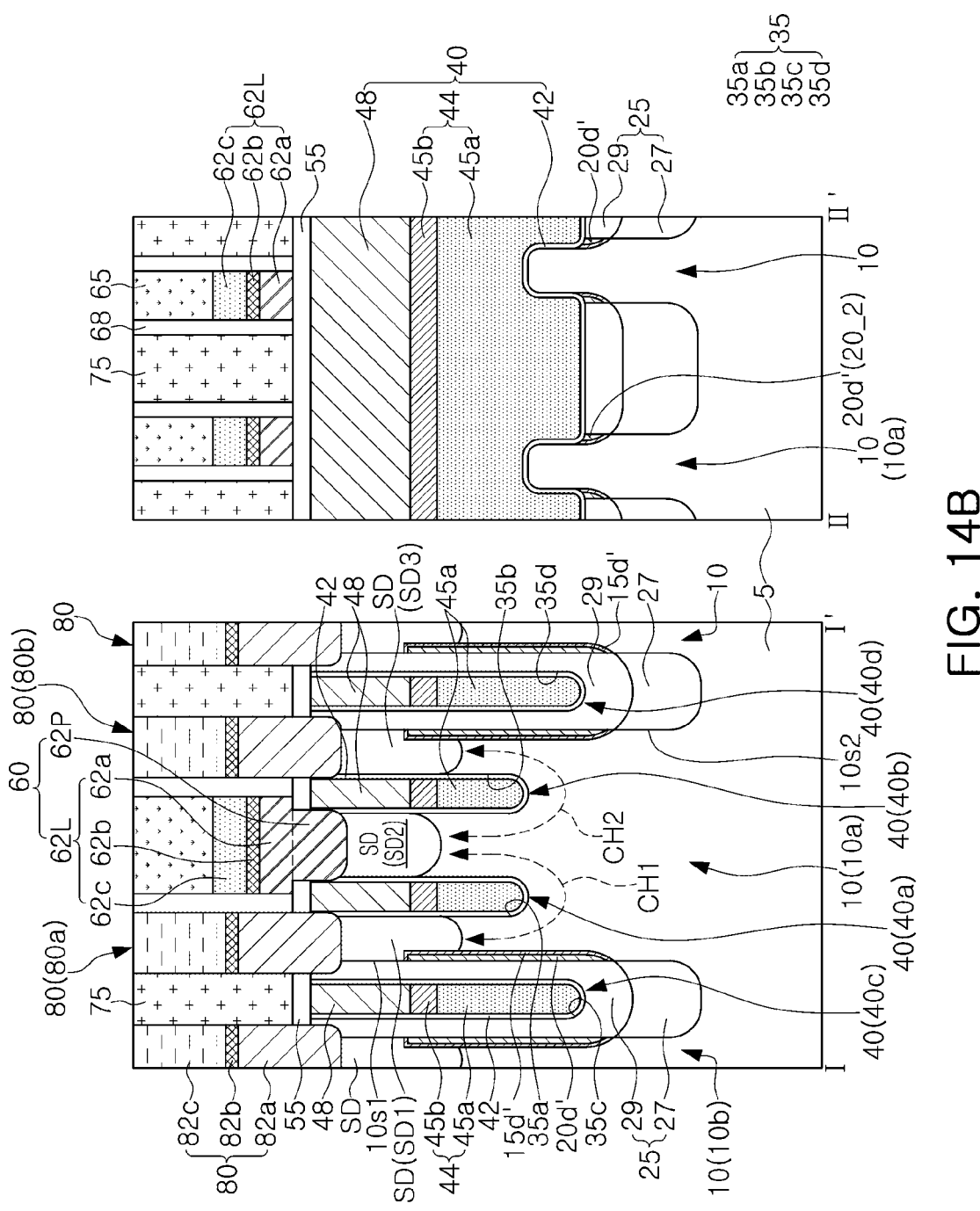

In a modified example, referring to FIGS. 1 and 14B, in a semiconductor device according to an embodiment, the buffer layer 15*d* and the semiconductor layer 20*d* in FIG. 14A may be modified into a buffer layer 15*d'* and a semiconductor layer 20*d'* embedded in the active regions 10. For example, a portion of the first source/drain region SD1 may vertically overlap an upper end of the semiconductor layer 20*d'* embedded in a portion of the first side surface 10*s*1 of the first active region 10*a*.

In an example, the buffer layer 15*d'* may cover an outer surface of the semiconductor layer 20*d'* and may be interposed between the active regions 10 and the semiconductor layer 20*d'*. In another example, the buffer layer 15*d'* may be omitted.

Figure 15A:
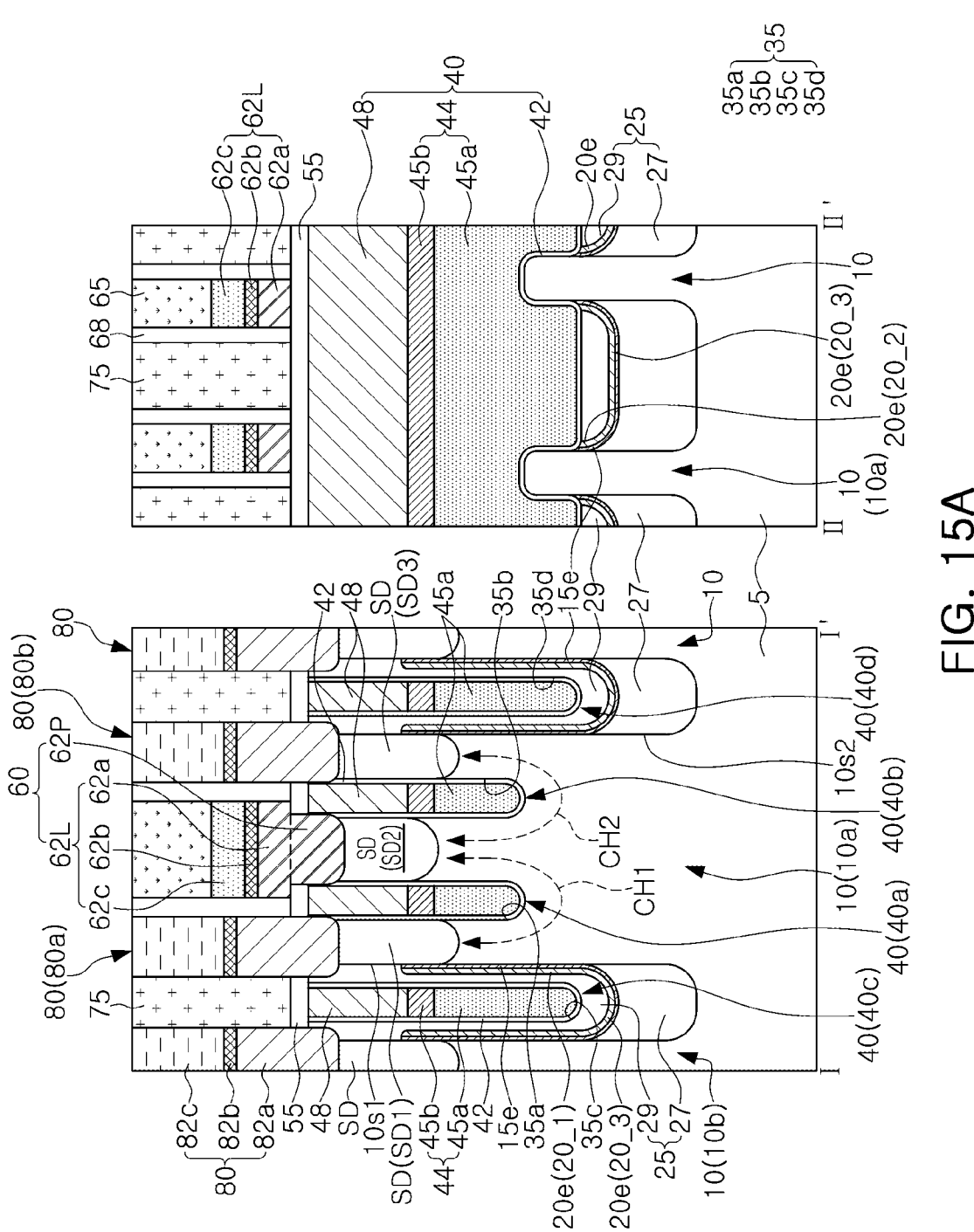

In a modified example, referring to FIGS. 1 and 15A, a semiconductor device according to an embodiment may further include a buffer layer 15*e* disposed between the semiconductor layer 20*e* described above with reference to FIG. 11 and the side surfaces of the active regions 10 and covering a lower surface of the semiconductor layer 20*e*.

Figure 15B:
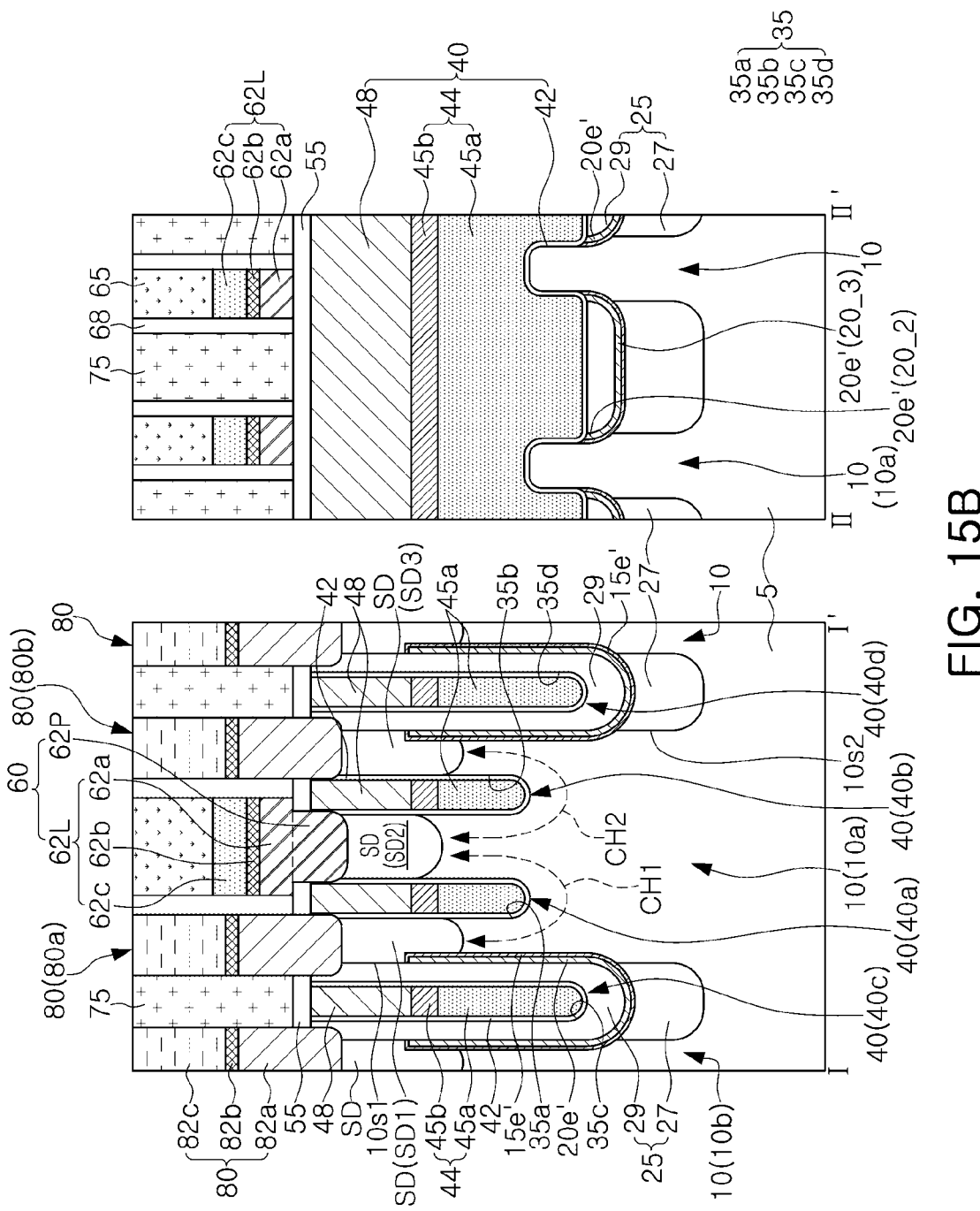

In a modified example, referring to FIGS. 1 and 15B, in a semiconductor device according to an embodiment, the buffer layer 15*e* and the semiconductor layer 20*e* in FIG. 15A may be modified into a buffer layer 15*e'* and a semiconductor layer 20*e'* embedded in the active regions 10 For example, a portion of the first source/drain region SD1 may vertically overlap an upper end of the semiconductor layer 20*e'* embedded in a portion of the first side surface 10*s*1 of the first active region 10*a*.

In an example, the buffer layer 15*e'* may cover an outer surface and a lower surface of the semiconductor layer 20*e'* and may be interposed between the active regions 10 and the semiconductor layer 20*e'*. In another example, the buffer layer 15*e'* may be omitted.

Figure 16A:
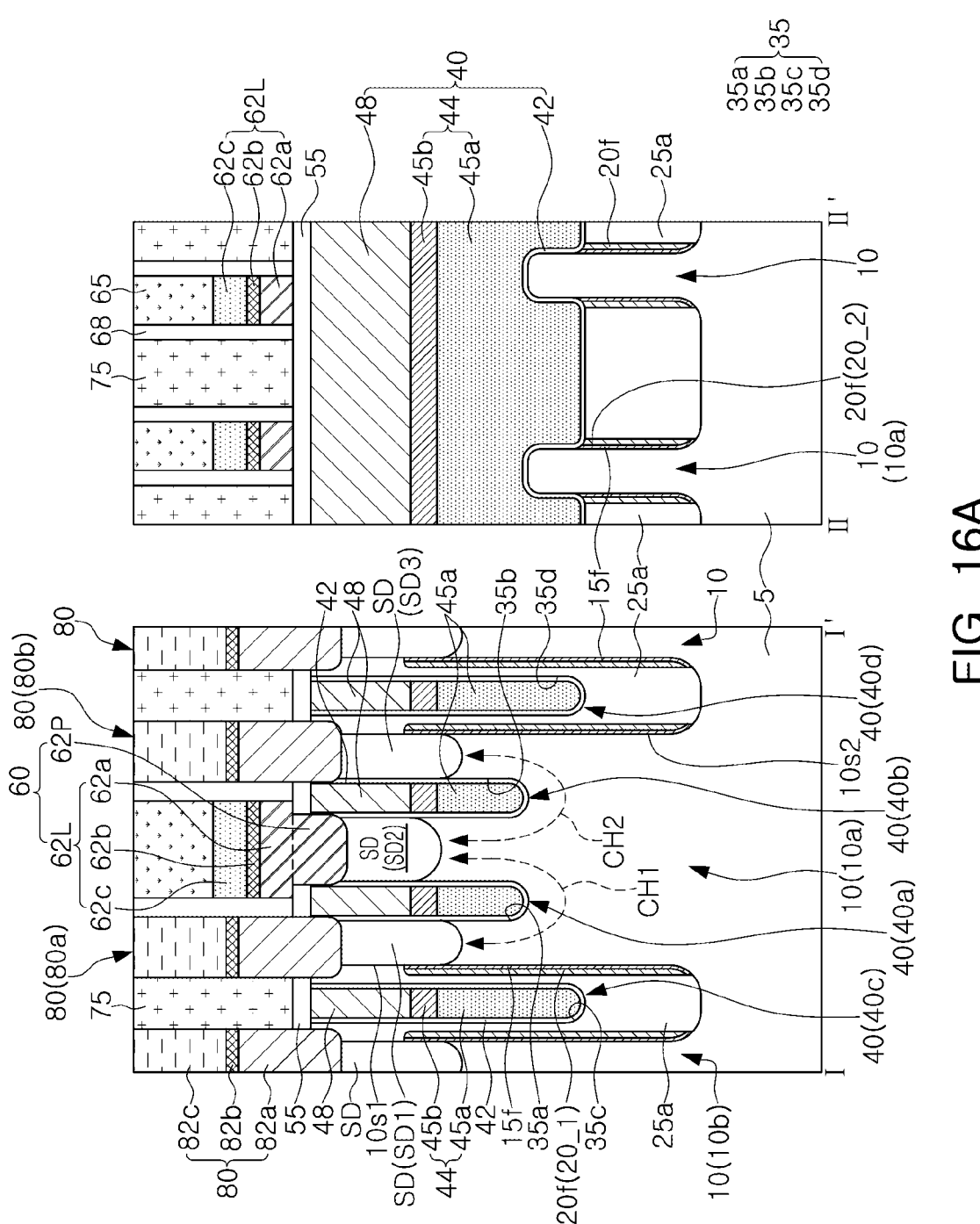

In a modified example, referring to FIGS. 1 and 16A, a semiconductor device according to an embodiment may further include a buffer layer 15*f* disposed between the semiconductor layer 20*f* described above with reference to FIG. 12 and the side surfaces of the active regions 10.

Figure 16B:
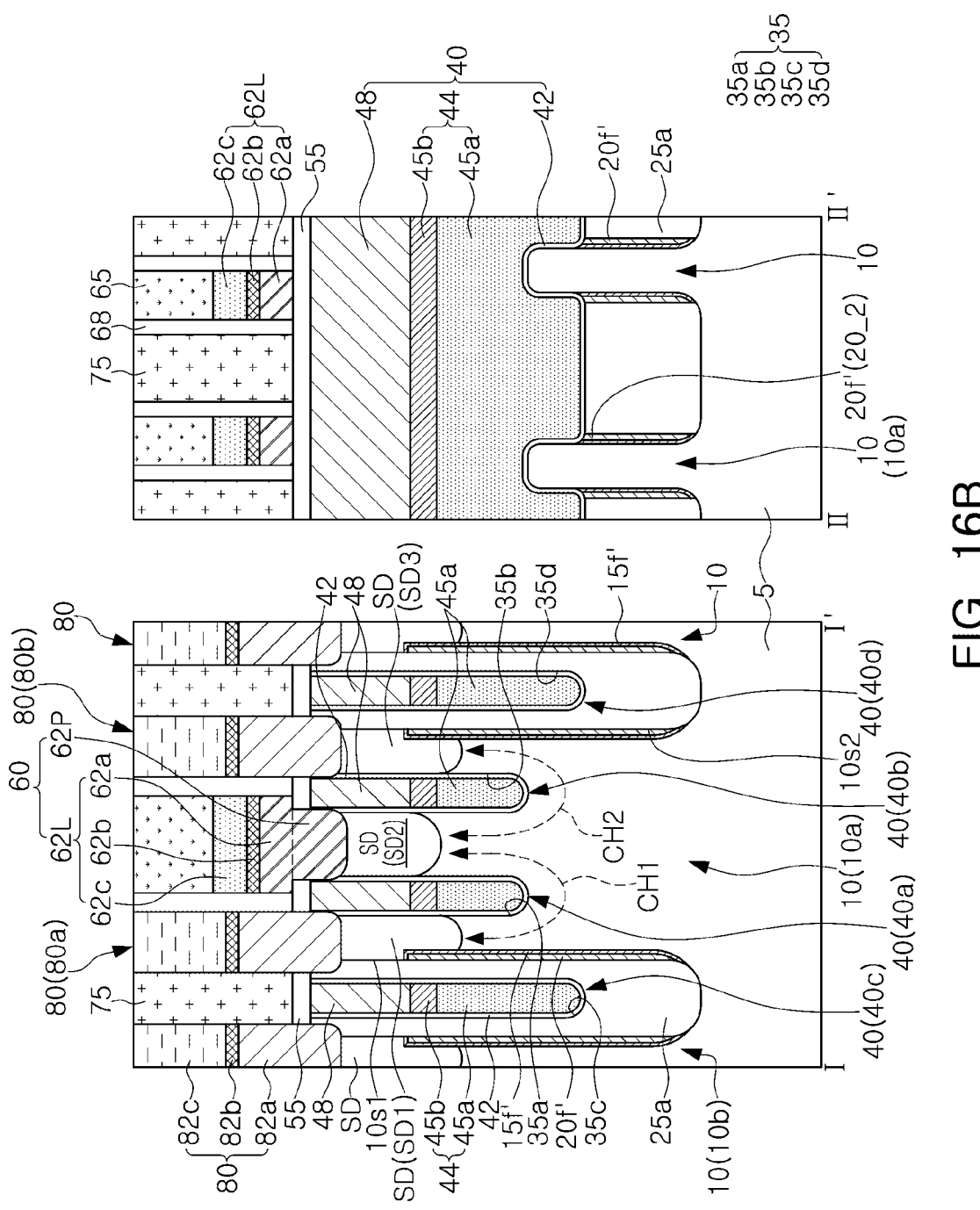

In a modified example, referring to FIGS. 1 and 16B, in a semiconductor device according to an embodiment, the buffer layer 15*f* and the semiconductor layer 20*f* in FIG. 16A may be modified into a buffer layer 15*f* and a semiconductor layer 20*f'* embedded in the active regions 10. For example, a portion of the first source/drain region SD1 may vertically overlap an upper end of the semiconductor layer 20*f'* embedded in a portion of the first side surface 10*s*1 of the first active region 10*a*.

In an example, the buffer layer 15*f* may cover an outer surface of the semiconductor layer 20*f'* and may be interposed between the active regions 10 and the semiconductor layer 20*f'*. In another example, the buffer layer 15*f'* may be omitted.

Figure 17A:
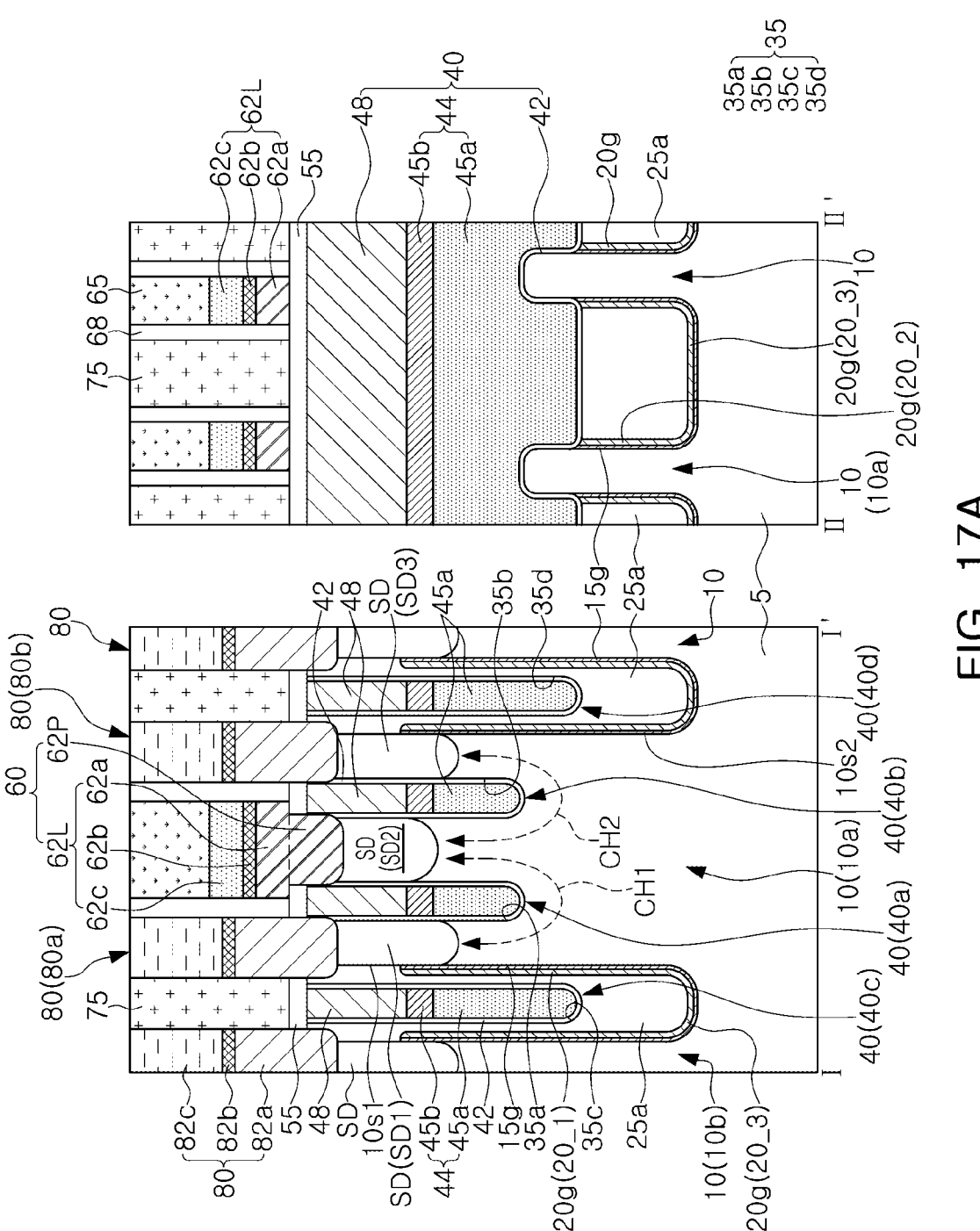

In a modified example, referring to FIGS. 1 and 17A, a semiconductor device according to an embodiment may further include a buffer layer 15*g* disposed between the semiconductor layer 20*g* described above with reference to FIG. 13 and the side surfaces of the active regions 10 and covering a lower surface of the semiconductor layer 20*g*.

Figure 17B:
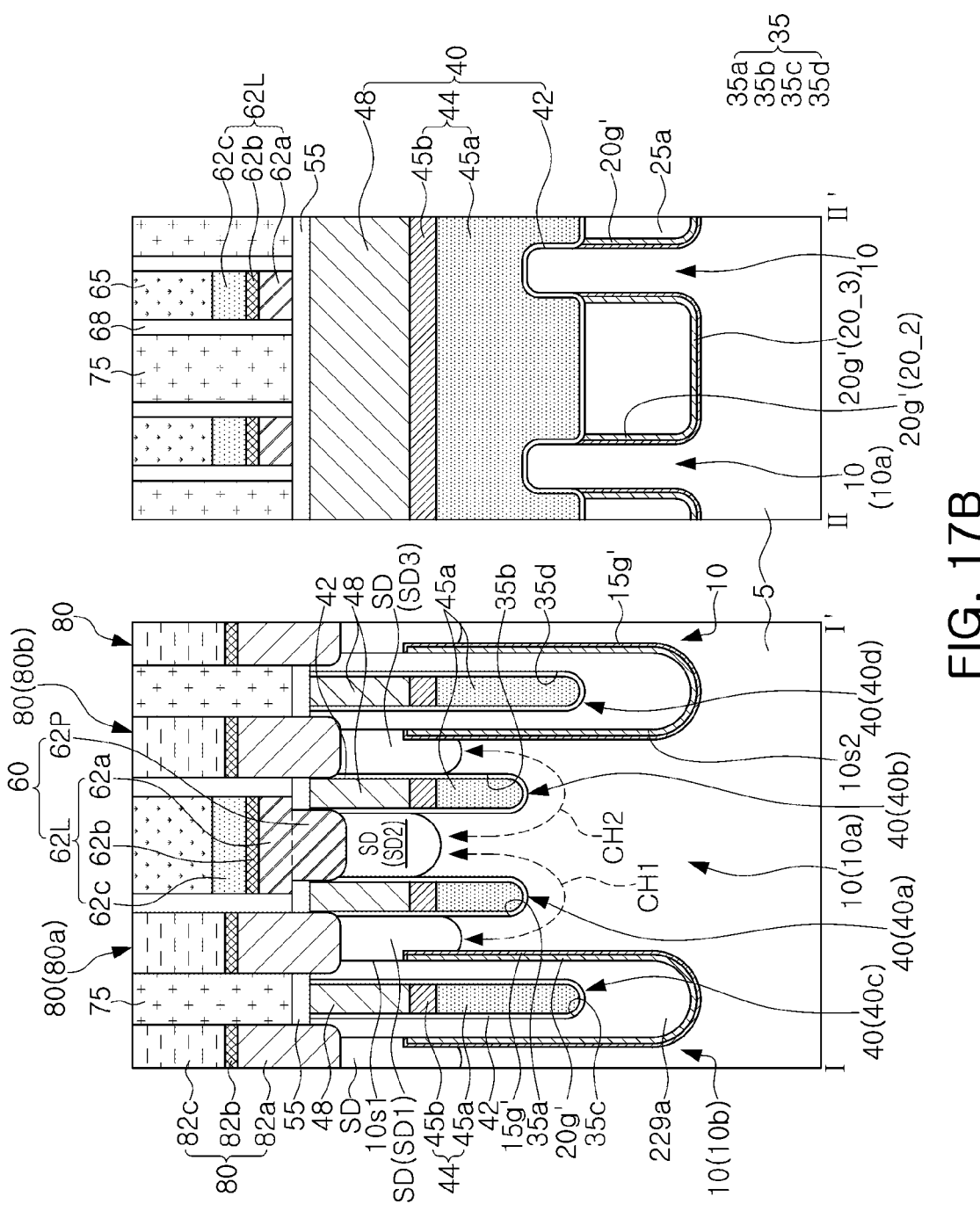

In a modified example, referring to FIGS. 1 and 17B, in a semiconductor device according to an embodiment, the buffer layer 15*g* and the semiconductor layer 20*g* in FIG. 17A may be modified into a buffer layer 15*g'* and a semiconductor layer 20*g'* embedded in the active regions 10. For example, a portion of the first source/drain region SD1 may vertically overlap an upper end of the semiconductor layer 20*g'* embedded in a portion of the first side surface 10*s*1 of the first active region 10*a*.

In an example, the buffer layer 15*g'* may cover an outer surface and a lower surface of the semiconductor layer 20*g'* and may be interposed between the active regions 10 and the semiconductor layer 20*g'*. In another example, the buffer layer 15*g'* may be omitted.

Next, various modified examples of semiconductor device according to an embodiment will be described with reference to FIGS. 18 to 25B.

Figure 18:
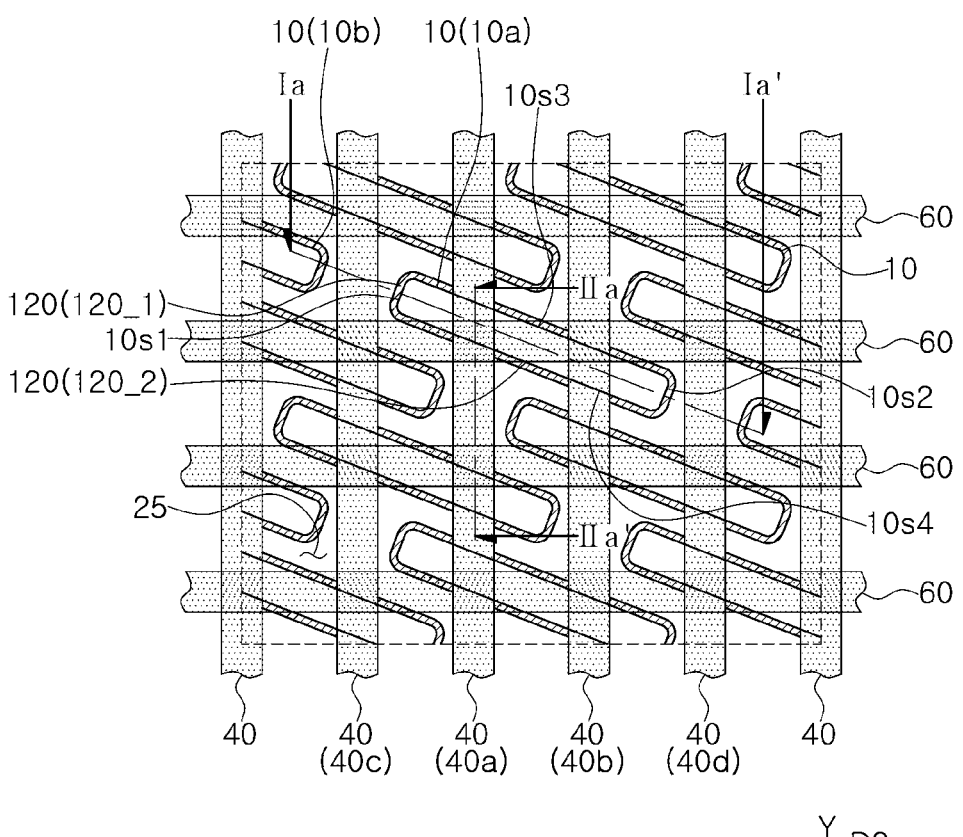
FIG. 18 is a plan view conceptually illustrating a modified example of a semiconductor device according to an embodiment.

FIG. 18 is a plan view conceptually illustrating a semiconductor device according to an embodiment, and FIGS. 19 to 24, 25A and 25B are cross-sectional views conceptually illustrating regions taken along lines Ia-Ia' and IIa-IIa' of FIG. 18 in order to explain various modified examples of a semiconductor device according to an embodiment.

Figure 19:
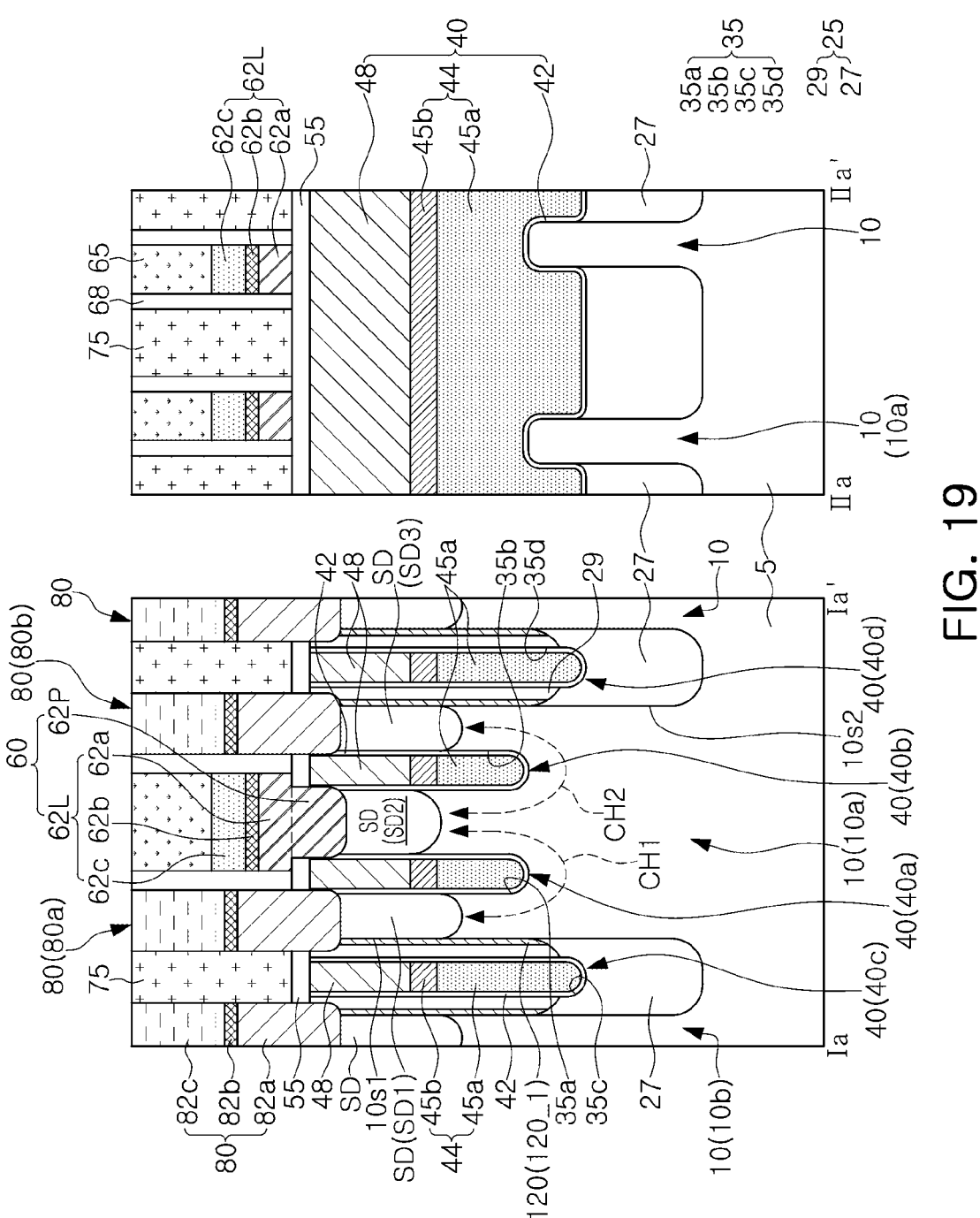
FIGS. 19 to 25D are conceptual cross-sectional views of a portion of FIG. 18 illustrating various examples of a semiconductor device according to an embodiment.

In a modified example, referring to FIGS. 18 and 19, the ring-shaped semiconductor layer 20 described above with reference to FIG. 1 may be modified into a semiconductor layer 120 including semiconductor portions 120_1 and 120_2 separated from each other by the gate structures 40. For example, the ring-shaped semiconductor layer (20 of FIG. 1) surrounding the first active region 10*a* described above with reference to FIG. 1 may be modified into the semiconductor layers 120 including the semiconductor portions 120_1 and 120_2 separated, e.g., and spaced apart, from each other by the first and second inner gate structures 40*a* and 40*b* as illustrated in FIG. 18.

The semiconductor layer 20 as illustrated in FIG. 2 may be modified into the semiconductor layer 120 as illustrated in FIG. 19 having a lower end positioned on a level higher than lower ends of the gate structures 40.

In the semiconductor layer 120, the semiconductor portions 120_1 and 120_2 may include first semiconductor portions 120_1 disposed between the first outer gate structure 40*c* and the first inner gate structure 40*a* and between the second outer gate structure 40*d* and the second inner gate structures 40*b*, and a second semiconductor portion 120_2 disposed between the first and second inner gate structures 40*a* and 40*b*. The isolation layer 25 may include the first isolation portion 27 and the second isolation portion 29 on the first isolation portion 27, and the gate structures 40 may include a portion extending into the first isolation portion 27, and a lower surface of the second isolation portion 29 may be disposed on a level higher than lower ends of the gate structures 40.

Figure 20:
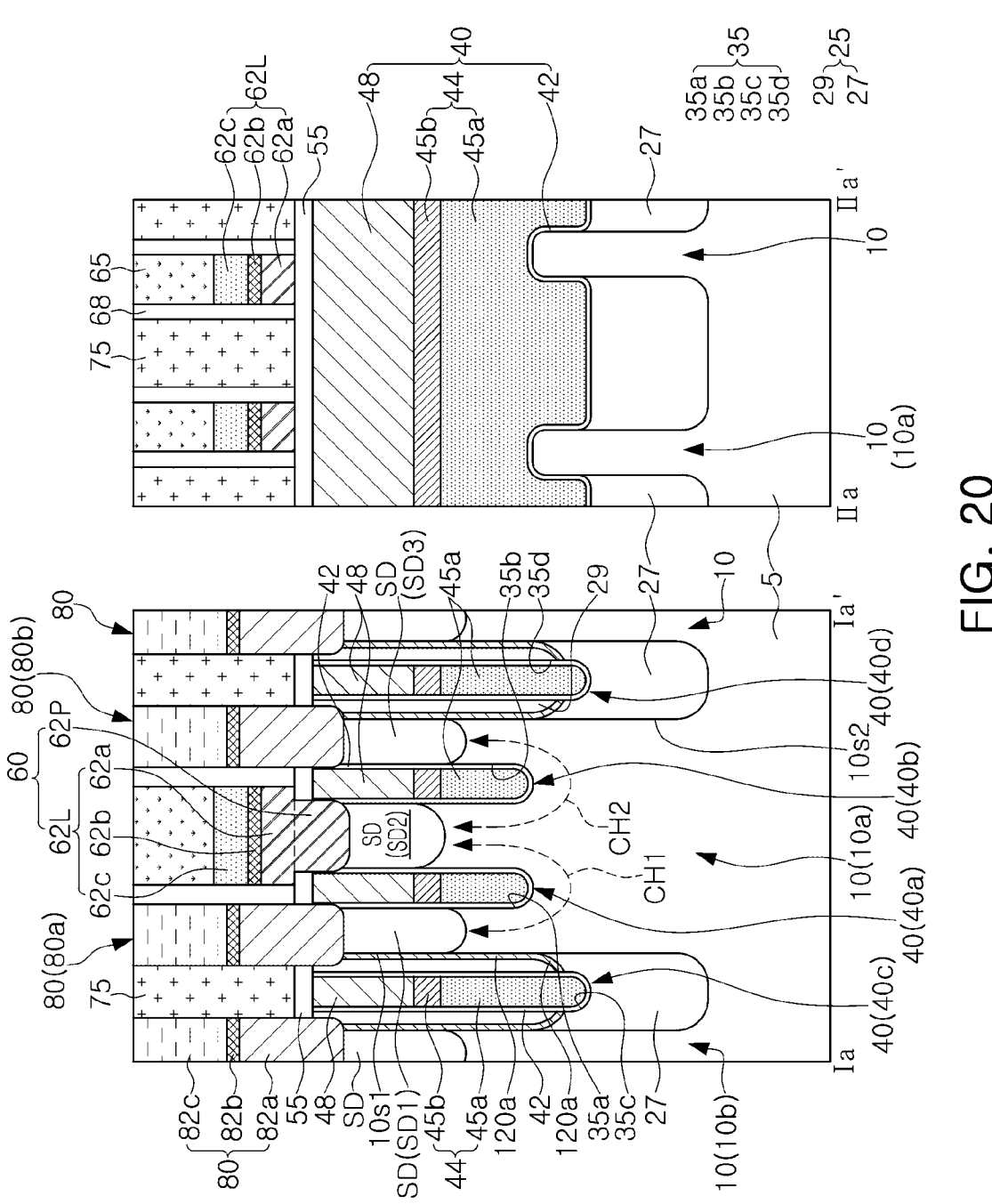

In a modified example, referring to FIGS. 18 and 20, the semiconductor layer 120 described above with reference to FIG. 19 may be modified into a semiconductor layer 120*a* further including a portion extending between the first isolation portion 27 and the second isolation portion 29.

Figure 21:
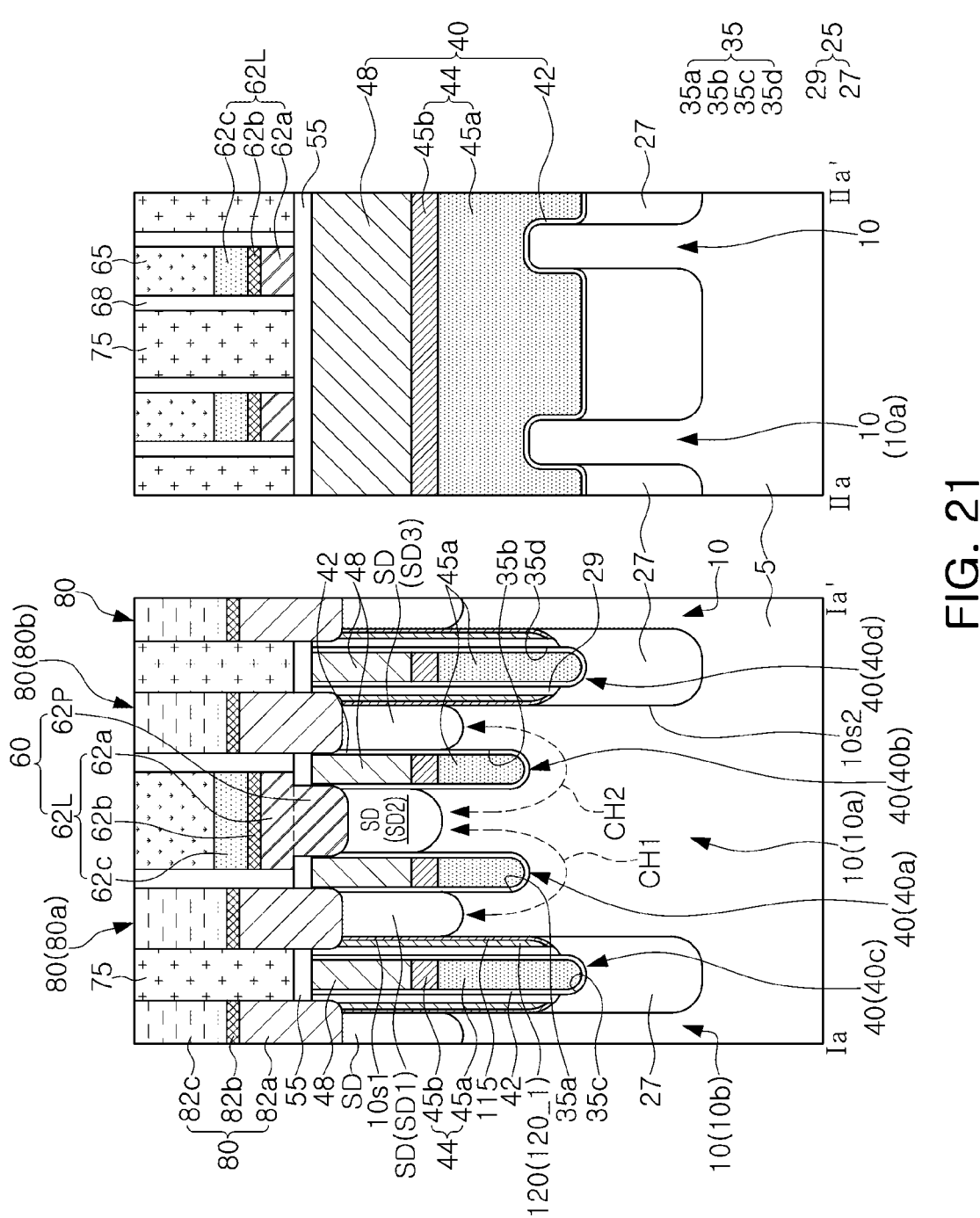

In a modified example, referring to FIGS. 18 and 21, a semiconductor device according to an embodiment may further include a buffer layers 115 disposed between the semiconductor layer 120 described above with reference to FIG. 19 and the side surfaces of the active regions 10.

Figure 22:
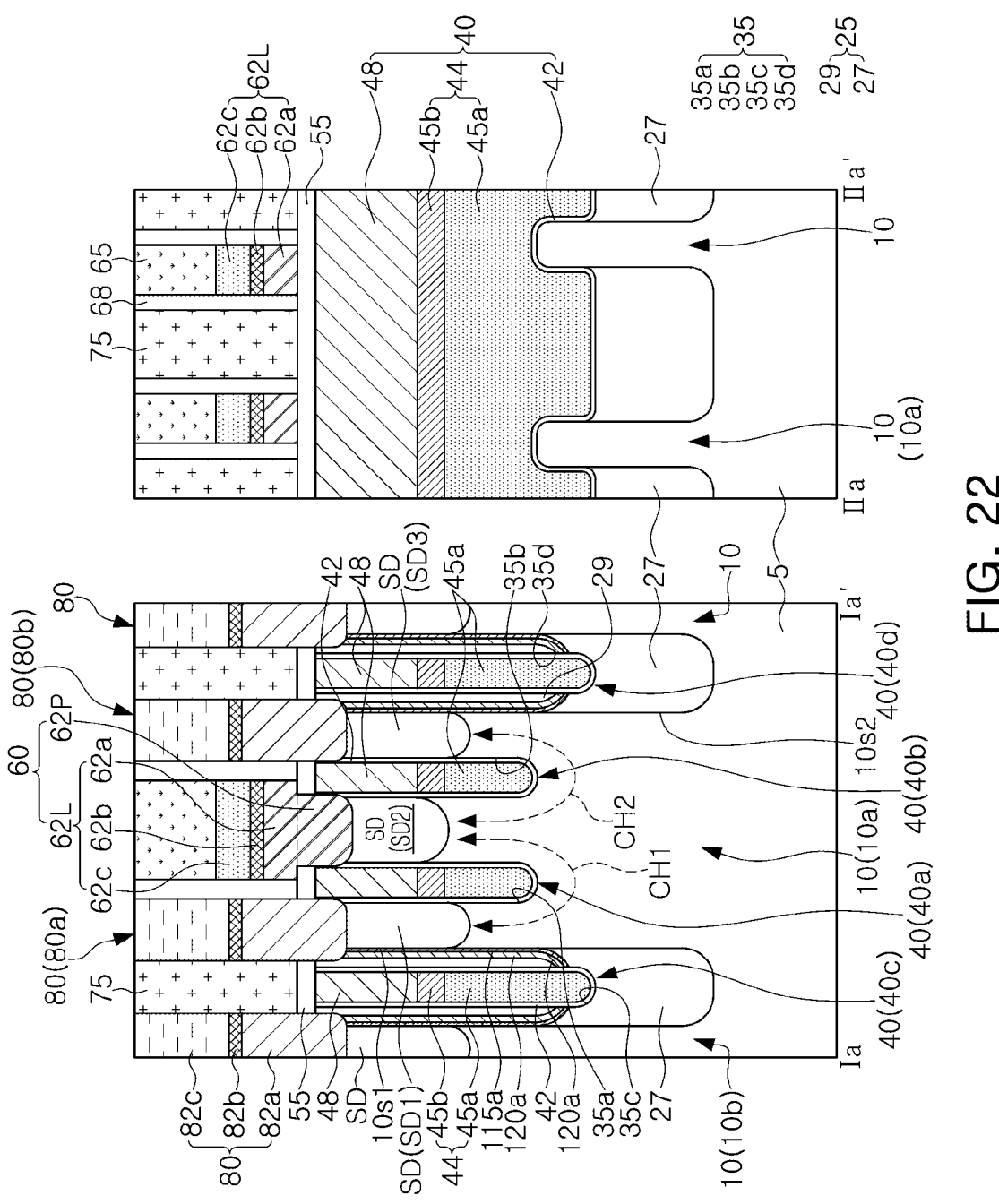

In a modified example, referring to FIGS. 18 and 22, a semiconductor device according to an embodiment may further include a buffer layer 115 disposed between the semiconductor layer 120a described above with reference to FIG. 20 and the side surfaces of the active regions 10 and extending between the semiconductor layer 120a and the first isolation portion 27.

Figure 23:
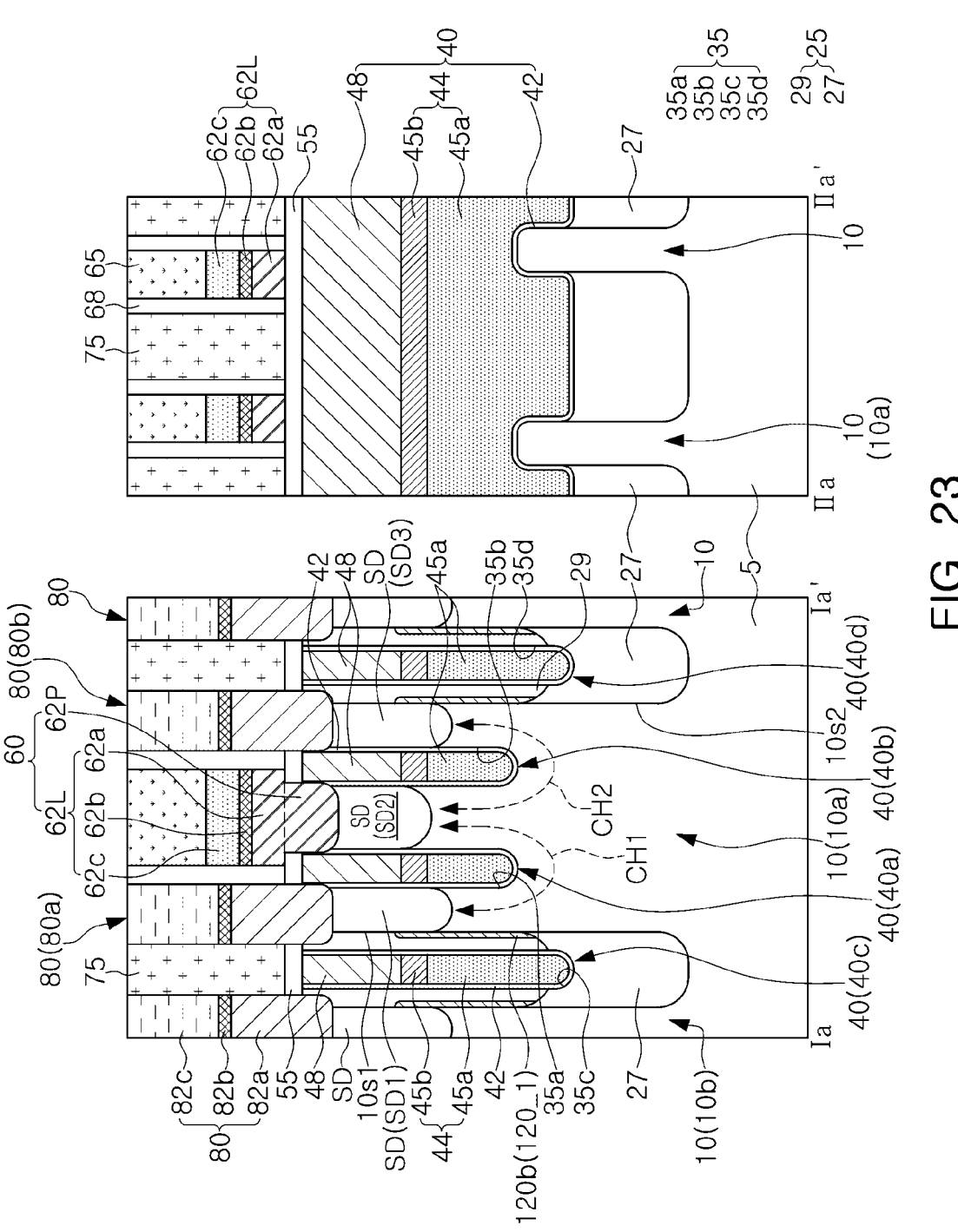

In a modified example, referring to FIGS. 18 and 23, the semiconductor layer 120 described above with reference to FIG. 19 may be modified into a semiconductor layer 120b having a upper end lowered in height, like the semiconductor layer in FIG. 10 (20d in FIG. 10).

Figure 24:
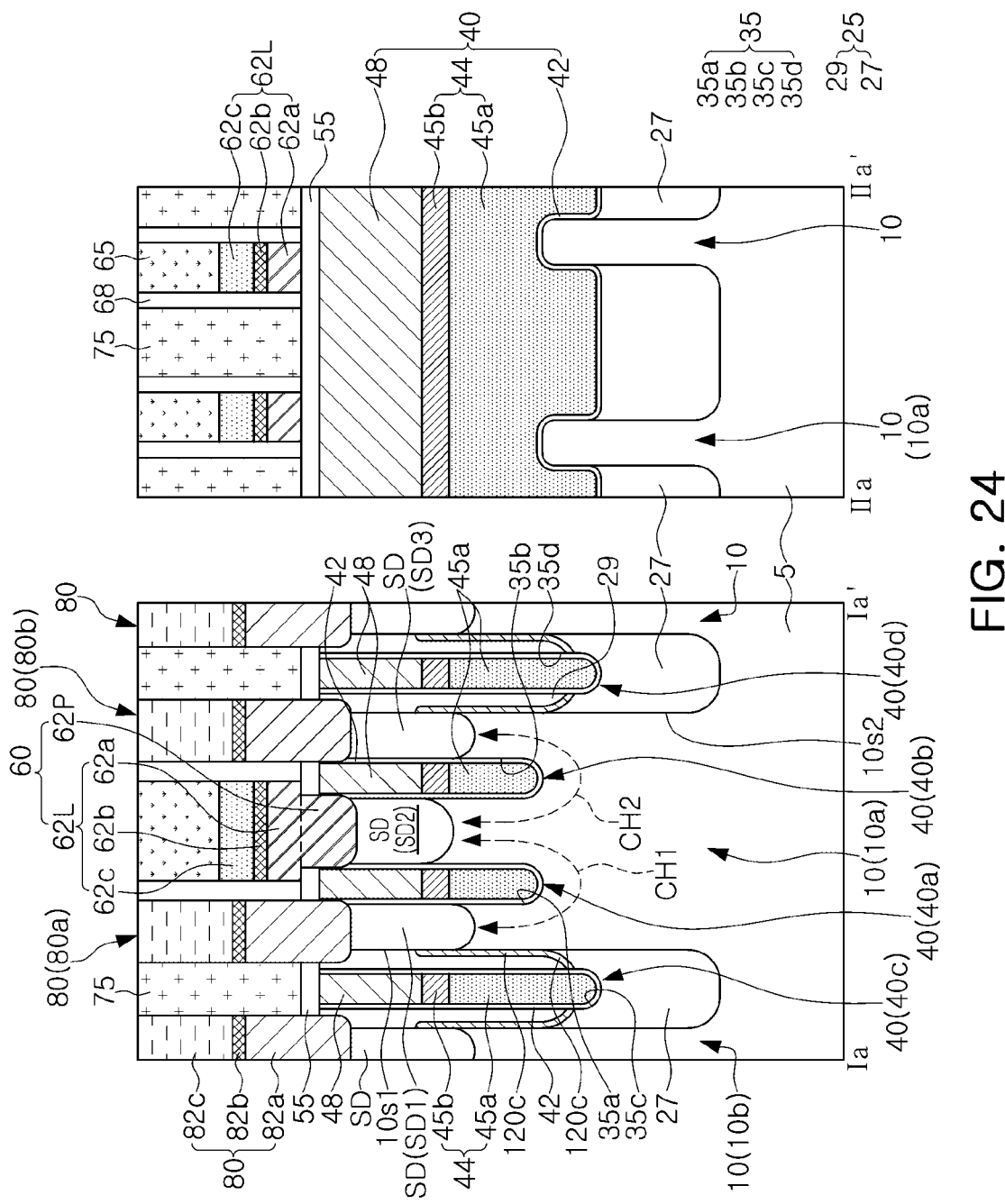

In a modified example, referring to FIGS. 18 and 24, the semiconductor layer 120a described above with reference to FIG. 20 may be modified into a semiconductor layer 120c having an upper end lowered in height, like the semiconductor layer in FIG. 10 (20d in FIG. 10).

Figure 25A:
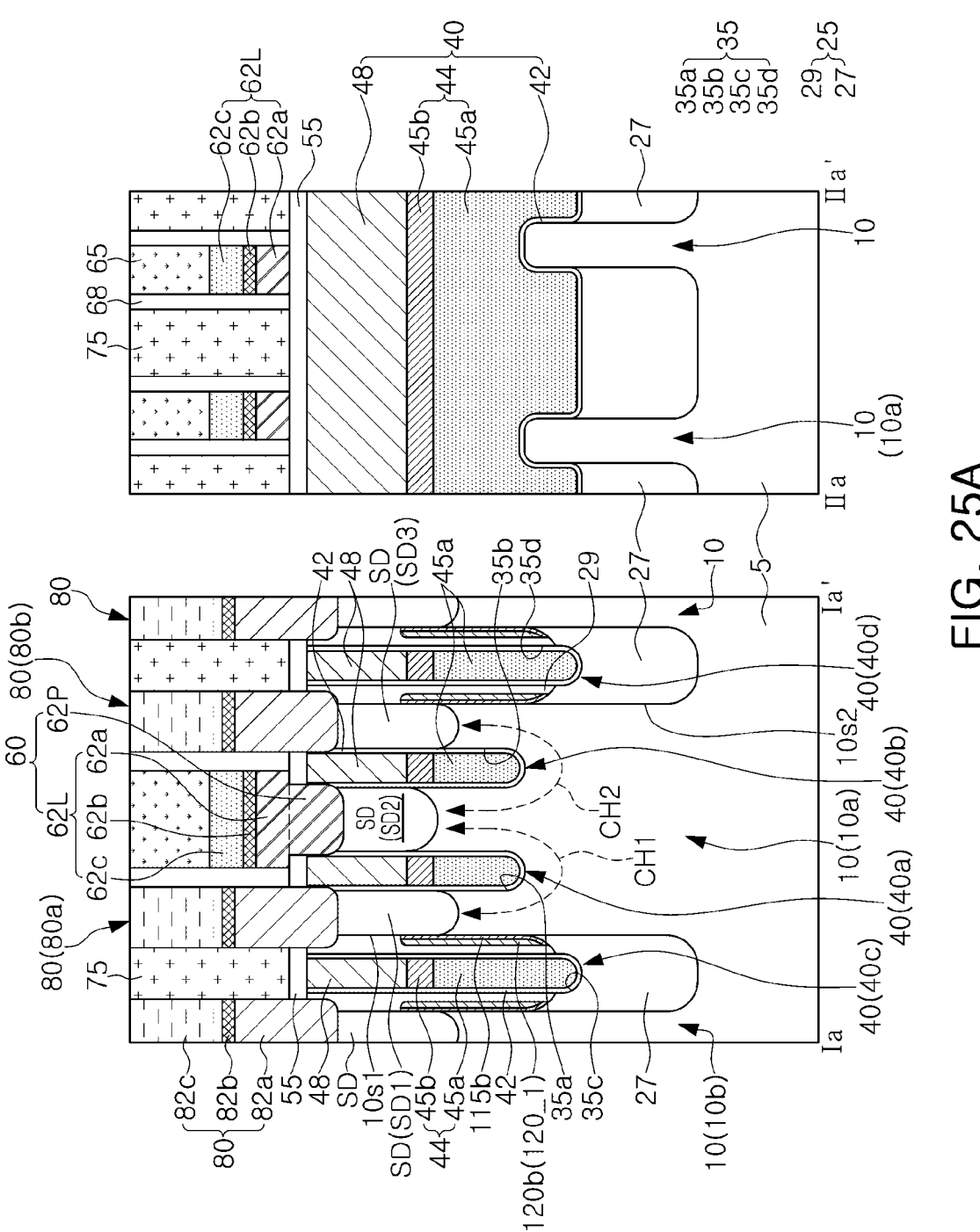

In a modified example, referring to FIGS. 18 and 25A, a semiconductor device according to an embodiment may further include a buffer layer 115b disposed between the semiconductor layer 120b described above with reference to FIG. 23 and the side surfaces of the active regions 10.

Figure 25B:
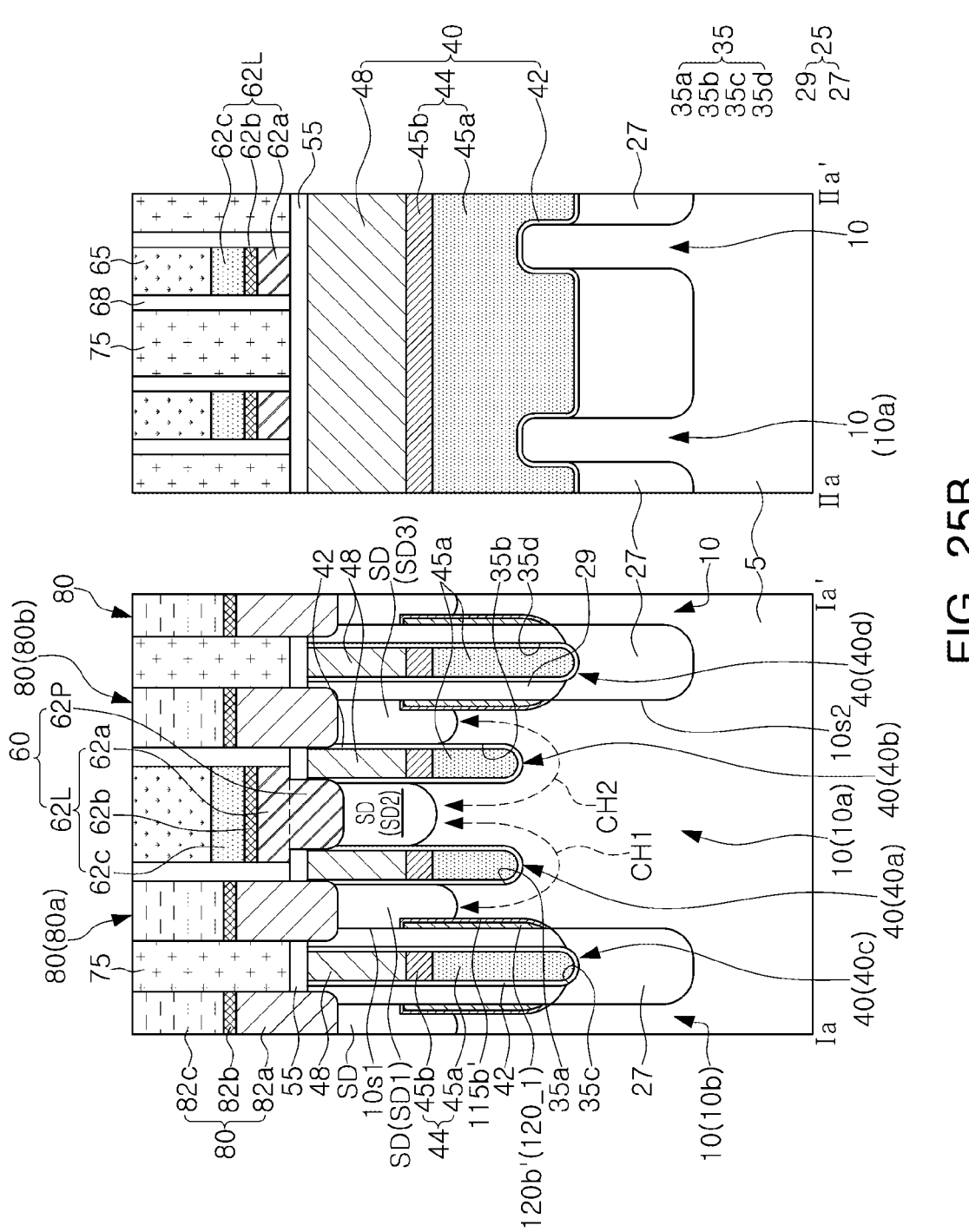

In a modified example, referring to FIGS. 1 and 25B, in a semiconductor device according to an embodiment, the buffer layer 115b and the semiconductor layer 120b in FIG. 25A may be a modified buffer layer 115b' and a semiconductor layer 120b' embedded in the active regions 10. For example, a portion of the first source/drain region SD1 may vertically overlap an upper end of the semiconductor layer 120b' embedded in a portion of the first side surface 10s1 of the first active region 10a. In an example, the buffer layer 115b' may cover an outer surface of the semiconductor layer 120b' and may be interposed between the active regions 10 and the semiconductor layer 120b'. In another example, the buffer layer 115b' may be omitted.

Figure 25C:
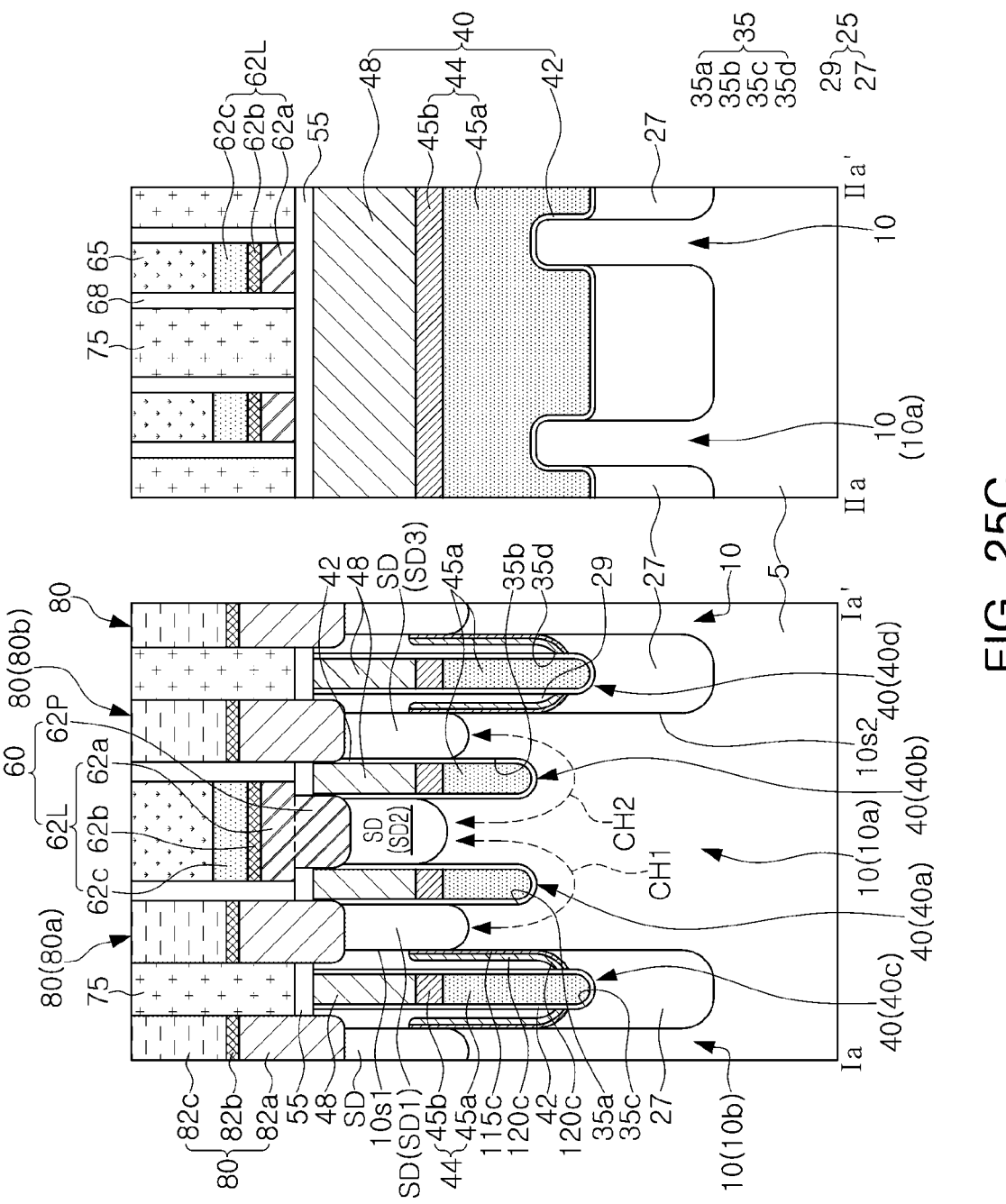

In a modified example, referring to FIGS. 18 and 25C, a semiconductor device 1 according to an embodiment may further include a buffer layer 115c disposed between the semiconductor layer 120c described above with reference to FIG. 24 and the side surfaces of the active regions 10, and extending between the semiconductor layer 120c and the first isolation portion 27.

Figure 25D:
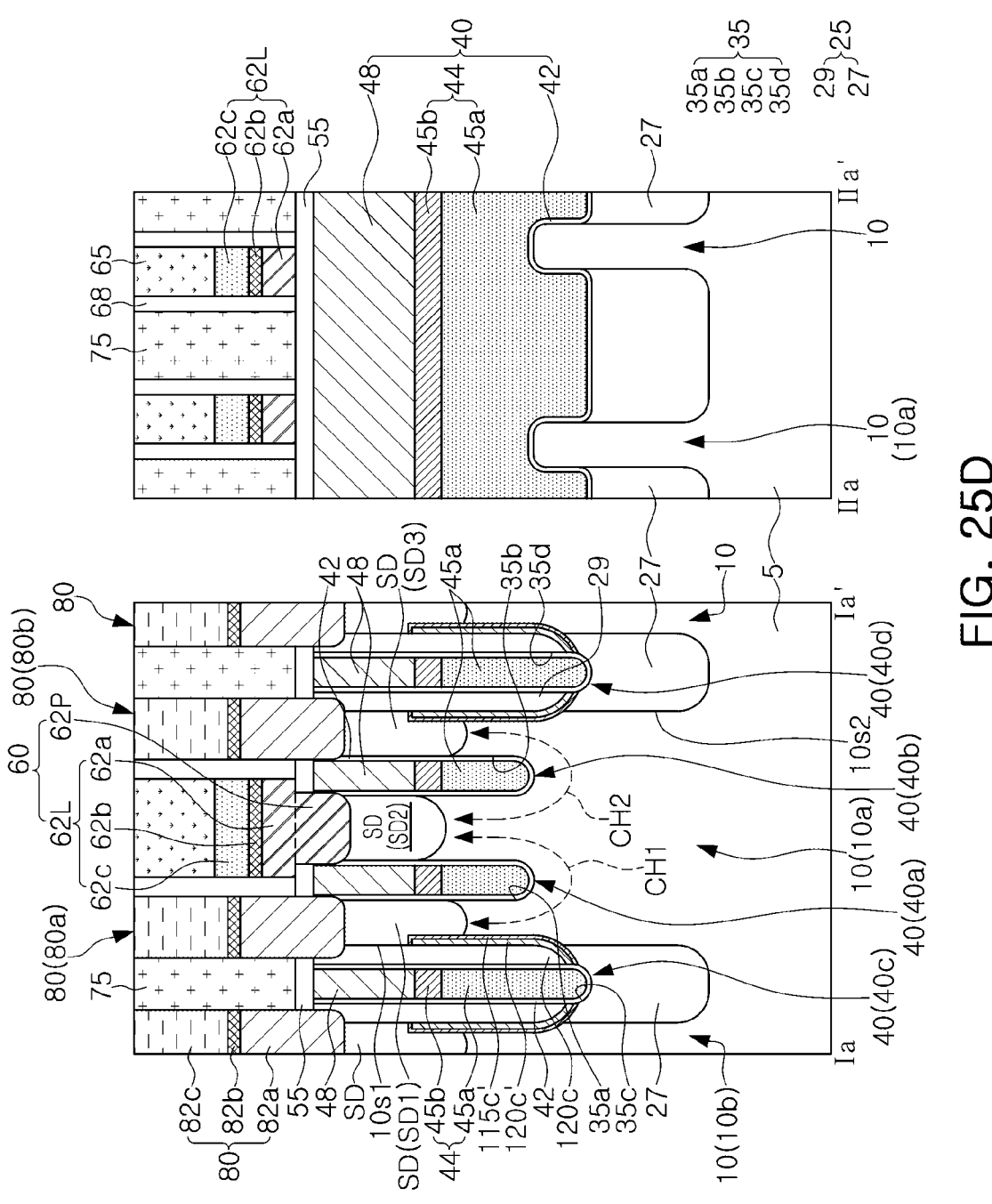

In a modified example, referring to FIGS. 1 and 25D, in a semiconductor device according to an embodiment, the buffer layer 115c and the semiconductor layer 120b in FIG. 25C may be modified into a buffer layer 115c' and a semiconductor layer 120c' embedded in the active regions 10. For example, a portion of the first source/drain region SD1 may vertically overlap an upper end of the semiconductor layer 120c' embedded in a portion of the first side surface 10s1 of the first active region 10a. In an example, the buffer layer 115c' may cover an outer surface and a lower surface of the semiconductor layer 120c' and may be interposed between the active regions 10 and the semiconductor layer 120c'. In another example, the buffer layer 115c' may be omitted.

Next, various modified examples of the semiconductor device according to an embodiment will be described with reference to FIGS. 26 to 34.

Figure 26:
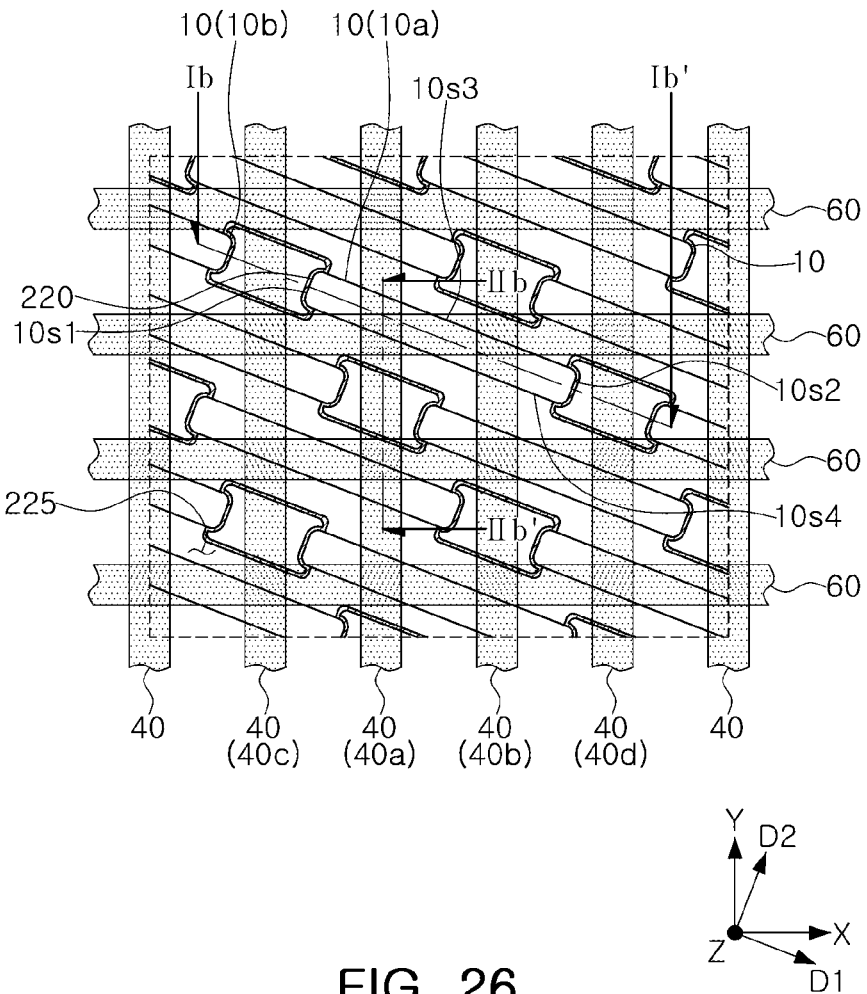
FIG. 26 is a plan view conceptually illustrating a modified example of a semiconductor device according to an embodiment.

FIG. 26 is a plan view conceptually illustrating a modified example of a semiconductor device according to an embodiment, and FIGS. 27 to 34 are cross-sectional views conceptually illustrating regions taken along lines Ib-Ib' and IIb-IIb' of FIG. 26 in order to describe various modified example of a semiconductor device according to an embodiment.

Figure 27:
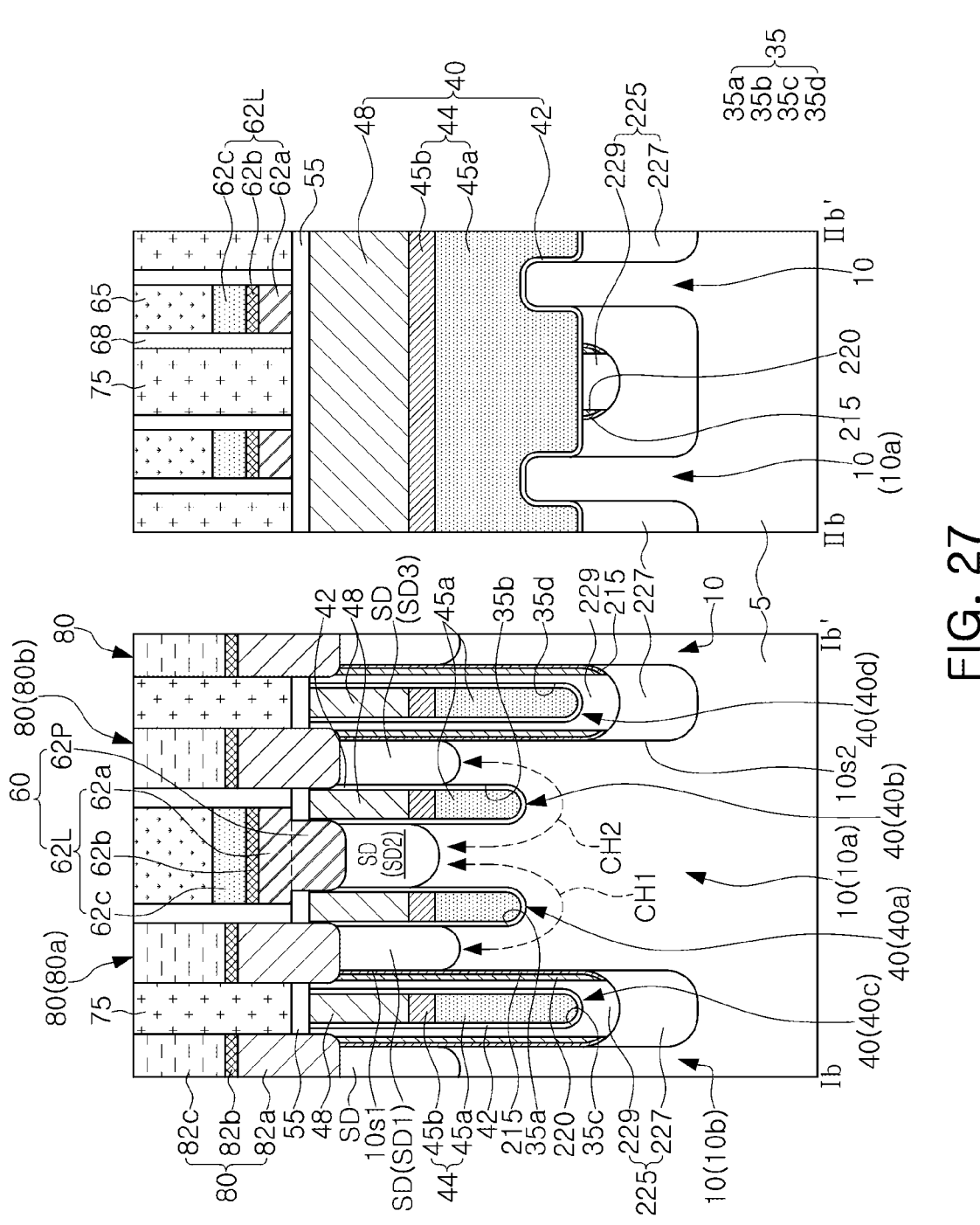
FIGS. 27 to 34 are conceptual cross-sectional views of a portion of FIG. 26 illustrating various examples of a semiconductor device according to an embodiment.

In a modified example, referring to FIGS. 26 and 27, the semiconductor layer 20 described above with reference to FIG. 1 may be modified into a semiconductor layer 220 covering side surfaces of the active regions 10 facing each other in the first oblique direction D1. For example, as illustrated in FIG. 26, one semiconductor layer 220 may have a ring shape covering both a side surface of the first active region 10a and a side surface of the second active region 10b adjacent to each other in the first oblique direction D1 and facing each other. Accordingly, one semiconductor layer 220 may have a ring shape covering opposite side surfaces of a pair of active regions 10 adjacent to each other in the first oblique direction D1.

As illustrated in FIG. 27, the semiconductor layer 220 may have a lower end positioned on a level lower than the lower ends of the gate structures 40. On a level lower than the lower ends of the gate structures 40, the semiconductor layer 220 may have a ring shape as illustrated in FIG. 26, and on a level higher than the lower ends of the gate structures 40, the semiconductor layer 220 may be separated by the outer gate structures 40c and 40d.

The semiconductor device according to the present embodiment may further include a buffer layer 215 covering an outer surface of the semiconductor layer 220. Here, the outer surface of the semiconductor layer 220 may be an outer surface in such a ring shape as illustrated in FIG. 26. In another example, the buffer layer 215 may be omitted.

The isolation layer 25 in FIG. 2 may be modified into an isolation layer 225 as shown in FIG. 27. For example, the isolation layer 225 may include a first isolation portion 227 and a second isolation portion 229 in which bottom and side surfaces are surrounded by the first isolation portion 227. The semiconductor layer 220 may be disposed to surround a side surface of the second isolation portion 229. A portion of the semiconductor layer 220 may be disposed between a side surface of the second isolation portion 229 and the first isolation portion 227.

Figure 28:
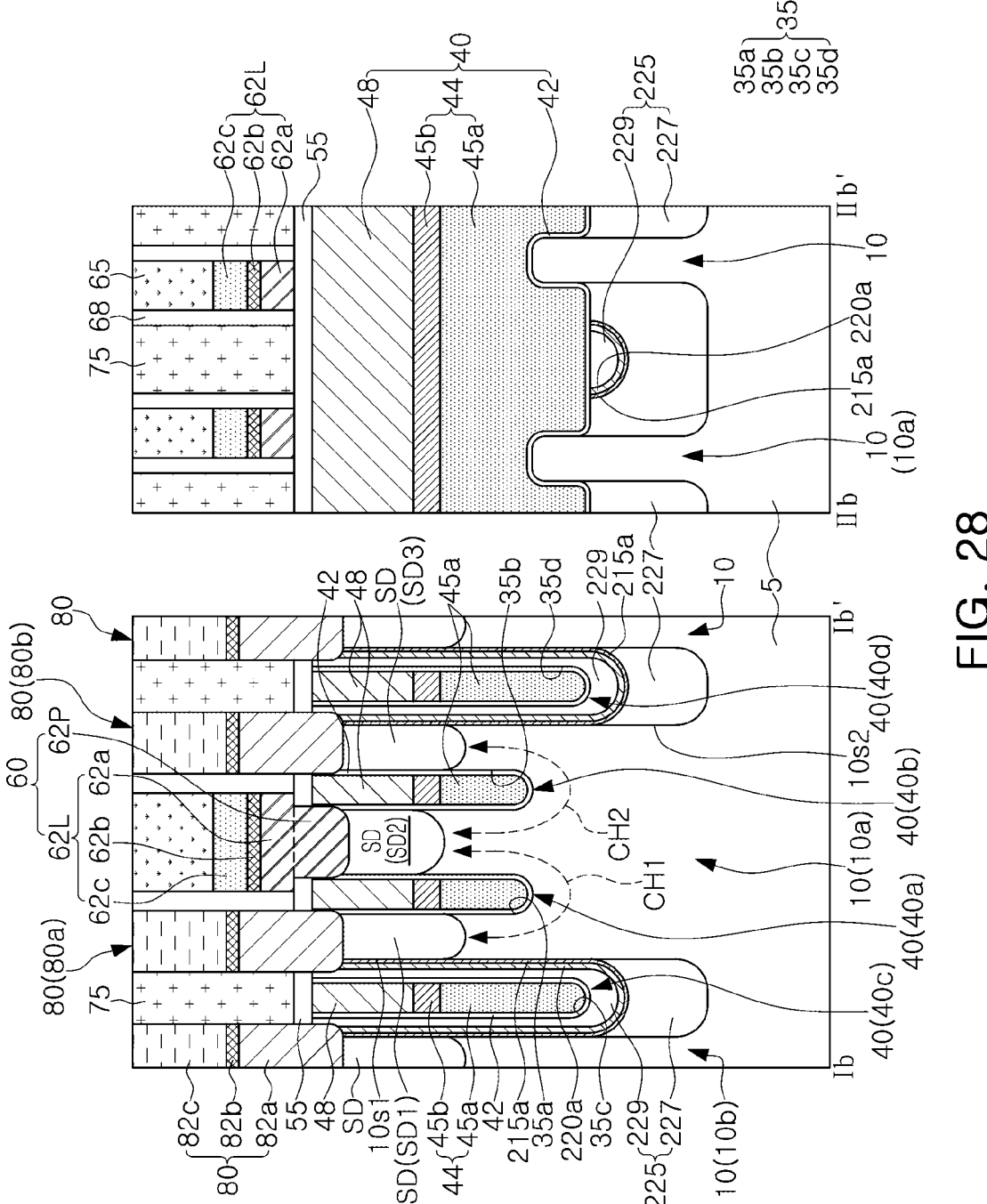

In a modified example, referring to FIGS. 26 and 28, the semiconductor layer 220 described above with reference to FIG. 27 may be modified into a semiconductor layer 220a further including a portion extending between the bottom surface of the second isolation portion 229 and an upper surface of the first isolation portion 227.

In an example, the buffer layer 215 described above with reference to FIG. 27 may be modified into a buffer layer 215a extending to cover a lower surface of the semiconductor layer 220a. In another example, the buffer layer 215a may be omitted.

Figure 29:
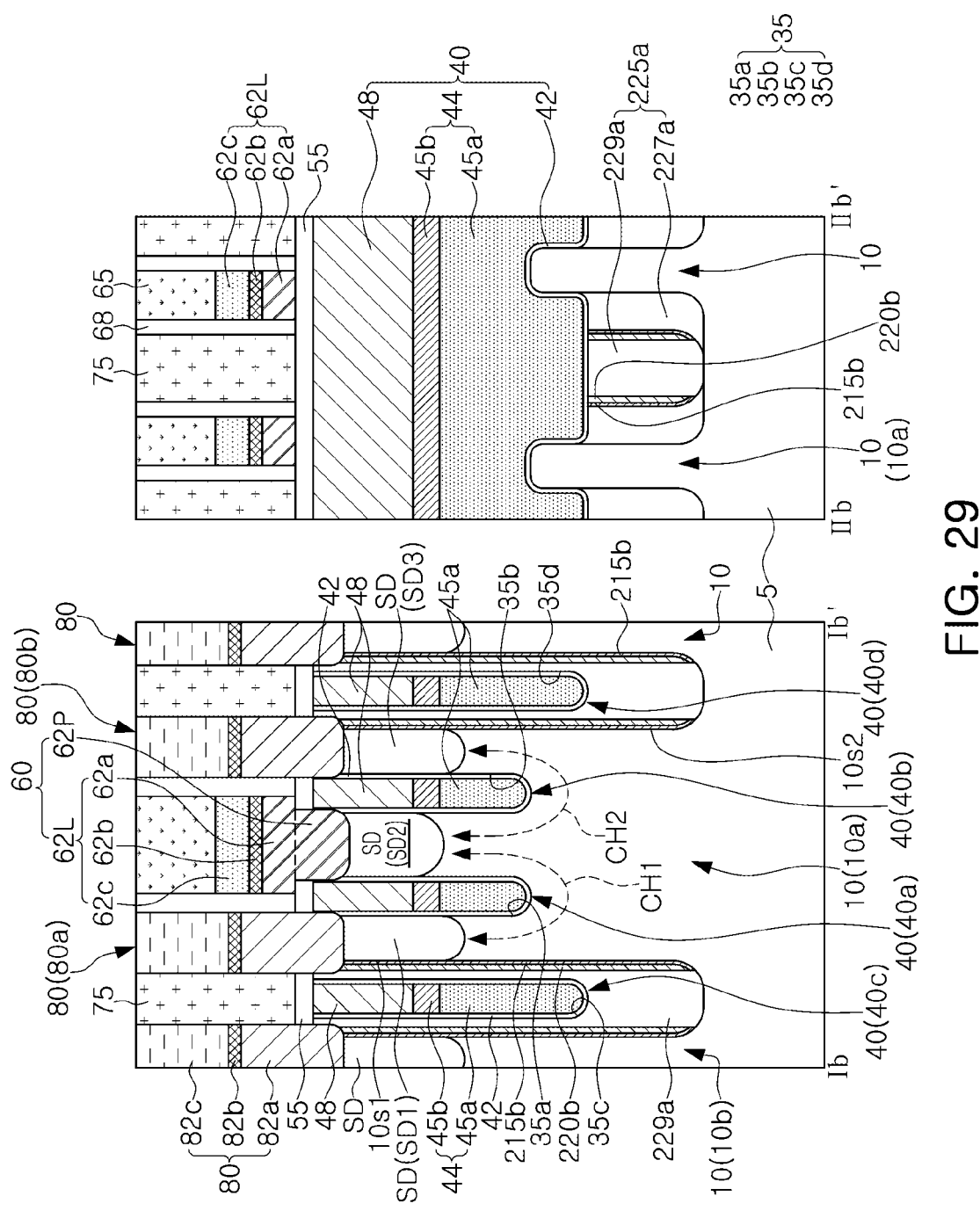

In a modified example, referring to FIGS. 26 and 29, the isolation layer 225 described above with reference to FIG. 27 may be modified into an isolation layer 225a as illustrated in FIG. 29. For example, the isolation layer 225a may include a first isolation portion 227a and a second isolation portion 229a vertically penetrating through the first isolation portion 227a.

The semiconductor layer 220 described above with reference to FIG. 27 may be modified into a semiconductor layer 220b extending from an upper region to a lower region of each of the side surfaces of the active regions 10. The semiconductor layer 220b may be disposed to surround a side surface of the second isolation portion 227b.

In an example, the buffer layer 215 described above with reference to FIG. 27 may be modified into a buffer layer 215*b* covering the entire outer surface of the semiconductor layer 220*b*. In another example, the buffer layer 215*b* may be omitted.

Figure 30:
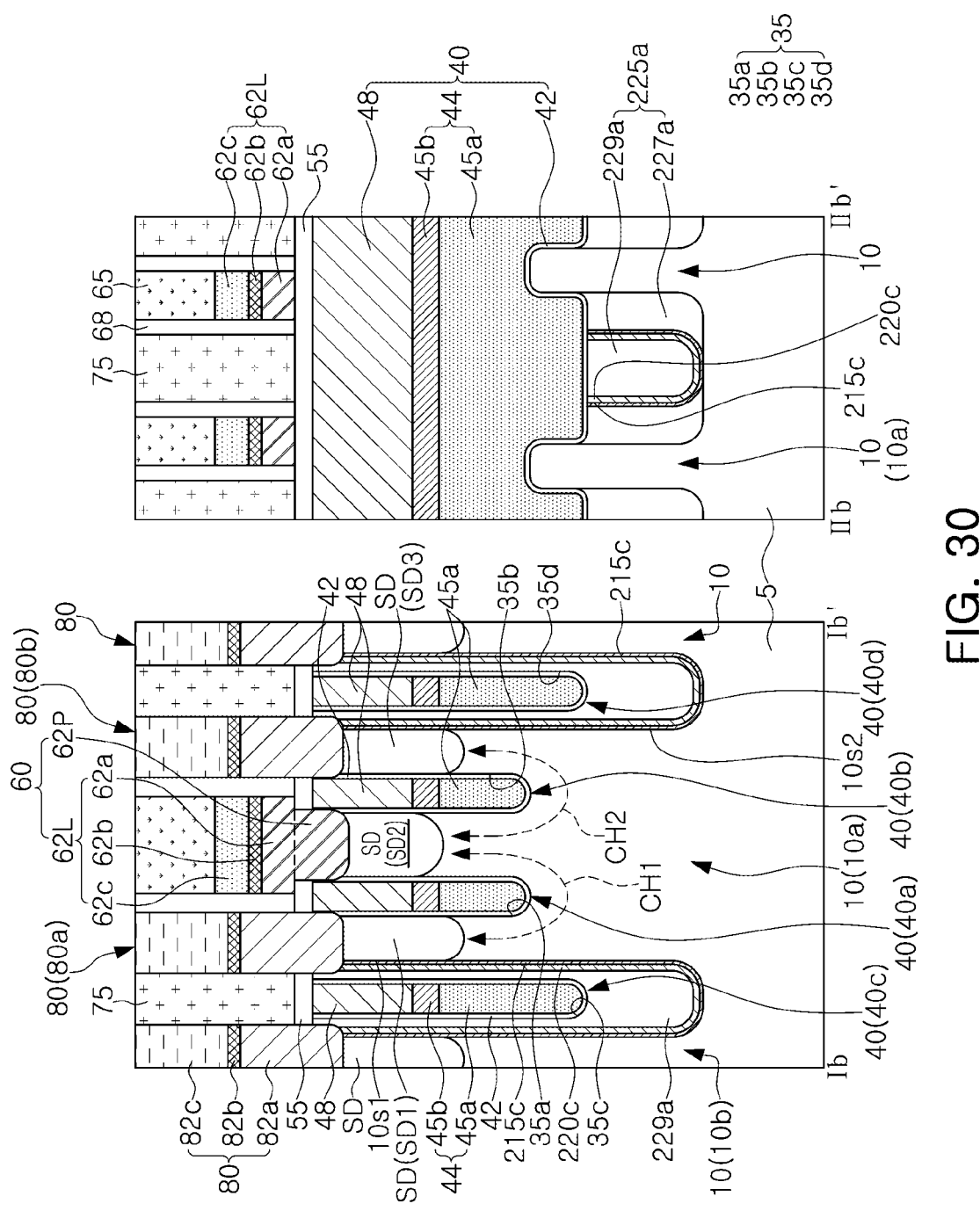

In a modified example, referring to FIGS. 26 and 30, the semiconductor layer 220*b* described above with reference to FIG. 29 may be modified into a semiconductor layer 220*c* further including a portion extending between a bottom surface of the second isolation portion 229 and the semiconductor substrate 5.

In an example, the buffer layer 215*b* described above with reference to FIG. 29 may be modified into a buffer layer 215*c* extending to cover a lower surface of the semiconductor layer 220*c*. In another example, the buffer layer 215*c* may be omitted.

Figure 31:
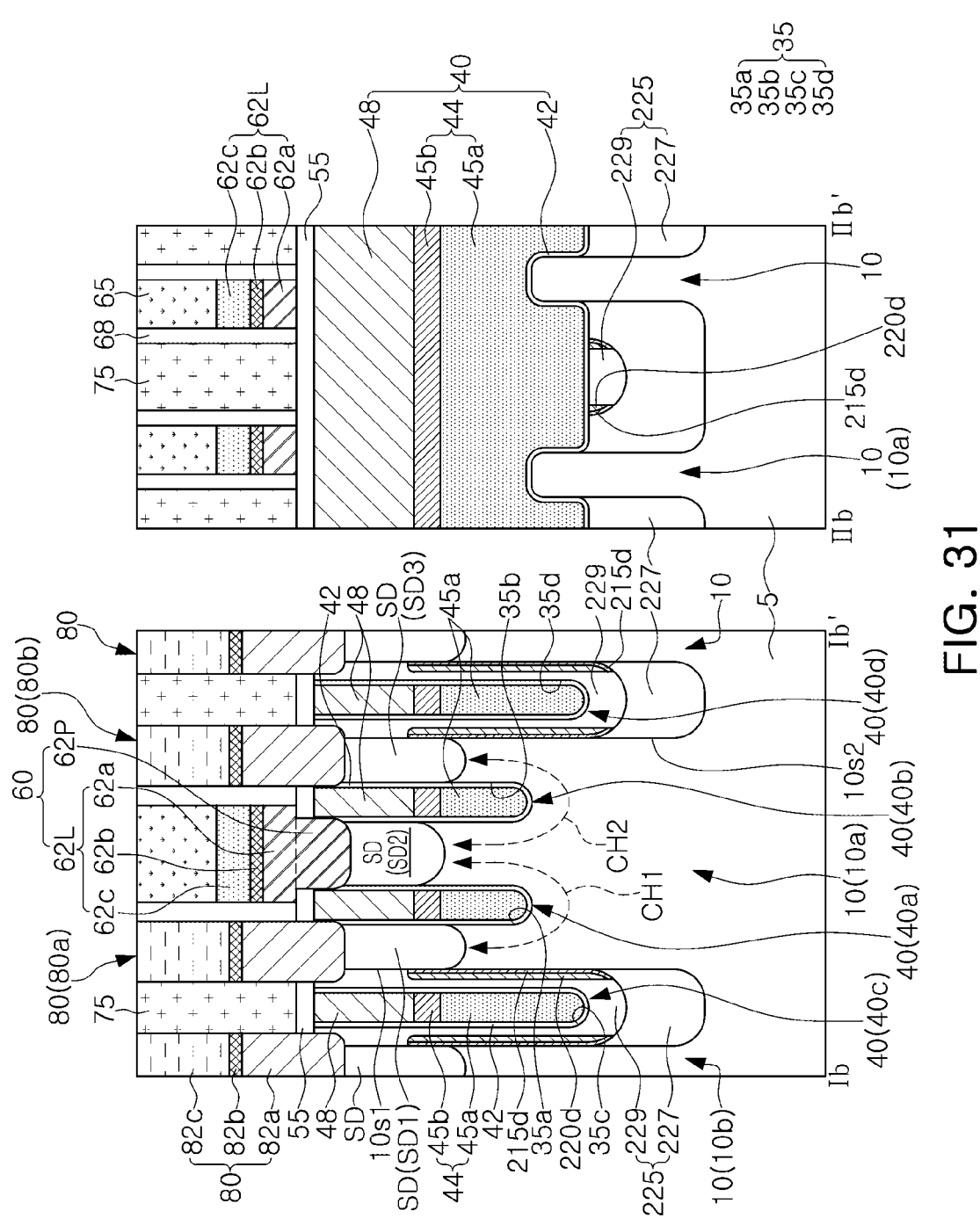

In a modified example, referring to FIGS. 26 and 31, the semiconductor layer 220 described above with reference to FIG. 27 may be modified into a semiconductor layer 220*d* having an upper end lowered in height, like the semiconductor layer in FIG. 10 (20*d* of FIG. 10).

In an example, the buffer layer 215 described above with reference to FIG. 27 may be modified into a buffer layer 215*d* covering an outer surface of the semiconductor layer 220*d*. In another example, the buffer layer 215*d* may be omitted.

Figure 32:
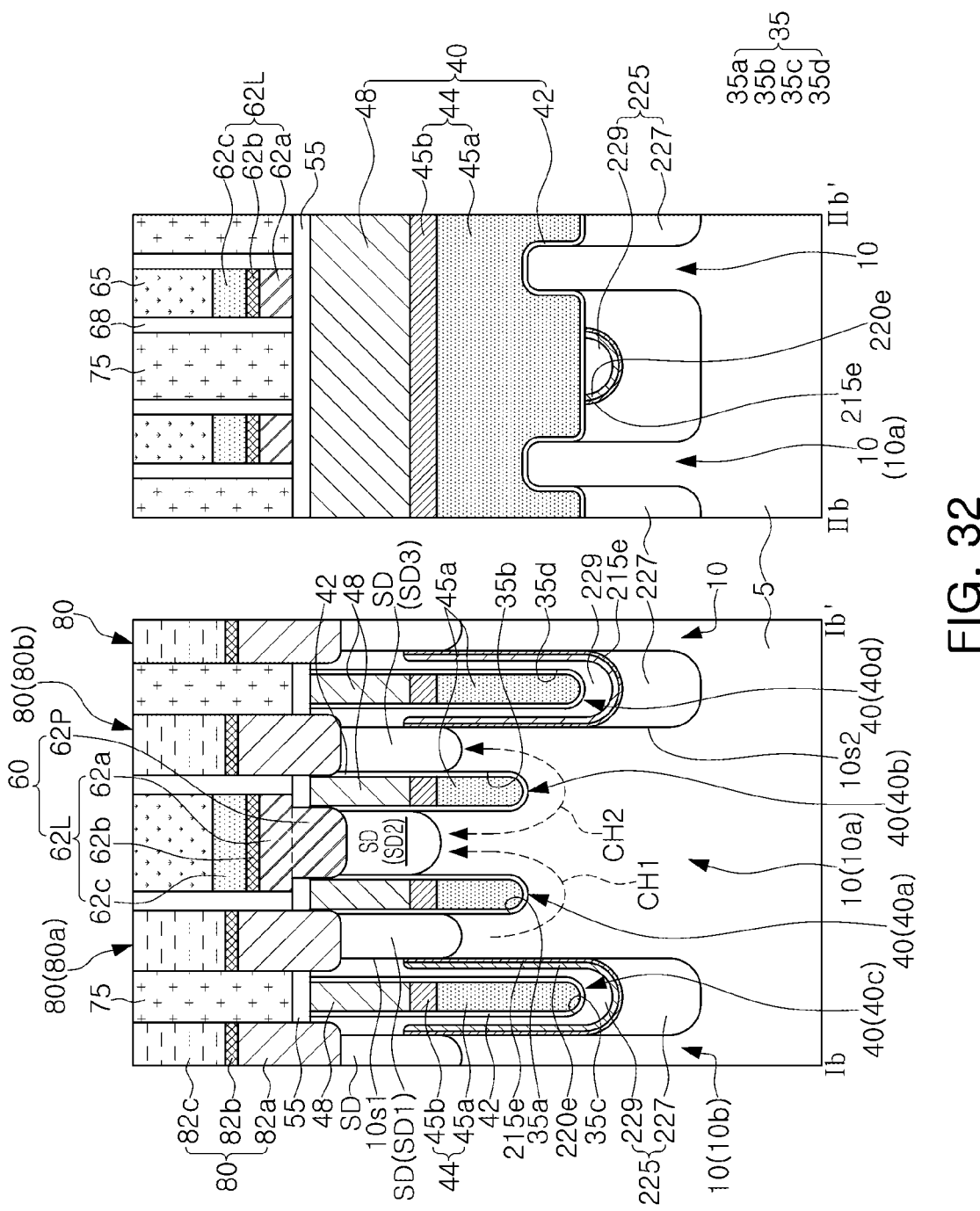

In a modified example, referring to FIGS. 26 and 32, the semiconductor layer 220*a* described above with reference to FIG. 28 may be modified into a semiconductor layer 220*e* having an upper end lowered in height, like the semiconductor layer in FIG. 10 (20*d* of FIG. 10).

In an example, the buffer layer 215*a* described above with reference to FIG. 28 may be modified into a buffer layer 215*e* covering an outer surface of the semiconductor layer 220*e*. In another example, the buffer layer 215*e* may be omitted.

Figure 33:
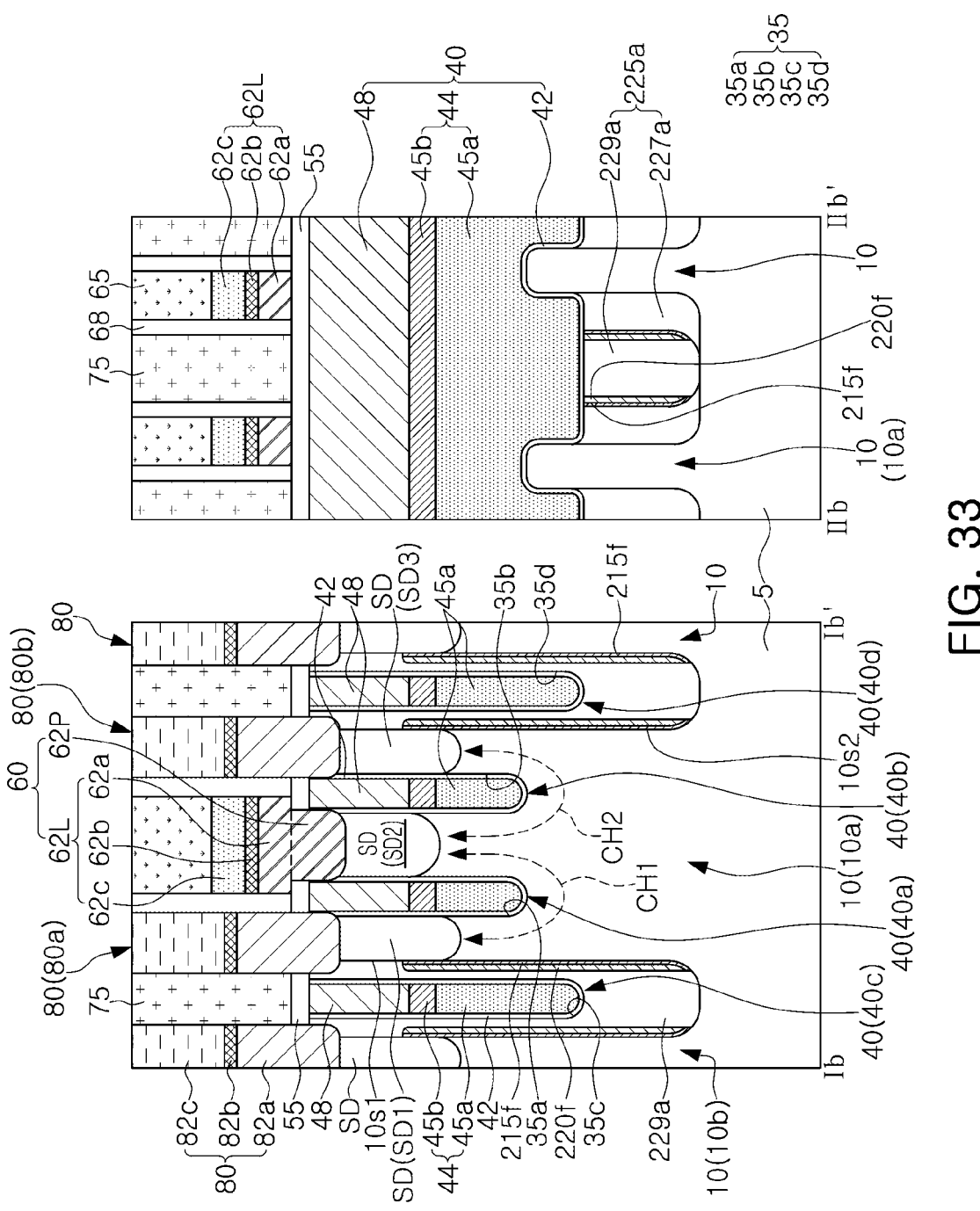

In a modified example, referring to FIGS. 26 and 33, the semiconductor layer 220*b* described above with reference to FIG. 29 may be modified into a semiconductor layer 220*f* having an upper end lowered in height, like the semiconductor layer in FIG. 10 (20*d* of FIG. 10).

In an example, the buffer layer 215*b* described above with reference to FIG. 29 may be modified into a buffer layer 215*f* covering an outer surface of the semiconductor layer 220*f*. In another example, the buffer layer 215*f* may be omitted.

Figure 34:
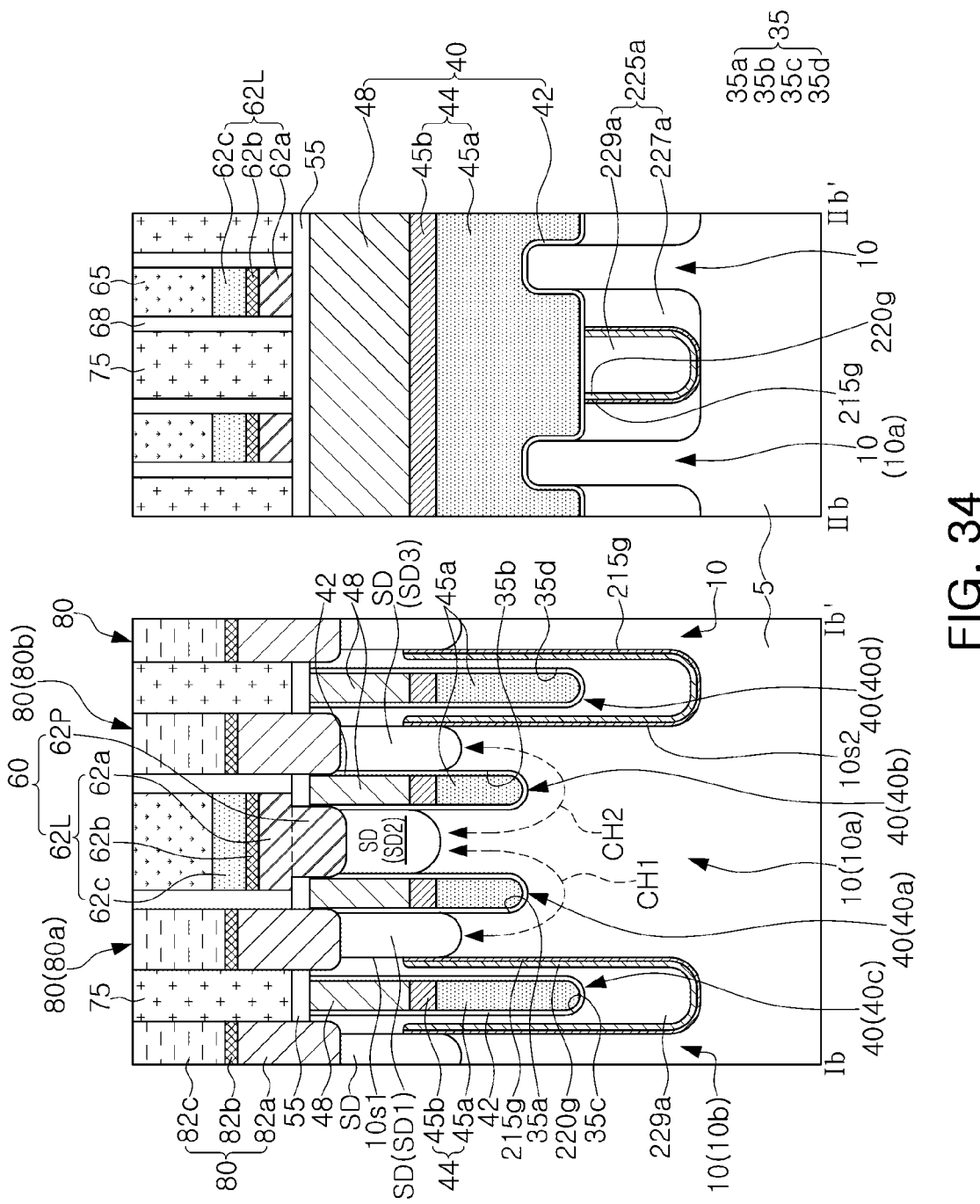

In a modified example, referring to FIGS. 26 and 34, the semiconductor layer 220*c* described above with reference to FIG. 30 may be modified into a semiconductor layer 220*g* having an upper end lowered in height, like the semiconductor layer in FIG. 10 (20*d* of FIG. 10).

In an example, the buffer layer 215*c* described above with reference to FIG. 30 may be modified into a buffer layer 215*g* covering an outer surface of the semiconductor layer 220*g*. In another example, the buffer layer 215*g* may be omitted.

Next, various modified examples of a semiconductor device according to an embodiment will be described with reference to FIGS. 35 to 40.

Figure 35:
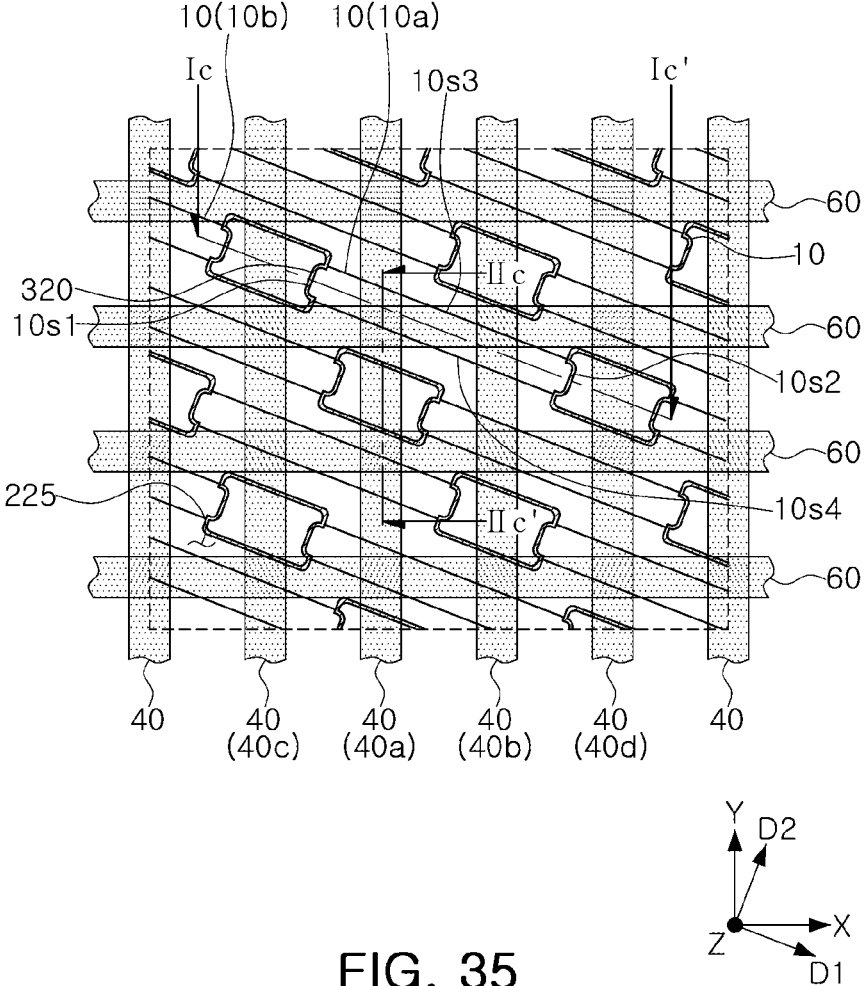
FIG. 35 is a plan view conceptually illustrating a modified example of a semiconductor device according to an embodiment.
Figure 36:
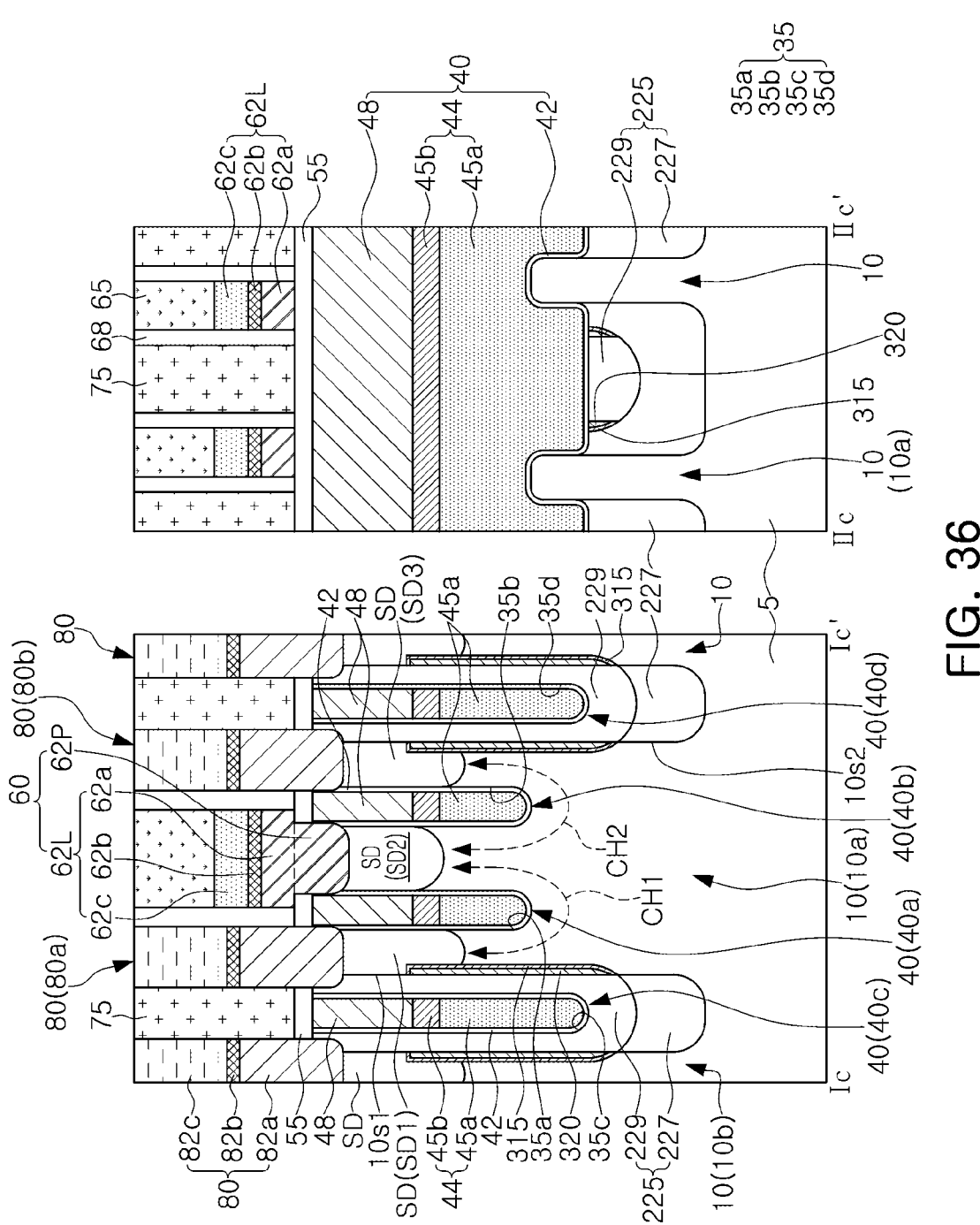
FIGS. 36 to 39 are conceptual cross-sectional views of a portion of FIG. 35 illustrating various examples of a semiconductor device according to an embodiment.

FIG. 35 is a plan view conceptually illustrating a modified example of a semiconductor device according to an embodiment, and FIGS. 36 to 40 are cross-sectional views conceptually illustrating regions taken along lines Ic-Ic' and IIc-IIc' of FIG. 36 in order to illustrate various modified examples of a semiconductor device according to an embodiment.

In a modified example, referring to FIGS. 35 and 36, the buffer layer 215*d* and the semiconductor layer 220*d* described above with reference to FIG. 31 may be modified into a buffer layer 315 and a semiconductor layer 320, respectively. For example, a portion of the first source/drain region SD1 may vertically overlap an upper end of the semiconductor layer 320 embedded in a portion of the first side surface 10*s*1 of the first active region 10*a*.

In an example, the buffer layer 315 may cover an outer surface of the semiconductor layer 320 and may be interposed between the active regions 10 and the semiconductor layer 320. In another example, the buffer layer 315 may be omitted.

Figure 37:
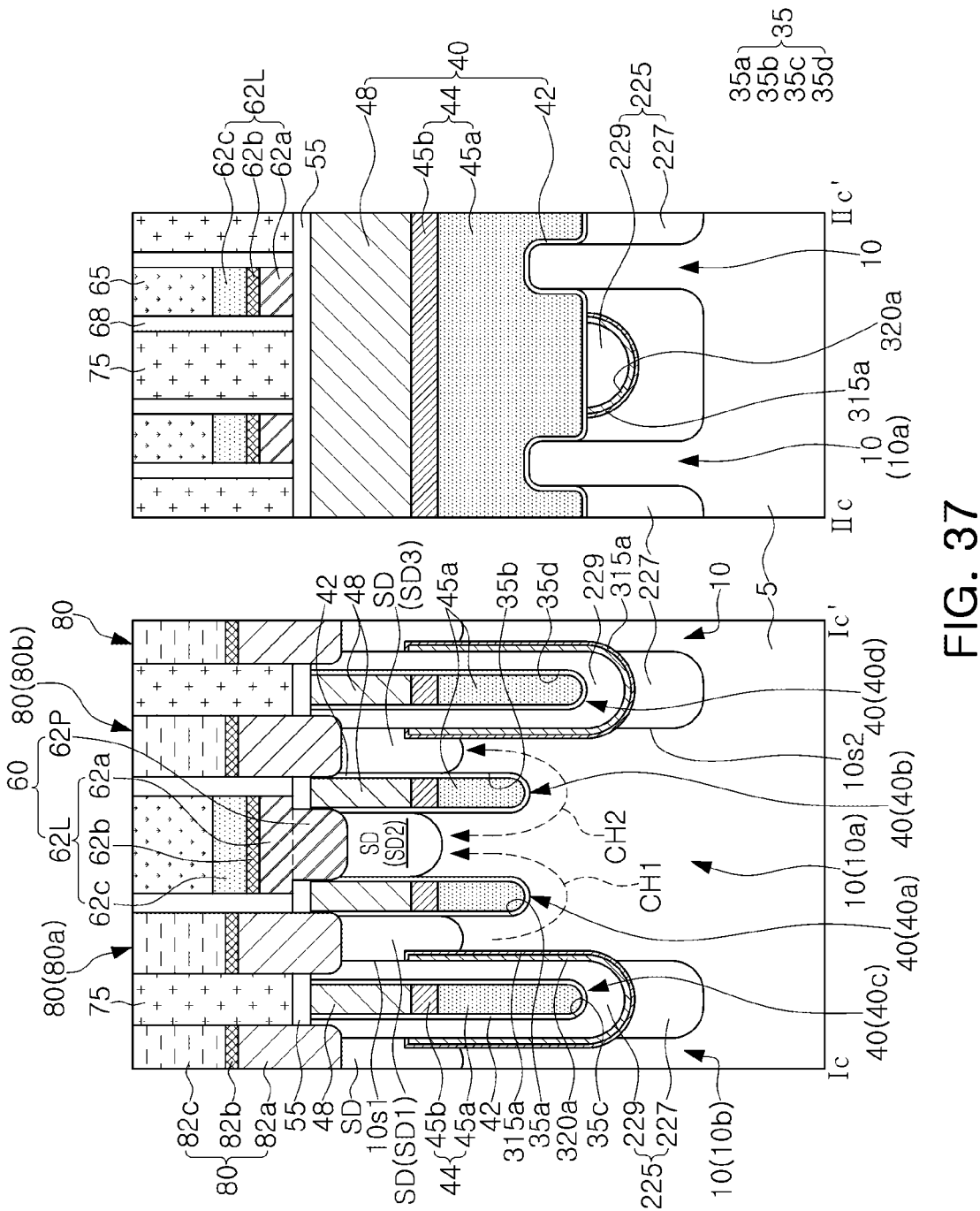

In a modified example, referring to FIGS. 35 and 37, the buffer layer 215*e* and the semiconductor layer 220*e* described above with reference to FIG. 32 may be modified into a buffer layer 315*a* and a semiconductor layer 320*a* embedded in the active regions 10, respectively. For example, a portion of the first source/drain region SD1 may vertically overlap an upper end of the semiconductor layer 320*a* embedded in a portion of the first side surface 10*s*1 of the first active region 10*a*.

In an example, the buffer layer 315*a* may cover an outer surface of the semiconductor layer 320*a*, may be interposed between the active regions 10 and the semiconductor layer 320*a*, and may cover a lower surface of the semiconductor layer 320*a*. In another example, the buffer layer 315*a* may be omitted.

Figure 38:
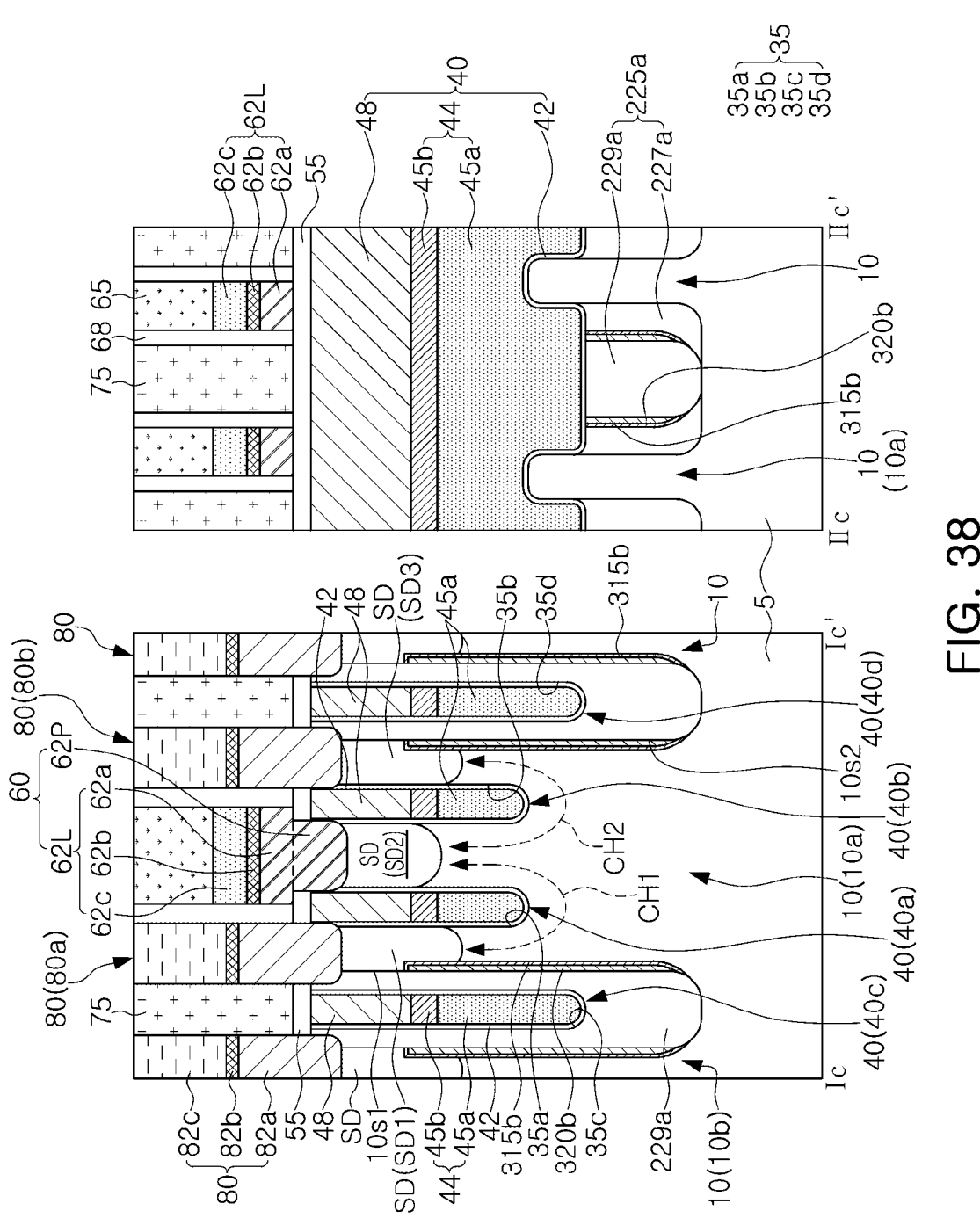

In a modified example, referring to FIGS. 35 and 38, the buffer layer 215*f* and the semiconductor layer 220*f* described above with reference to FIG. 33 may be modified into a buffer layer 315*b* and a semiconductor layer 320*b* embedded in the active regions 10, respectively. For example, a portion of the first source/drain region SD1 may vertically overlap an upper end of the semiconductor layer 320*b* embedded in a portion of the first side surface 10*s*1 of the first active region 10*a*.

In an example, the buffer layer 315*b* may cover an outer surface of the semiconductor layer 320*b* and may be interposed between the active regions 10 and the semiconductor layer 320*b*. In another example, the buffer layer 315*b* may be omitted.

Figure 39:
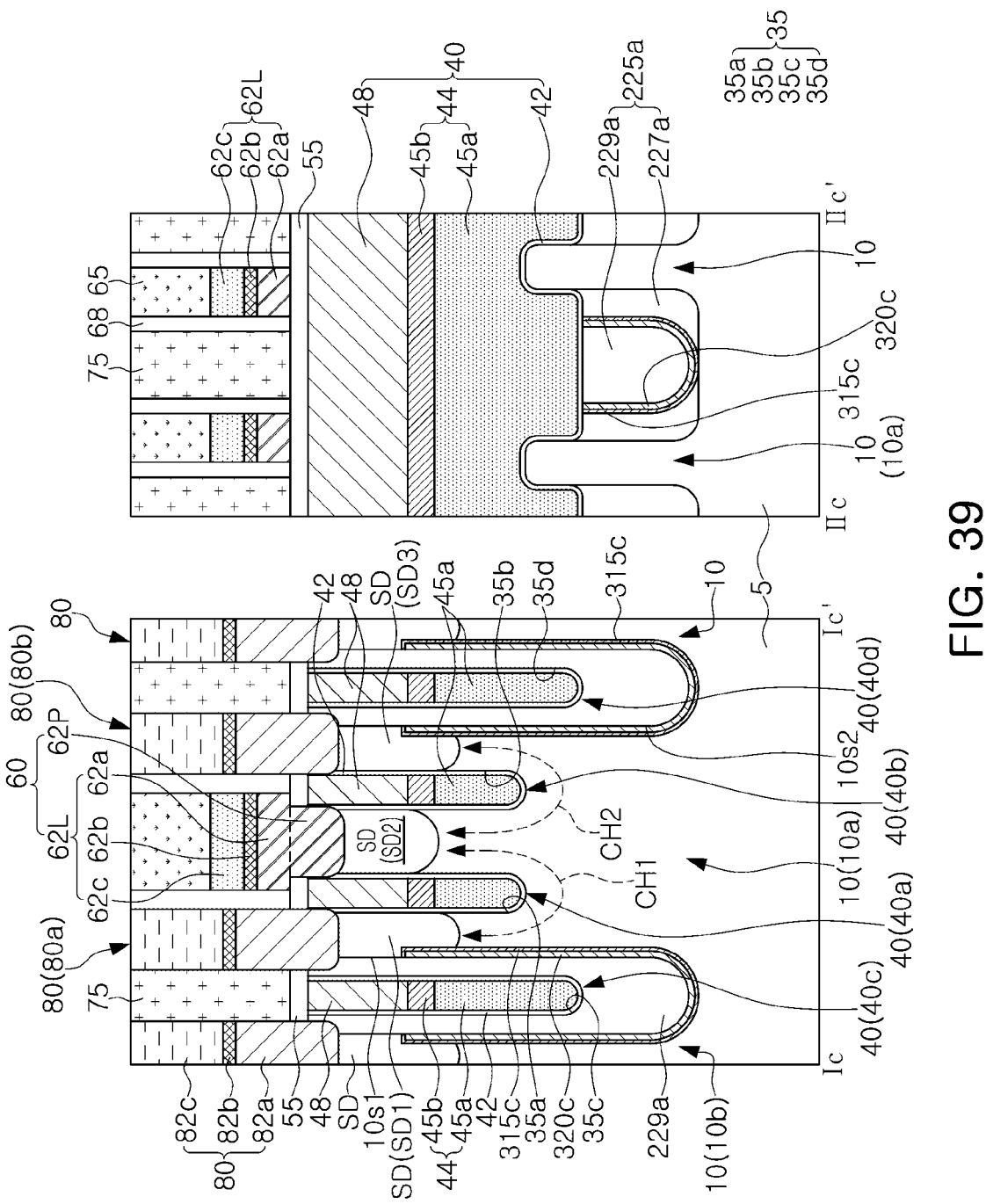

In a modified example, referring to FIGS. 35 and 39, the buffer layer 215*g* and the semiconductor layer 220*g* described above with reference to FIG. 34 may be modified into a buffer layer 315*c* and a semiconductor layer 320*c* embedded in the active regions 10. For example, a portion of the first source/drain region SD1 may vertically overlap an upper end of the semiconductor layer 320*c* embedded in a portion of the first side surface 10*s*1 of the first active region 10*a*.

In an example, the buffer layer 315*c* may cover an outer surface of the semiconductor layer 320*c*, may be interposed between the active regions 10 and the semiconductor layer 320*c*, and may cover a lower surface of the semiconductor layer 320*c*. In another example, the buffer layer 315*c* may be omitted.

Next, planar shapes of the aforementioned semiconductor layers 20, 120, 220, and 320 as in FIGS. 1, 18, 26 and 35 may be variously modified. Hereinafter, variously modified planar shapes of the semiconductor layers 20, 120, 220, and 320 will be described with reference to FIGS. 40, 41, 42 and 43, respectively.

Figure 40:
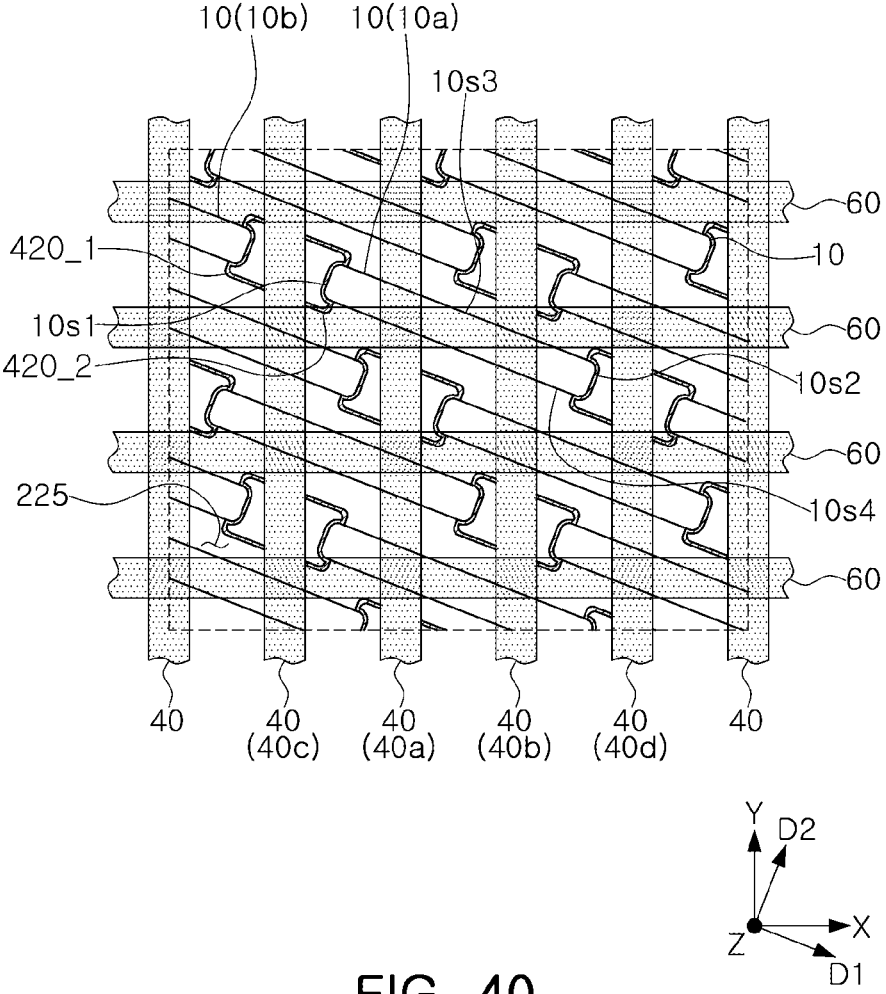
FIG. 40 is a plan view conceptually illustrating a modified example of a semiconductor device according to an embodiment.

In a modified example, referring to FIG. 40, the ring-shaped semiconductor layer 220 described above with reference to FIG. 26 may be modified into a semiconductor layer 420 including semiconductor portions 420_1 and 420_2 separated from each other in the first oblique direction D2 by the gate structure passing through between the active regions 10 adjacent to each other in the first oblique direction D1, among the gate structures. The semiconductor layer 420 may have lower ends positioned at the same height as the lower ends of the semiconductor layers 120, 120a, 120b, and 120c described above with reference to FIGS. 19 to 25D. Accordingly, a semiconductor device including the semiconductor layer 420 may have substantially the same cross-sectional structure of regions taken along lines Ia-Ia' and IIa-IIa' of FIGS. 19 to 25D. Accordingly, the semiconductor layer 420 may have substantially the same shape as those of the semiconductor layers 120, 120a, 120b, and 120c described above with reference to FIGS. 19 to 25D.

Figure 41:
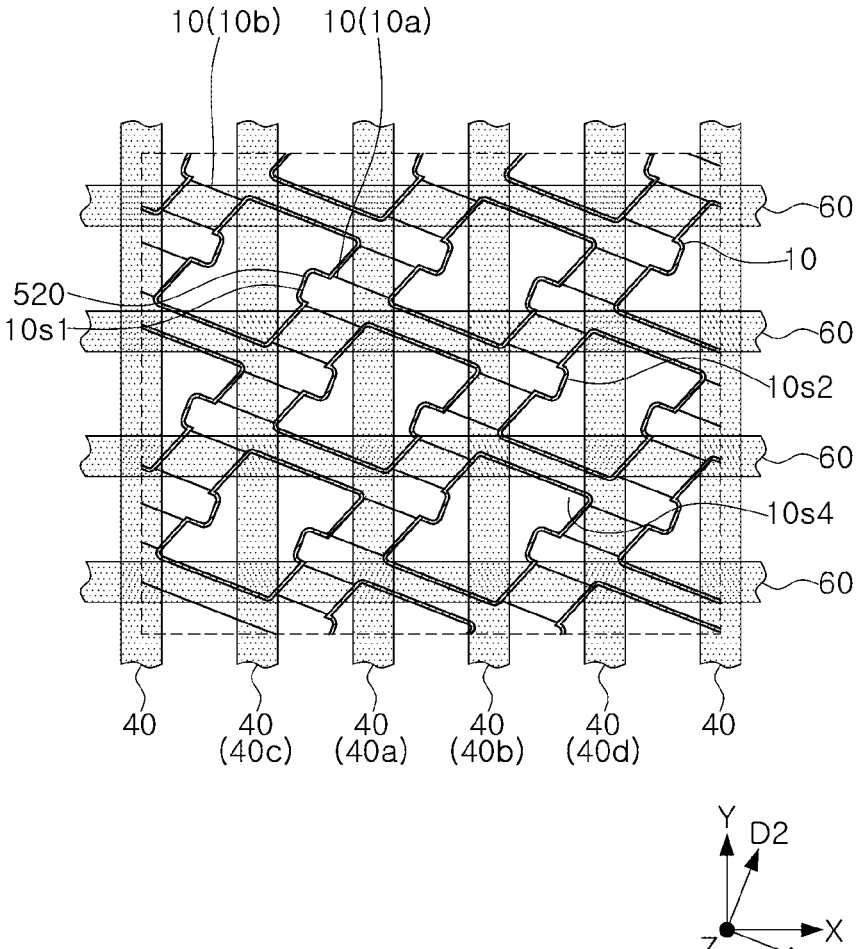
FIG. 41 is a plan view conceptually illustrating a modified example of a semiconductor device according to an embodiment.

In a modified example, referring to FIG. 41, one semiconductor layer 320 described above with reference to FIG. 35 may be modified into a semiconductor layer 520 having a closed-curve shape in contact with the active regions 10 adjacent to each other in the first oblique direction D1 and in contact with the active regions 10 adjacent to each other in the second oblique direction D2. When the buffer layer 315 as described above with reference to FIG. 36 is disposed, the buffer layer (315 of FIG. 36) may cover at least an outer surface of the semiconductor layer 520, and the semiconductor layer 520 may be disposed between the active regions 10.

Figure 42:
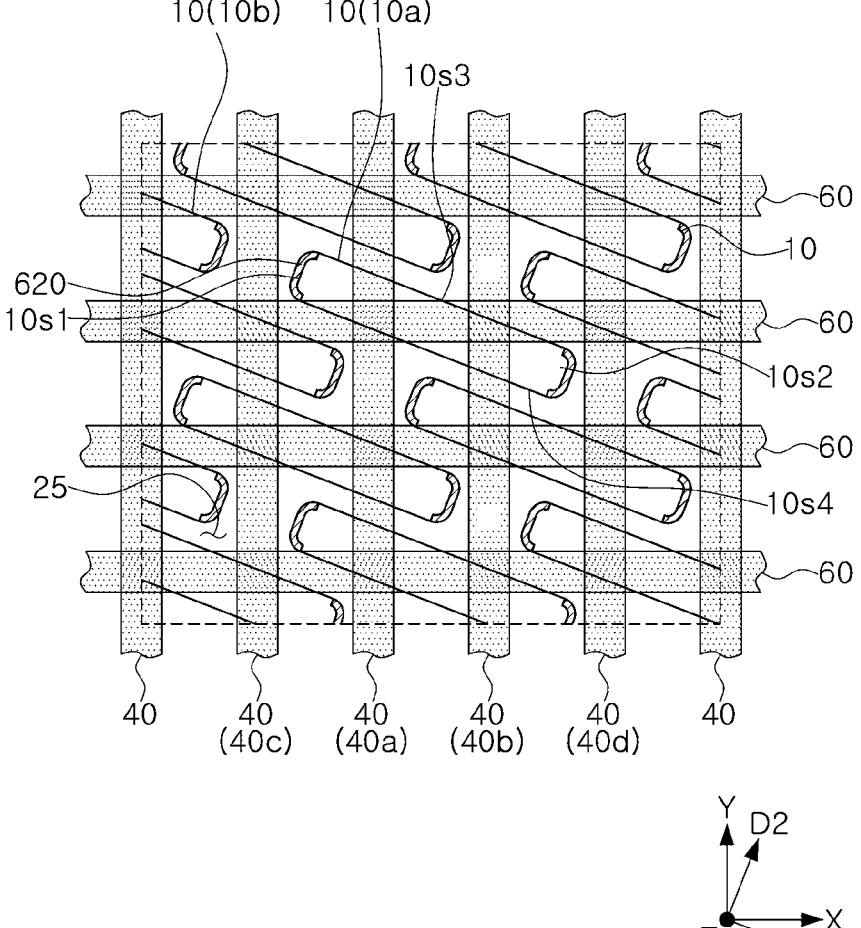
FIG. 42 is a plan view conceptually illustrating a modified example of a semiconductor device according to an embodiment.

In a modified example, referring to FIG. 42, the semiconductor layer 320 described above with reference to FIG. 35 may be modified into semiconductor layers 620 disposed at opposite ends of the active regions 10 adjacent to each other in the first oblique direction D1 and spaced apart from each other.

Figure 43:
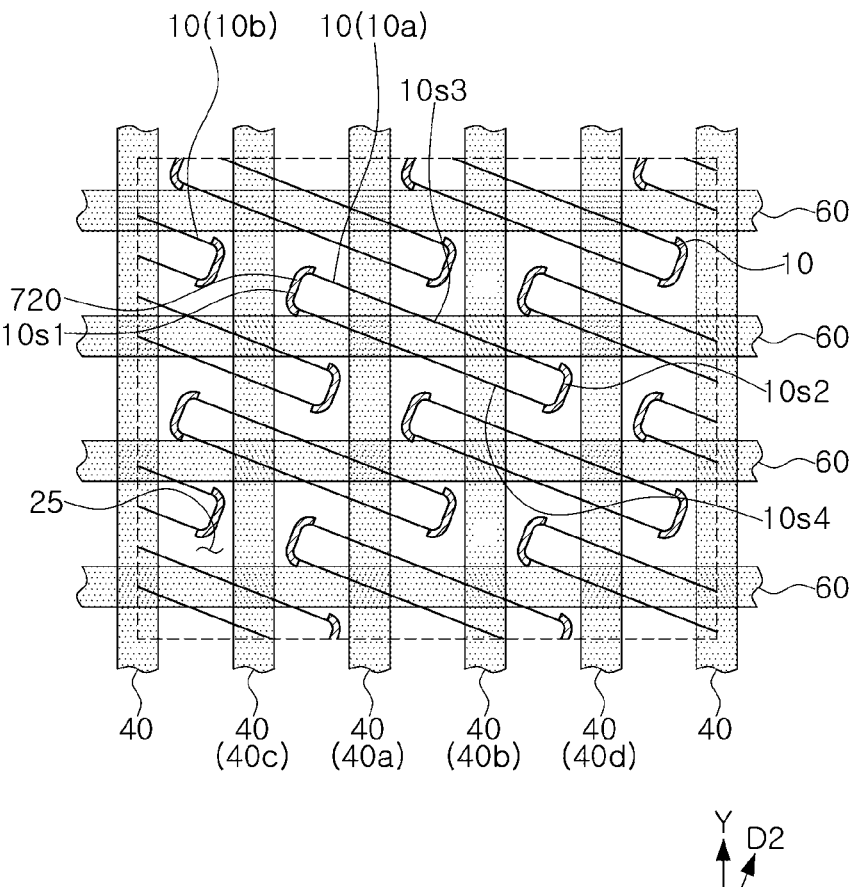
FIG. 43 is a plan view conceptually illustrating a modified example of a semiconductor device according to an embodiment.

In a modified example, referring to FIG. 43, the semiconductor layer 320 described above with reference to FIG. 42 may be modified into semiconductor layers 720 disposed at opposite ends of the active regions 10 adjacent to each other in the first oblique direction D1, spaced apart from each other, and protruding from the active regions 10.

Figure 44:
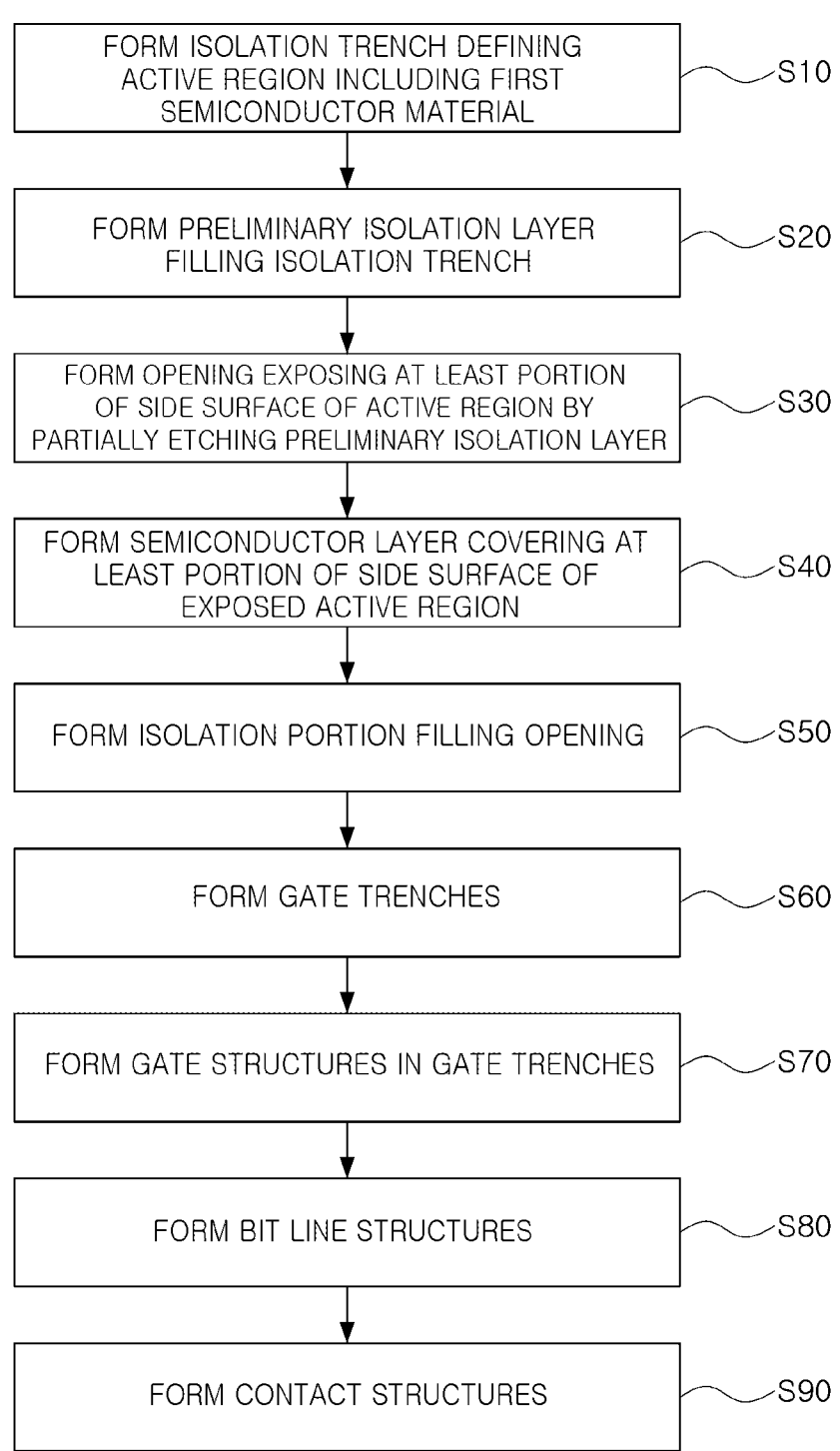
FIG. 44 is a flowchart conceptually illustrating an example of a method of forming a semiconductor device according to embodiments.

Next, an example of a method of forming a semiconductor device according to embodiments will be described with reference to FIG. 44 along with FIGS. 1 and 2. FIG. 44 is a process flowchart of a method of forming a semiconductor device according to embodiments.

Referring to FIGS. 1, 2, and 44, an isolation trench defining the active region 10 including a first semiconductor material may be formed (S10). A preliminary isolation layer filling the isolation trench may be formed (S20). The preliminary isolation layer may be partially etched to form an opening exposing at least a portion of a side surface of the active region 10 (S30). Here, the partially etched preliminary isolation layer may be the first isolation portion 27 described above with reference to FIG. 2. A shape and depth of the opening may be variously modified.

The semiconductor layer 20 including a second semiconductor material may be formed to cover at least a portion of a side surface of the exposed active region 10 (S40).

In another example, the method may further include forming the buffer layer 15 as described above with reference to FIG. 6, before forming the semiconductor layer 20.

An isolation portion filling the opening may be formed (S50). The isolation portion may be the second isolation portion 29 described above with reference to FIG. 2. Accordingly, the isolation layer 25 including the first and second isolation portions 27 and 29 may be formed.

The gate trenches 35, as illustrated in FIG. 2, may be formed (S60). The gate structures 40, as illustrated in FIG. 2, may be formed in the gate trenches 35 (S70). The bit line structures 60 may be formed (S80). Contact structures may be formed (S90). The contact structures may be the contact plugs 80 described above with reference to FIG. 2.

Figure 45:
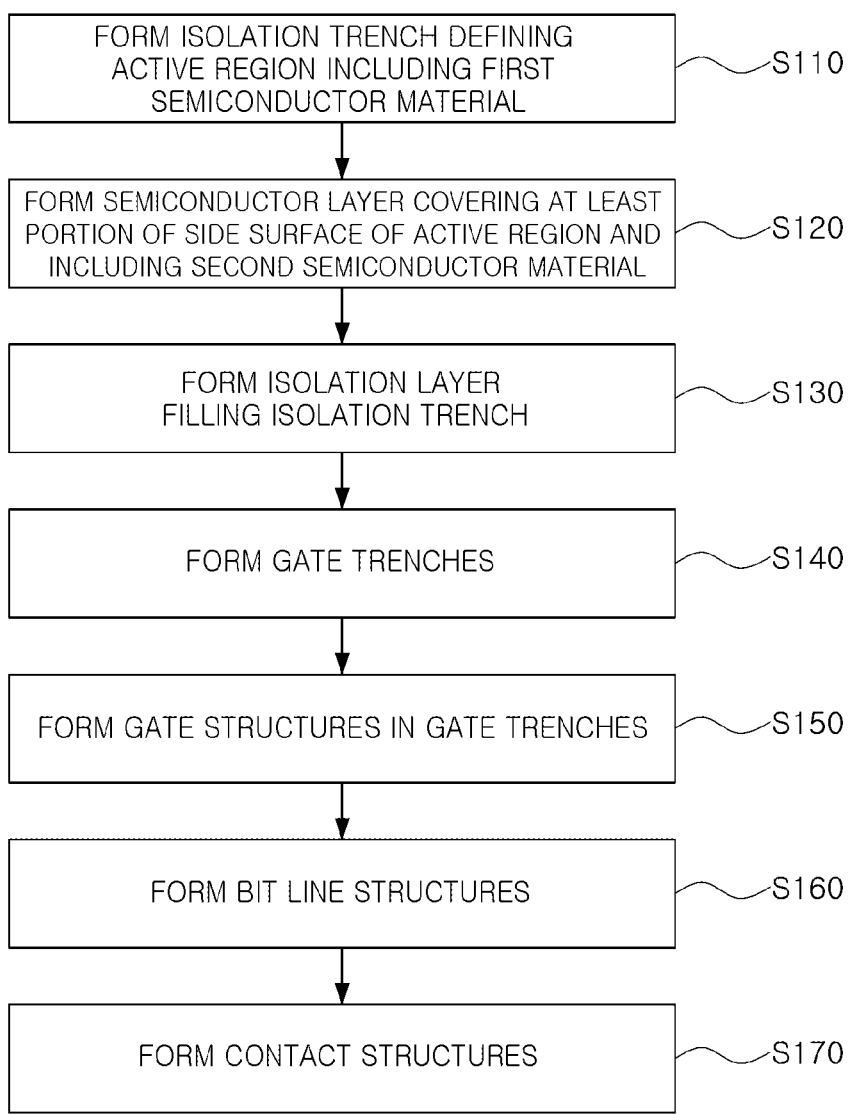
FIG. 45 is a flowchart conceptually illustrating a modified example of a method of forming a semiconductor device according to embodiments.

Next, a modified example of the method of forming a semiconductor device according to embodiments will be described above with reference to FIG. 45 along with FIGS. 1 and 4. FIG. 45 is a process flowchart of a modified method of forming a semiconductor device according to embodiments.

Referring to FIGS. 1, 4, and 45, an isolation trench defining the active region 10 including a first semiconductor material may be formed (S110). A semiconductor layer 20b including a second semiconductor material may be formed to cover at least a portion of a side surface of the active region 10 (S120).

In an example, the semiconductor layer 20b may cover a side surface of the active region 10 as illustrated in FIG. 4. In another example, as illustrated in FIG. 5, the semiconductor layer 20b may be replaced with a semiconductor layer 20c covering the entire inner wall of the isolation trench, e.g., a side surface of the active region 10 and an upper surface of the semiconductor substrate 5.

An isolation layer 25a filling the isolation trench may be formed (S130). The gate trenches 35, as illustrated in FIG. 2, may be formed (S140). The gate structures 40, as illustrated in FIG. 2, may be formed in the gate trenches 35 (S150). The bit line structures 60 may be formed (S160). Contact structures may be formed (S170). The contact structures may be the contact plugs 80 of FIG. 4.

By way of summation and review, an aspect of embodiments provides a semiconductor device having improved performance. That is, according to embodiments, by providing a semiconductor layer formed of a second semiconductor material different from the first semiconductor material of the active region, between the active region and the passing gate structure, a leakage current in the active region occurring due to repeated ON/OFF operation of the passing gate structure adjacent to the active region may be prevented or minimized. For example, when the passing gate structure is turned on, the semiconductor layer may serve to prevent or minimize trapping of charges, e.g., electrons, on the side surface of the active region adjacent to the passing gate structure. Accordingly, when the semiconductor device is a DRAM, the semiconductor layer may prevent defects caused by the electrons trapped on the side surface of the active region due to repeated ON/OFF operations of the passing gate structure. Accordingly, the semiconductor layer may improve the performance of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate;
an active region on the semiconductor substrate, the active region including a first semiconductor material;
an isolation layer on the semiconductor substrate, the isolation layer being on a side surface of the active region;
a first gate structure in a first gate trench crossing the active region;

a second gate structure in a second gate trench in the isolation layer, the second gate structure being parallel to the first gate structure and adjacent to the active region;

a semiconductor layer covering at least a portion of the side surface of the active region, the semiconductor layer including a second semiconductor material different from the first semiconductor material, and at least a portion of the semiconductor layer being between the active region and the second gate structure; and a first source/drain region and a second source/drain region in the active region on opposite sides of the first gate trench, wherein the semiconductor layer is between at least the portion of the side surface of the active region and the isolation layer, and wherein a portion of the isolation layer is between the second gate structure and the semiconductor layer.

2. The semiconductor device as claimed in claim 1, wherein the first semiconductor material is silicon, and the second semiconductor material is an oxide semiconductor.

3. The semiconductor device as claimed in claim 1, further comprising a buffer layer between the semiconductor layer and the active region.

4. The semiconductor device as claimed in claim 3, wherein the buffer layer includes silicon oxide.

5. The semiconductor device as claimed in claim 1, wherein:

the first gate structure includes a first gate dielectric layer covering an inner wall of the first gate trench, a first gate electrode partially filling the first gate trench on the first gate dielectric layer, and a first gate capping layer on the first gate electrode, the second gate structure includes a second gate electrode partially filling the second gate trench and a second gate capping layer on the second gate electrode, and the semiconductor layer includes a first portion between the second gate capping layer and the active region and a second portion between the second gate electrode and the active region.

6. The semiconductor device as claimed in claim 1, wherein a lower end of the semiconductor layer is at a higher level than a lower end of the second gate structure.

7. The semiconductor device as claimed in claim 1, wherein:

a lower end of the semiconductor layer is at a lower level than a lower end of the second gate structure, and the lower end of the semiconductor layer is at a higher level than a lower end of the isolation layer.

8. The semiconductor device as claimed in claim 1, wherein:

the isolation layer includes a first isolation portion and a second isolation portion on the first isolation portion, and the semiconductor layer includes a first portion covering at least the portion of the side surface of the active region and a second portion extending from the first portion between the first isolation portion and the second isolation portion.

9. The semiconductor device as claimed in claim 1, wherein the semiconductor layer includes:

a first portion covering at least the portion of the side surface of the active region, and

20 a second portion extending from the first portion between a lower surface of the isolation layer and the semiconductor substrate.

10. The semiconductor device as claimed in claim 1, further comprising a contact plug in contact with the first source/drain region on the first source/drain region, the contact plug being in contact with the semiconductor layer.

11. The semiconductor device as claimed in claim 1, further comprising a contact plug electrically connected to the first source/drain region on the first source/drain region, the contact plug being spaced apart from the semiconductor layer and vertically overlapping a portion of the semiconductor layer.

12. The semiconductor device as claimed in claim 1, wherein, at a level lower than lower ends of the first gate structure and the second gate structure, the semiconductor layer has a ring shape surrounding the side surface of the active region.

13. The semiconductor device as claimed in claim 1, wherein, at a level higher than lower ends of the first gate structure and the second gate structure, the semiconductor layer includes a first semiconductor portion and a second semiconductor portion spaced apart from each other.

14. A semiconductor device, comprising:

an active region including a first semiconductor material;

an isolation layer on a side surface of the active region;

a first gate structure in a first gate trench crossing the active region;

a first source/drain region and a second source/drain region in the active region on opposite sides of the first gate trench;

a second gate structure in a second gate trench in the isolation layer and parallel to the first gate structure, the second gate structure being adjacent to the first source/drain region; and a semiconductor layer covering at least a portion of the side surface of the active region, the semiconductor layer including a second semiconductor material different from the first semiconductor material, and at least a portion of the semiconductor layer being between a channel region of the active region below the first source/drain region and the second gate structure, wherein the semiconductor layer is between at least the portion of the side surface of the active region and the isolation layer, and wherein a portion of the isolation layer is between the second gate structure and the semiconductor layer.

15. The semiconductor device as claimed in claim 14, wherein the first semiconductor material is silicon, and the second semiconductor material is an oxide semiconductor.

16. The semiconductor device as claimed in claim 14, further comprising a buffer layer between the semiconductor layer and the active region.

17. A semiconductor device, comprising:

a semiconductor substrate;

an active region on the semiconductor substrate, the active region including a first semiconductor material and extending along an oblique direction with respect to an edge of the semiconductor substrate;

an isolation layer on a side surface of the active region and on the semiconductor substrate;

a first source/drain region, a second source/drain region, and a third source/drain region sequentially disposed along the oblique direction and spaced apart from each other in the active region;

a first inner gate structure in a first inner gate trench crossing the active region between the first source/drain region and the second source/drain region, the first inner gate structure extending into the isolation layer;

a second inner gate structure in a second inner gate trench crossing the active region between the second source/drain region and the third source/drain region, the second inner gate structure extending into the isolation layer and being parallel to the first inner gate structure;

a first outer gate structure in a first outer gate trench in the isolation layer adjacent to the first source/drain region and parallel to the first inner gate structure;

a second outer gate structure in a second outer gate trench in the isolation layer adjacent to the third source/drain region and parallel to the second inner gate structure;

a first contact plug electrically connected to the first source/drain region and on the first source/drain region;

a second contact plug electrically connected to the third source/drain region and on the third source/drain region;

a bit line structure including a plug portion electrically connected to the second source/drain region and on the second source/drain region; and a semiconductor layer covering at least a portion of the side surface of the active region, the semiconductor layer including a second semiconductor material different from the first semiconductor material, and the semiconductor layer including a first portion between at least the first outer gate structure and the side surface of the active region and a second portion between the second outer gate structure and the side surface of the active region, wherein the semiconductor layer is between at least the portion of the side surface of the active region and the isolation layer, and wherein a portion of the isolation layer is between the first outer gate structure and the first portion of the semiconductor layer, and is between the second outer gate structure and the second portion of the semiconductor layer.

18. The semiconductor device as claimed in claim 17, wherein the first semiconductor material is silicon, the second semiconductor material is an oxide semiconductor, and the first portion and the second portion of the semiconductor layer are connected to each other.

19. The semiconductor device as claimed in claim 17, wherein the first semiconductor material is silicon, the second semiconductor material is an oxide semiconductor, and the first portion and the second portion of the semiconductor layer are spaced apart from each other.

* * * * *